United States Patent
Lee et al.

(10) Patent No.: US 12,183,855 B2
(45) Date of Patent: Dec. 31, 2024

(54) DISPLAY DEVICE

(71) Applicant: Samsung Display Co., LTD., Yongin-si (KR)

(72) Inventors: Hyun Wook Lee, Suwon-si (KR); Ki Bum Kim, Hwaseong-si (KR); Jin Taek Kim, Yongin-si (KR); Jung Eun Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/440,459

(22) Filed: Feb. 13, 2024

(65) Prior Publication Data
US 2024/0186456 A1 Jun. 6, 2024

Related U.S. Application Data

(62) Division of application No. 17/327,192, filed on May 21, 2021, now Pat. No. 11,916,171.

(30) Foreign Application Priority Data

May 26, 2020 (KR) .......... 10-2020-0063105
Oct. 23, 2020 (KR) .......... 10-2020-0138175

(51) Int. Cl.
*H01L 33/38* (2010.01)
*H01L 27/15* (2006.01)
*H01L 33/62* (2010.01)

(52) U.S. Cl.
CPC .......... *H01L 33/387* (2013.01); *H01L 27/156* (2013.01); *H01L 33/62* (2013.01)

(58) Field of Classification Search
CPC ..... H01L 33/387; H01L 27/156; H01L 33/62; H01L 33/18; H01L 33/385; H01L 25/0753

See application file for complete search history.

(56) References Cited

U.S. PATENT DOCUMENTS 10,818,820 B2   10/2020  Kim
2018/0019369 A1*  1/2018  Cho .................. H01L 33/38
(Continued)

FOREIGN PATENT DOCUMENTS

KR   10-2019-0120467   10/2019
KR   10-2020-0005711    1/2020
(Continued)

OTHER PUBLICATIONS

International Search Report corresponding to International Application No. PCT/KR2021/095041 dated Sep. 6, 2021.
(Continued)

*Primary Examiner* — Victor A Mandala
(74) *Attorney, Agent, or Firm* — KILE PARK REED & HOUTTEMAN PLLC

(57) ABSTRACT

A display device includes a substrate, a first electrode and a second electrode which are spaced apart from each other in a second direction, light-emitting elements spaced apart from each other in the first direction, a first contact electrode electrically contacting the light-emitting elements, and a second contact electrode electrically contacting the light-emitting elements. The first contact electrode electrically contacts the first electrode through a first contact portion disposed on the first electrode, the second contact electrode electrically contacts the second electrode through a second contact portion disposed on the second electrode, the first contact portion is disposed on an end portion in the first direction of the first contact electrode, and the second contact portion is disposed on an end portion in the first direction of the second contact electrode.

13 Claims, 27 Drawing Sheets

(56) References Cited

U.S. PATENT DOCUMENTS

| | | | |
|---|---|---|---|
| 2020/0013841 A1* | 1/2020 | Lee | H01L 25/167 |
| 2020/0144453 A1* | 5/2020 | Chang | H01L 27/124 |
| 2020/0203587 A1* | 6/2020 | Kim | H01L 33/62 |
| 2020/0273397 A1* | 8/2020 | Jeong | H01L 25/0753 |
| 2020/0403029 A1* | 12/2020 | Kim | H01L 27/156 |
| 2021/0043699 A1 | 2/2021 | Kim | |
| 2021/0280753 A1 | 9/2021 | Kim et al. | |
| 2021/0288033 A1* | 9/2021 | Lim | H01L 25/0753 |
| 2021/0288217 A1 | 9/2021 | Li et al. | |
| 2021/0296538 A1 | 9/2021 | Li et al. | |
| 2021/0327954 A1* | 10/2021 | Cho | H01L 33/38 |

FOREIGN PATENT DOCUMENTS

| | | | |
|---|---|---|---|
| KR | 10-2020-0006650 | 1/2020 | |
| KR | 10-2020-0010704 | 1/2020 | |
| KR | 10-2020-0034896 | 4/2020 | |
| KR | 10-2021-0124594 | 10/2021 | |
| WO | 2020/022593 | 1/2020 | |
| WO | WO-2020022593 A1 * | 1/2020 | H01L 25/0753 |

OTHER PUBLICATIONS

Written Opinion corresponding to International Application No. PCT/KR2021/095041 dated Sep. 6, 2021.

* cited by examiner

DISPLAY DEVICE

CROSS REFERENCE TO RELATED APPLICATION(S)

This is a divisional application of U.S. patent application Ser. No. 17/327,192 filed May 21, 2021 (now pending), the disclosure of which is incorporated herein by reference in its entirety. U.S. patent application Ser. No. 17/327,192 claims priority to and the benefit of Korean Patent Application No. 10-2020-0063105 filed on May 26, 2020 and No. 10-2020-0138175 filed on Oct. 23, 2020 in the Korean Intellectual Property Office under 35 U.S.C. § 119, the entire contents of which are incorporated herein by reference.

BACKGROUND

1. Technical Field

The disclosure relates to a display device.

2. Description of the Related Art

The importance of display devices is increasing along with the development of multimedia. Accordingly, various types of display devices, such as organic light-emitting diode (OLED) displays and liquid crystal displays (LCDs), are being used.

Display devices are devices that display an image and include a display panel such as an organic light-emitting display panel or a liquid crystal display panel. Among these, the display device may include light-emitting elements as a light-emitting display panel. For example, a light-emitting diode (LED) may include an OLED that uses an organic material as a light-emitting material, an inorganic light-emitting diode that uses an inorganic material as a light-emitting material, or the like.

SUMMARY

Aspects of the disclosure provide an inorganic light-emitting element display device having improved luminous efficiency.

Aspects of the disclosure also provide a display device including a novel electrode structure having improved luminous efficiency.

It should be noted that objects of the disclosure are not limited to the above-described objects, and other objects of the disclosure will be apparent to those skilled in the art from the following descriptions.

According to an embodiment of the disclosure, a display device may comprise a substrate, a first electrode and a second electrode which are disposed on the substrate, extend in a first direction, and are spaced apart from each other in a second direction, a plurality of light-emitting elements disposed on the first electrode and the second electrode and spaced apart from each other in the first direction, a first contact electrode disposed on the first electrode and electrically contacting the plurality of light-emitting elements and a second contact electrode disposed on the second electrode and electrically contacting the plurality of light-emitting elements, wherein the first contact electrode may electrically contact the first electrode through a first contact portion disposed on the first electrode, the second contact electrode may electrically contact the second electrode through a second contact portion disposed on the second electrode, the first contact portion may be disposed on an end portion in the first direction of the first contact electrode, and the second contact portion may be disposed on an end portion in the first direction of the second contact electrode.

The plurality of light-emitting elements may be not disposed between the first contact portion and the second contact portion spaced apart from each other in the second direction.

A light-emitting element area may be an area in which the plurality of light-emitting elements are disposed, and the first contact portion and the second contact portion may be spaced apart from the light-emitting element area in the first direction.

The display device may further comprise an interlayer insulating layer disposed on the substrate and a plurality of banks disposed between the interlayer insulating layer and the first and second electrodes, wherein the first electrode and the second electrode each may include a first portion disposed directly on the interlayer insulating layer and a second portion connected to the first portion and disposed directly on the plurality of banks.

The first contact electrode may be disposed on the first portion of the first electrode, the second contact electrode may be disposed on the first portion of the second electrode, and the first contact portion and the second contact portion may be disposed on the first portion of the first electrode and the first portion of the second electrode, respectively.

The first electrode and the second electrode each may include a third portion that connects the first portion and the second portion, and a length of the first portion in the first direction may be greater than a length of the third portion in the first direction.

A distance between the first portion of the first electrode and the first portion of the second electrode may be smaller than a distance between the second portion of the first electrode and the second portion of the second electrode.

A width of the first electrode and the second electrode may be greater than a width of the first contact electrode and the second contact electrode.

A distance between the first contact electrode and the second contact electrode may be smaller than a distance between the first portion of the first electrode and the first portion of the second electrode.

A distance between the first portion of the first electrode and the first portion the second electrode may be smaller than a length of the light-emitting element in the second direction.

The display device may further comprise a first insulating layer that partially overlaps the first electrode and the second electrode, wherein the first contact portion and the second contact portion may penetrate through the first insulating layer to expose a portion of the first electrode and a portion of the second electrode, respectively.

The plurality of light-emitting elements may be disposed directly on the first insulating layer.

According to an embodiment of the disclosure, a display device may comprise a substrate, a plurality of banks disposed on the substrate, a first electrode and a second electrode which are respectively disposed on the plurality of banks that are different from each other, extend in a first direction, and are spaced apart from each other in a second direction, a plurality of light-emitting elements disposed on the first electrode and the second electrode and spaced apart from each other in the first direction, a first contact electrode disposed on the first electrode and electrically contacting the plurality of light-emitting elements and a second contact electrode disposed on the second electrode and electrically contacting the plurality of light-emitting elements, wherein the first contact electrode may electrically contact the first electrode through a first contact portion disposed on the first electrode, the second contact electrode may electrically contact the second electrode through a second contact portion disposed on the second electrode, and the first contact portion and the second contact portion may be spaced apart from the plurality of light-emitting elements in a direction between the first direction and the second direction.

The first electrode and the second electrode each may include a first portion disposed directly on an interlayer insulating layer and a second portion connected to the first portion and disposed directly on the plurality of banks, and the first contact portion and the second contact portion may be disposed on the second portion of the first electrode and the second portion of the second electrode, respectively.

The first contact electrode and the second contact electrode each may include a contact electrode extension part disposed on the first portion, a contact electrode contact part disposed on the first contact portion or the second contact portion, and a contact electrode connection part that electrically connects the contact electrode extension part and the contact electrode contact part, and the contact electrode connection part of each of the first and second contact electrodes may be spaced apart from the plurality of light-emitting elements in the first direction.

According to an embodiment of the disclosure, a display device may comprise a substrate, a first electrode and a second electrode which are disposed on the substrate, extend in a first direction, and are spaced apart from each other in a second direction, a third electrode spaced apart from the first electrode and the second electrode in the second direction between the first electrode and the second electrode, a fourth electrode spaced apart from the first electrode in the first direction, light-emitting elements which include first light-emitting elements having first and second end portions disposed on the first electrode and the third electrode, respectively, and second light-emitting elements having first end portions disposed on the second electrode, a first contact electrode disposed on the first electrode and electrically contacting the first light-emitting elements, a second contact electrode disposed on the second electrode and electrically contacting the second light-emitting elements, and a third contact electrode disposed on the third electrode and electrically contacting the first light-emitting elements, wherein the first contact electrode may electrically contact the first electrode through a first contact portion disposed on the first electrode, the second contact electrode may electrically contact the second electrode through a second contact portion disposed on the second electrode, the third contact electrode may electrically contact the third electrode through a third contact portion disposed on the third electrode, the second contact portion may be disposed on an end portion of the second contact electrode in the first direction, and the third contact portion may be disposed on an end portion of the third contact electrode in the first direction.

The second electrode may include an electrode protrusion protruding from a side of the second electrode in the second direction, the third electrode may include an electrode protrusion protruding from a side of the third electrode in the second direction, and the second contact portion and the third contact portion may be disposed on the electrode protrusion of the second electrode and the electrode protrusion of the third electrode, respectively.

The first electrode may include a first electrode extension part extending in the first direction, and an electrode connection part electrically connected to a side of the first electrode extension part in the first direction and extending in the second direction, and the first light-emitting elements may be disposed on the first electrode extension part of the first electrode and the third electrode.

The first contact portion may be disposed on the electrode connection part of the first electrode, and the first contact electrode may include a contact electrode extension part electrically contacting the first light-emitting elements, and a contact electrode contact part electrically connected to the contact electrode extension part and disposed on the first contact portion.

The display device may comprise a conductive layer including a voltage line and a conductive pattern disposed on the substrate, wherein the first electrode may be connected directly to the conductive pattern, and the second electrode may be connected directly to the voltage line.

The display device may further comprise a fifth electrode spaced apart from the fourth electrode in the second direction and spaced apart from the third electrode in the first direction, a sixth electrode spaced apart from the fifth electrode in the second direction, a seventh electrode disposed between the fifth electrode and the sixth electrode and spaced apart from the second electrode in the first direction, and an eighth electrode spaced apart from the sixth electrode in the first direction and spaced apart from the second electrode in the second direction, wherein the light-emitting elements may include third light-emitting elements disposed on the fourth electrode and the fifth electrode, and fourth light-emitting elements disposed on the sixth electrode and the seventh electrode, and second end portions of the second light-emitting elements may be disposed on the eighth electrode.

The third contact electrode may include a part disposed on the fourth electrode and electrically contacting the third light-emitting elements, and the third contact electrode may electrically contact the fourth electrode through a contact portion spaced apart from the third light-emitting elements in a direction between the first direction and the second direction.

The display device may further comprise a fourth contact electrode disposed on the fifth electrode and the sixth electrode and electrically contacting the fifth electrode and the sixth electrode through a plurality of contact portions, and a fifth contact electrode disposed on the seventh electrode and the eighth electrode and electrically contacting the seventh electrode and the eighth electrode through a plurality of contact portions, wherein some of the plurality of contact portions disposed on the fifth to the eighth electrodes may be spaced apart from the light-emitting elements in the first direction.

At least some of the plurality of contact portions disposed on the fifth to eighth electrodes may be disposed to be spaced apart from the light-emitting elements in a direction between the first direction and the second direction.

The first contact portion may be disposed to be spaced apart from the light-emitting elements in a direction between the first direction and the second direction.

The display device may further comprise a first insulating layer that partially overlaps the first to eighth electrodes, a second insulating layer partially disposed on the light-emitting elements and the first insulating layer, and a third insulating layer that overlaps the second insulating layer, the third contact electrode, and the fourth contact electrode, wherein the plurality of contact portions may penetrate through the first insulating layer.

The display device may further comprise a plurality of openings that penetrate through the second insulating layer and the third insulating layer to expose a portion of an upper surface of the first insulating layer, wherein the plurality of openings may include a first opening formed over a portion of the first electrode and the first end portions of the first light-emitting elements, a second opening formed over a portion of the second electrode and the first end portions of the second light-emitting elements and a third opening partially formed on the eighth electrode.

The first contact electrode may be partially disposed in the first opening, the second contact electrode is partially disposed in the second opening, and the third opening is formed to be spaced from the fifth contact electrode.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
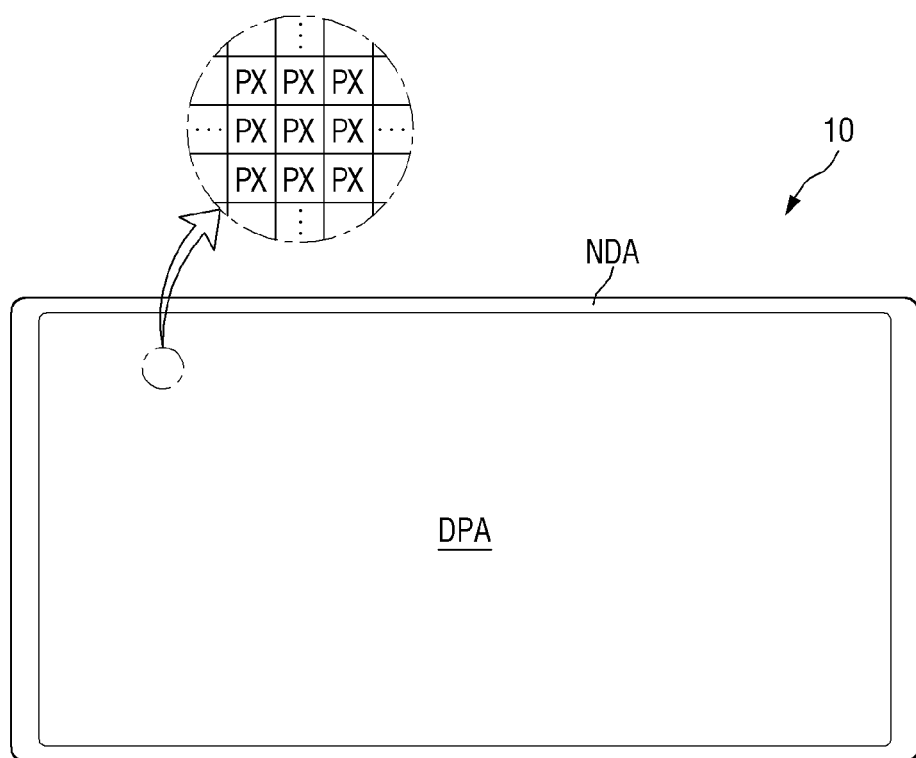
FIG. 1 is a schematic plan view of a display device according to an embodiment.

FIG. 1 is a schematic plan view of a display device according to an embodiment.

Referring to FIG. 1, a display device 10 displays a video or a still image. The display device 10 may refer to an electronic device that provides a display screen. For example, the display device 10 may include a television, a laptop computer, a monitor, a billboard, an Internet of Things (IoT) device, a mobile phone, a smartphone, a tablet personal computer (PC), an electronic watch, a smartwatch, a watch phone, a head-mounted display, a mobile communication terminal, an electronic notebook, an e-book, a portable multimedia player (PMP), a navigation system, a game console, a digital camera, and a camcorder, which are provided with a display screen.

The display device 10 may include a display panel that provides a display screen. Examples of the display panel may include an inorganic light-emitting diode display panel, an organic light-emitting display panel, a quantum dot light-emitting display panel, a plasma display panel, a field emission display panel, or the like. Hereinafter, the inorganic light-emitting diode display panel as the example of the display panel is described, the disclosure is not limited thereto. For example, a device to which the same technical concept is applicable may be applied to other display panels.

A shape of the display device 10 may be variously changed. For example, the display device 10 may have shapes such as a rectangular shape, two sides of which are longer, a square shape, a quadrangular shape, corner portions (vertexes) of which are round, other polygonal shapes, a circular shape, or the like. A shape of a display area DPA of the display device 10 may also be similar to an overall shape of the display device 10. FIG. 1 illustrates the display device 10 and the display area DPA, which have a rectangular shape, two sides of which are longer.

The display device 10 may include the display area DPA and a non-display area NDA. The display area DPA may be an area in which an image may be displayed, and the non-display area NDA may be an area in which an image is not displayed. The display area DPA may be referred to as an active area, and the non-display area NDA may be referred to as an inactive area. The display area DPA may substantially occupy a center of the display device 10.

The display area DPA may include pixels PX. The pixels PX may be arranged in a matrix direction. A shape of each pixel PX may be a rectangular shape or a square shape in a plan view, but is not limited thereto. For example, the shape may be a rhombic shape, each side of which is inclined with respect to a direction. The pixels PX may be alternately arranged as a stripe type or a PENTILE® type. Each of the pixels PX may include one or more light-emitting elements (or light-emitting diodes) ED that emit light at a specific wavelength, thereby displaying a specific color.

The non-display area NDA may be disposed around or adjacent to the display area DPA. The non-display area NDA may completely or partially surround the display area DPA. The display area DPA may have a rectangular shape, and the non-display area NDA may be disposed adjacent to the four sides of the display area DPA. The non-display area NDA may form a bezel of the display device 10. In each non-display area NDA, lines or circuit drivers included in the display device 10 may be disposed, or external devices may be mounted.

Figure 2:
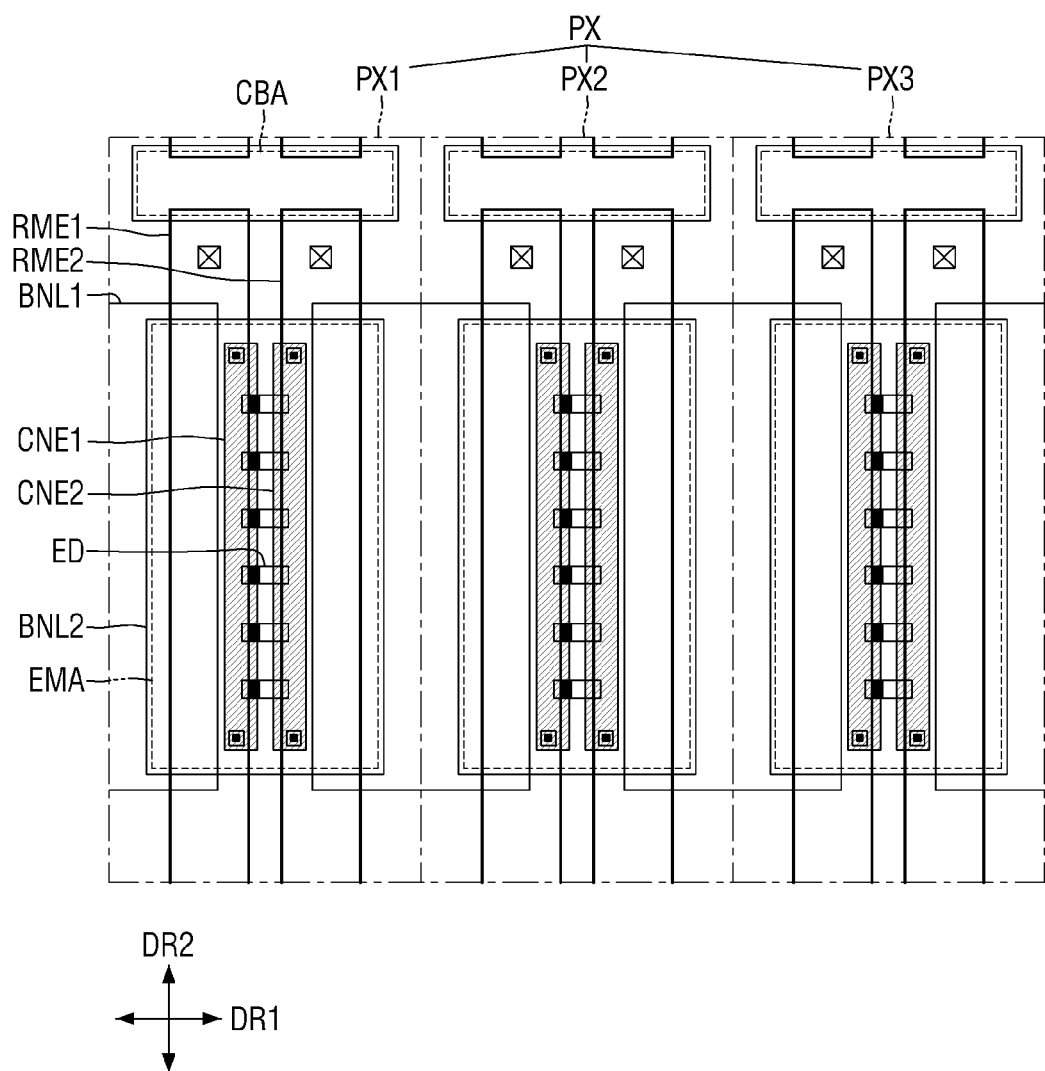
FIG. 2 is a schematic plan view illustrating a pixel of a display device according to an embodiment.

FIG. 2 is a schematic plan view illustrating a pixel of a display device according to an embodiment.

Referring to FIG. 2, each of pixels PX may include subpixels PXn (where n is an integer from one to three). For example, a pixel PX may include a first subpixel PX1, a second subpixel PX2, and a third subpixel PX3. The first subpixel PX1 may emit light having a first color, the second subpixel PX2 may emit light having a second color, and the third subpixel PX3 may emit light having a third color. As an example, the first color may be a blue color, the second color may be a green color, and the third color may be a red color. However, the disclosure is not limited thereto, and the subpixels PXn may emit light having the same color. Although FIG. 2 illustrates that the pixel PX includes three subpixels PXn, the disclosure is not limited thereto, and the pixel PX may include more subpixels PXn.

Each of the subpixels PXn of the display device 10 may include an emission area (or light emission area) EMA and a non-emission area (not shown). The emission area EMA may be an area in which the light-emitting element ED is disposed so that light having a specific wavelength is emitted therefrom, and the non-emission area may be an area in which the light-emitting element ED is not disposed so that light emitted from the light-emitting element ED does not arrive thereat and is not emitted therefrom. The emission area may include an area in which the light-emitting element ED is disposed and may include an area which is adjacent to the light-emitting element ED and from which light emitted from the light-emitting element ED is emitted.

However, the disclosure is not limited thereto. For example, the emission area EMA may also include an area from which light emitted from the light-emitting element ED is emitted by being reflected or refracted by other members. The light-emitting elements ED may be disposed in each subpixel PXn, and the emission area EMA may be formed to include an area, in which the light-emitting elements ED are disposed, and an area adjacent to the light-emitting elements LD.

Each subpixel PXn may include a cutout area CBA disposed in the non-emission area. The cutout area CBA may be disposed at a side of the emission area EMA in a second direction DR2. The cutout area CBA may be disposed between the emission areas EMA of the adjacent subpixels PXn in the second direction DR2. For example, emission areas EMA and cutout areas CBA may be arranged in the display area DPA of the display device 10. For example, the emission areas EMA and the cutout areas CBA may be repeatedly arranged in a first direction DR1, and the emission area EMA and the cutout area CBA may be alternately arranged in the second direction DR2. A second bank BNL2 may be disposed between the cutout areas CBA and between the emission areas EMA, and a distance therebetween may vary according to a width of the second bank BNL2. Since the light-emitting element ED is not disposed in the cutout area CBA, light is not emitted through (or from) the cutout areas CBA, but portions of electrodes RME (e.g., RME1, RME2, etc.) disposed in each subpixel PXn may be disposed in the cutout area CBA. The electrodes RME disposed in some subpixels PXn may be disposed in the cutout area CBA to be separated from each other. However, the disclosure is not limited thereto, and the electrodes RME may be disposed not separated in the cutout area CBA.

Figure 3:
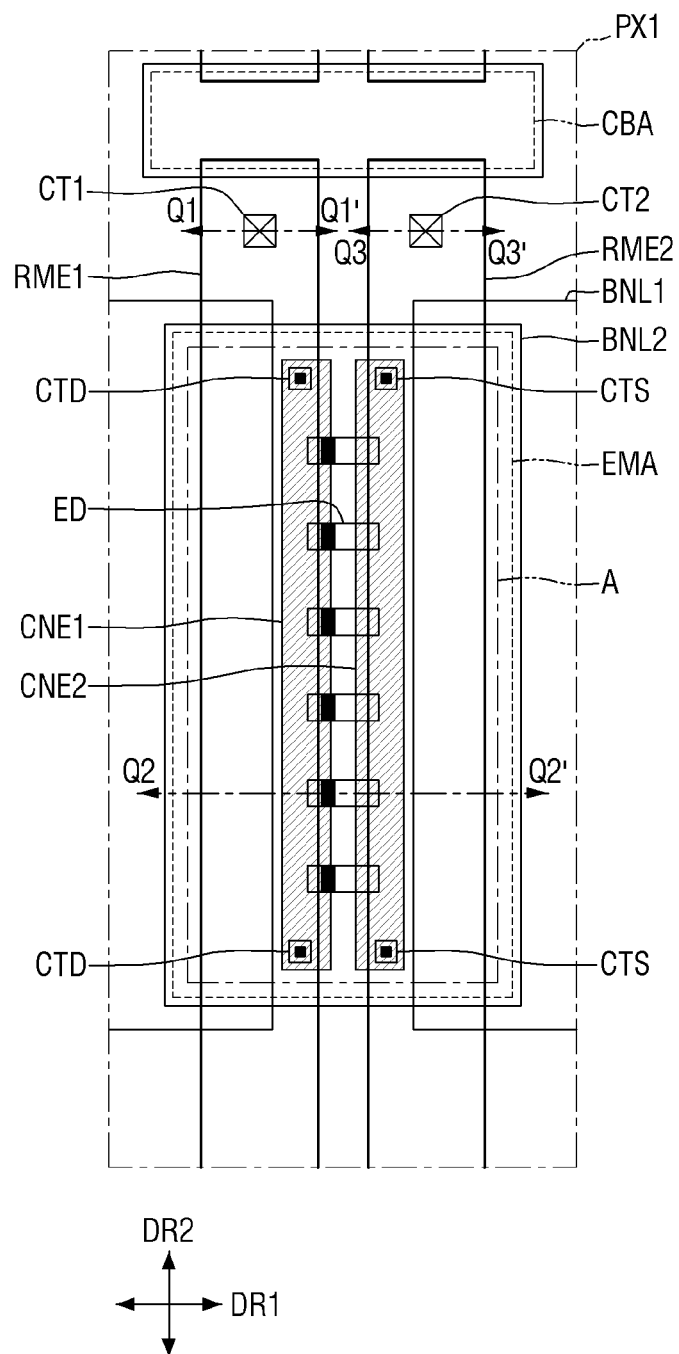
FIG. 3 is a schematic plan view illustrating a first subpixel of FIG. 2.
Figure 4:
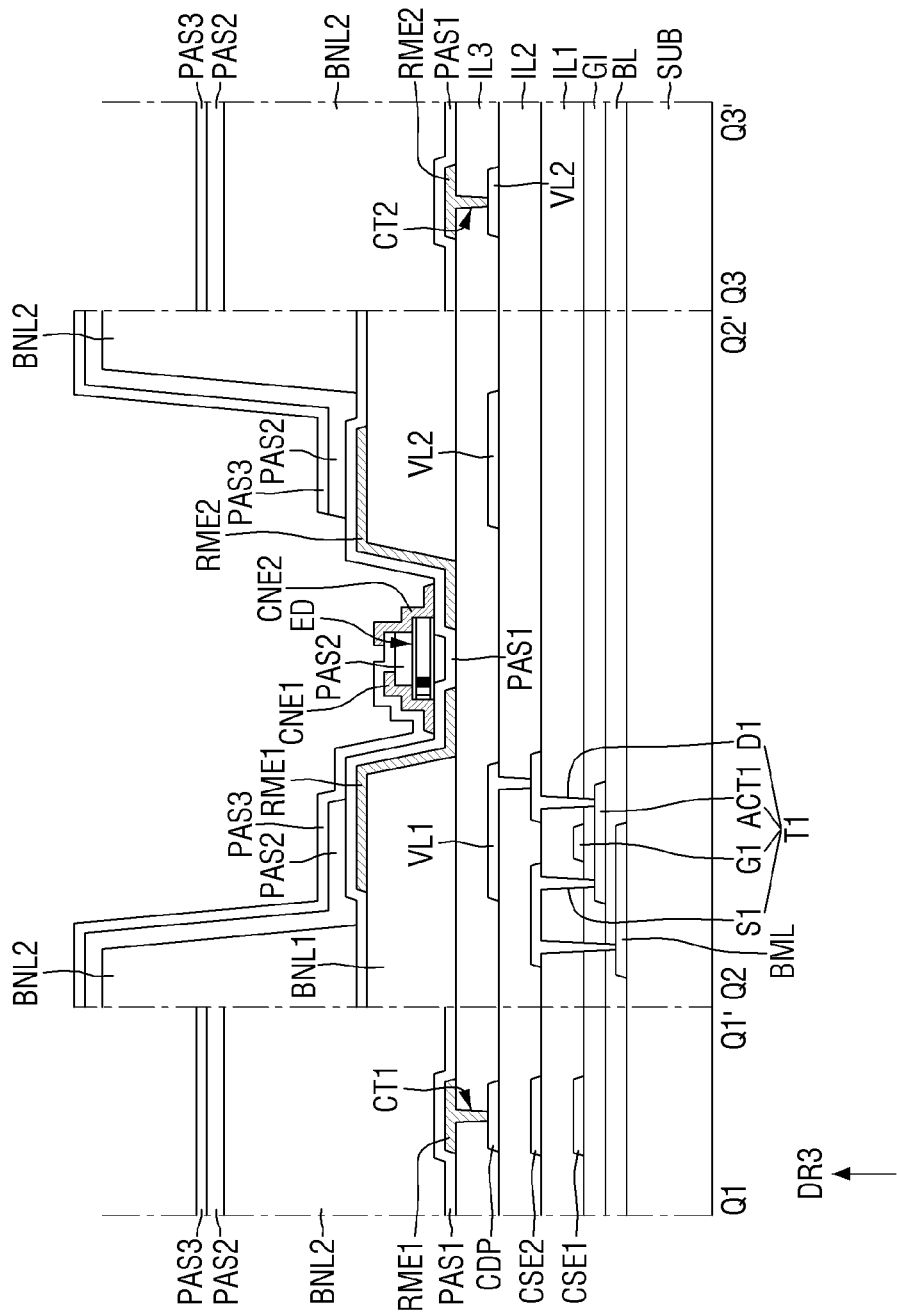
FIG. 4 is a schematic cross-sectional view taken along lines Q1-Q1', Q2-Q2', and Q3-Q3' of FIG. 3.

FIG. 3 is a schematic plan view illustrating the first subpixel of FIG. 2. FIG. 4 is a schematic cross-sectional view taken along lines Q1-Q1', Q2-Q2', and Q3-Q3' of FIG. 3. FIG. 4 illustrates a schematic cross section traversing both end portions of the light-emitting element ED disposed in a subpixel PXn.

Describing the display device 10 in detail with reference to FIGS. 3 and 4 in conjunction with FIG. 2, the display device 10 may include a first substrate SUB, and a semiconductor layer, conductive layers, and insulating layers which are disposed on the first substrate SUB. The semiconductor layer, the conductive layers, and the insulating layers may form (or constitute) a circuit layer and a light-emitting element layer of the display device 10.

The first substrate SUB may be an insulating substrate. The first substrate SUB may be made of an insulating material such as glass, quartz, or a polymer resin. The first substrate SUB may be a rigid substrate and may also be a flexible substrate which is bendable, foldable, and rollable.

A light blocking layer BML may be disposed on the first substrate SUB. The light blocking layer BML may be disposed to overlap an active layer ACTI of a first transistor T1. The light blocking layer BML may include a material that blocks light, thereby preventing light from being incident on the active layer ACTI of the first transistor T1. For example, the light blocking layer BML may be made of (or include) an opaque metal material that blocks light transmission. However, the disclosure is not limited thereto, and in some embodiments, the light blocking layer BML may be omitted.

A buffer layer BL may be entirely disposed on the first substrate SUB and the light blocking layer BML. The buffer layer BL may be formed on the first substrate SUB to protect the first transistor T1 of the pixel PX from moisture permeating through the first substrate SUB that is vulnerable to moisture permeation. The buffer layer BL may perform a surface planarization function.

The semiconductor layer may be disposed on the buffer layer BL. The semiconductor layer may include the active layer ACTI of the first transistor T1. The semiconductor layer and the active layer ACTI may be disposed to partially overlap a gate electrode G1 or the like of a first conductive layer to be described below.

FIG. 4 illustrates only the first transistor T1 among transistors included in the subpixel PXn of the display device 10, but the disclosure is not limited thereto. The display device 10 may include more transistors. For example, in addition to the first transistor T1, the display device 10 may include two or three transistors for each subpixel PXn.

The semiconductor layer may include polycrystalline silicon, monocrystalline silicon, an oxide semiconductor, or the like. In case that the semiconductor layer includes an oxide semiconductor, each active layer ACTI may include conductive regions and a channel region therebetween. The oxide semiconductor may include indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), or the like.

In another embodiment, the semiconductor layer may include polycrystalline silicon. Polycrystalline silicon may be formed by crystallizing amorphous silicon. The conductive regions of the active layer ACTI may be doped regions that are doped with impurities.

A first gate insulating layer GI may be disposed on the semiconductor layer and the buffer layer BL. The first gate insulating layer GI may be disposed on the buffer layer BL and the semiconductor layer. The first gate insulating layer GI may function as a gate insulating layer of each transistor.

A first conductive layer may be disposed on the first gate insulating layer GI. The first conductive layer may include the gate electrode G1 of the first transistor T1 and a first capacitance electrode CSE1 of a storage capacitor Cst. The gate electrode G1 may be disposed to overlap the channel region of the active layer ACTI in a thickness direction thereof. The first capacitance electrode CSE1 may be disposed to overlap a second capacitance electrode CSE2 described below in the thickness direction. In an embodiment, the first capacitance electrode CSE1 may be electrically connected to the gate electrode G1 or may be integral with the grate electrode G1. The first capacitance electrode CSE1 may be disposed to overlap the second capacitance electrode CSE2 in the thickness direction, and the storage capacitor Cst may be formed therebetween.

A first interlayer insulating layer IL1 may be disposed on the first conductive layer. The first interlayer insulating layer IL1 may function as an insulating film between the first conductive layer and other layers disposed thereon. The first interlayer insulating layer IL1 may be disposed to cover or overlap the first conductive layer and perform a function of protecting the first conductive layer.

A second conductive layer may be disposed on the first interlayer insulating layer IL1. The second conductive layer may include a first source electrode S1 and a first drain electrode D1 of the first transistor T1, and the second capacitance electrode CSE2.

The first source electrode S1 and the first drain electrode D1 of the first transistor T1 may contact the doped regions of the active layer ACTI through contact holes penetrating through the first interlayer insulating layer IL1 and the first gate insulating layer GI. The first source electrode S1 of the first transistor T1 may contact the light blocking layer BML through another contact hole.

The second capacitance electrode CSE2 may be disposed to overlap the first capacitance electrode CSE1 in the thickness direction. In an embodiment, the second capacitance electrode CSE2 may be electrically connected to the first source electrode S1 or may be integral with the first source electrode S1.

Although not shown in the drawing, the second conductive layer may further include data lines for applying data signals to other transistors. The data lines may be electrically connected to source and/or drain electrode of other transistors to transmit signals applied to the data lines.

A second interlayer insulating layer IL2 may be disposed on the second conductive layer. The second interlayer insulating layer IL2 may function as an insulating film between the second conductive layer and other layers disposed thereon. The second interlayer insulating layer IL2 may overlap the second conductive layer to perform a function of protecting the second conductive layer.

A third conductive layer may be disposed on the second interlayer insulating layer IL2. The third conductive layer may include a first voltage line VL1, a second voltage line VL2, and a first conductive pattern CDP. A high potential voltage (or a first power voltage) to be supplied to the first transistor T1 may be applied to the first voltage line VL1, and a low potential voltage (or a second power voltage) to be supplied to a second electrode RME2 may be applied to the second voltage line VL2.

The first voltage line VL1 and the second voltage line VL2 of the third conductive layer may be disposed to extend in the second direction DR2. The first voltage line VL1 may include a portion that extends in the second direction DR2 and is bent in a different direction between the first direction DR1 and the second direction DR2. In contrast, the second voltage line VL2 may be disposed to extend in the second direction DR2 without being bent. The first voltage line VL1 and the second voltage line VL2 may be disposed at positions partially overlapping electrodes RME1, RME2, RME3, and RME4 described below in a thickness direction thereof. The first voltage line VL1 may be disposed such that the portion thereof that extends from a boundary of the subpixel PXn in the second direction DR2 and is partially bent is positioned in the emission area EMA. The second voltage line VL2 may be disposed to traverse the emission area EMA.

The first conductive pattern CDP may be electrically connected to the second capacitance electrode CSE2 through a contact hole formed in the second interlayer insulating layer IL2. The second capacitance electrode CSE2 may be integral with the first source electrode S1 of the first transistor T1, and the first conductive pattern CDP may be electrically connected to the first source electrode S1. The first conductive pattern CDP may also contact a first electrode RME1 described below, and the first transistor T1 may transmit the first power voltage applied from the first voltage line VL1 to the first electrode RME1 through the first conductive pattern CDP. FIG. 4 illustrates that the third conductive layer includes a second voltage line VL2 and a first voltage line VL1, but the disclosure is not limited thereto. For example, the third conductive layer may include more first voltage lines VL1 and more second voltage lines VL2.

The buffer layer BL, the first gate insulating layer GI, the first interlayer insulating layer IL1, and the second interlayer insulating layer IL2 may be provided as inorganic layers which are alternately stacked. For example, the buffer layer BL, the first gate insulating layer GI, the first interlayer insulating layer IL1, and the second interlayer insulating layer IL2 may be formed as multiple layers in which organic layers, which include at least one of silicon oxide ($SiO_x$), silicon nitride ($SiN_x$), and silicon oxynitride ($SiO_xN_y$), are alternately stacked.

The first conductive layer, the second conductive layer, and the third conductive layer may be formed as a single-layer or a multi-layer made of at least one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

A third interlayer insulating layer IL3 may be disposed on the third conductive layer. The third interlayer insulating layer IL3 may include an organic insulating material, for example, an organic material such as polyimide (PI), and may perform a surface planarization function.

As a display element layer, first banks BNL1, electrodes RME1 and RME2, the light-emitting elements ED, contact electrodes CNE1 and CNE2, and the second bank BLN2 may be disposed on the third interlayer insulating layer IL3. In addition, insulating layers PAS1, PAS2, and PAS3 may be disposed on the third interlayer insulating layer IL3.

The first banks BNL1 may be disposed directly on the third interlayer insulating layer IL3. A first bank BNL1 may have a shape extending in the first direction DR1 and may be disposed over different adjacent subpixels PXn. The first bank BNL1 may have a shape extending in the second direction DR2 and may be spaced apart from another first bank BNL1 disposed in the same subpixel PXn. For example, each of the first banks BNL1 may be formed to have predetermined widths in the first direction DR1 and the second direction DR2, a portion thereof may be disposed in the emission area EMA, and another portion thereof may be disposed at a boundary of an adjacent subpixel PXn in the first direction DR1. The first banks BNL1 may be formed such that a length thereof measured in the second direction DR2 is greater than a length of the emission area EMA measured in the second direction DR2 so that a portion of the first bank BNL1 may overlap the second bank BNL2 in the non-emission area.

The first banks BNL1 may be disposed in a subpixel PXn. For example, in a subpixel PXn, two first banks BNL1 may be partially disposed in the emission area EMA. The two first banks BNL1 may be spaced apart from each other in the first direction DR1. The light-emitting elements ED may be disposed between the first banks BNL1 spaced apart from each other in the first direction DR1. In the drawing, two first banks BNL1 are illustrated as being disposed in the emission area EMA of each subpixel PXn to form an island-shaped pattern, but the disclosure is not limited thereto. The number of the first banks BNL1 disposed in the emission area EMA of each subpixel PXn may vary according to the number of the electrodes RME1 and RME2 or the arrangement of the light-emitting elements ED.

The first bank BNL1 may have a structure, at least a portion of which protrudes with respect to an upper surface of the third interlayer insulating layer IL3. The protruding portion of the first bank BNL1 may have an inclined side surface, and light emitted from the light-emitting element ED may be reflected from the electrode RME disposed on the first bank BNL1 and may be emitted in an upward direction of the third interlayer insulating layer IL3. The first bank BNL1 may provide an area in which the light-emitting element ED is disposed and concurrently may function as a reflective wall that reflects light emitted from the light-emitting element ED upward. The side surface of the first bank BNL1 may be inclined in a linear shape, but the disclosure is not limited thereto. The first bank BNL1 may have an outer surface that has a curved semi-circular or semi-elliptical shape. The first banks BNL1 may include an organic insulating material such as PI, but the disclosure is not limited thereto.

The electrodes RME1 and RME2 may have a shape extending in a direction and may be disposed for each subpixel PXn. The electrodes RME1 and RME2 may have a shape extending in the second direction DR2 and may be disposed for each subpixel PXn to be spaced apart from each other in the first direction DR1. The first electrode RME1 and the second electrode RME2 spaced apart from the first electrode RME1 in the first direction DR1 may be disposed in each subpixel PXn. The light-emitting elements ED may be disposed on the first electrode RME1 and the second electrode RME2. However, the disclosure is not limited thereto, and the positions of the electrodes RME1 and RME2 disposed in each subpixel PXn may vary according to the number of the electrodes RME1 and RME2 or the number of the light-emitting elements ED disposed in each subpixel PXn.

The first electrode RME1 and the second electrode RME2 may be disposed in the emission area EMA of each subpixel PXn, and a portion of the first electrode RME1 and a portion of the second electrode RME2 may be disposed beyond the emission area EMA to overlap the second bank BNL2 in a thickness direction thereof. The electrodes RME1 and RME2 may extend in the second direction DR2 in the subpixel PXn and may be spaced apart from the electrodes REMI and RME2 of another subpixel PXn in the second direction DR2 in the cutout area CBA.

The arrangement of the electrodes RME1 and RME2 may be formed in such a manner that the electrodes RME1 and RME2 are formed as electrode lines extending in the second direction DR2 and then are separated from each other in a subsequent process after the light-emitting elements ED are disposed. To align the light-emitting element ED during a manufacturing process of the display device 10, the electrode line may be used to generate an electric field in the subpixel PXn. The light-emitting elements ED may be sprayed on the electrode lines by an inkjet printing process, and in case that an ink including the light-emitting elements ED is sprayed on the electrode lines, an alignment signal may be applied to the electrode lines to generate an electric field. The light-emitting elements ED may be disposed on electrodes by the electric field formed between the electrode lines. The light-emitting elements ED dispersed in the ink may be aligned on the electrodes RME by receiving a dielectrophoretic force by the generated electric field. After the light-emitting elements ED are aligned, a part of the electrode lines may be disconnected to form the electrodes RME and RME2.

The electrodes RME1 and RME2 may be electrically connected to the third conductive layer so that a signal for allowing the light-emitting element ED to emit light may be applied thereto. The first electrode RME1 may electrically contact the first conductive pattern CDP through a first contact hole CT1 penetrating through the third interlayer insulating layer IL3 under the first electrode RME1. The second electrode RME2 may electrically contact the second voltage line VL2 through a second contact hole CT2 penetrating through the third interlayer insulating layer IL3 under the second electrode RME2. The first electrode RME1 may be electrically connected to the first transistor T1 through the first conductive pattern CDP so that the first power voltage may be applied thereto, and the second electrode RME2 may be electrically connected to the second voltage line VL2 so that the second power voltage may be applied thereto. The electrodes RME1 and RME2 may be electrically connected to the light-emitting elements ED. The electrodes RME1 and RME2 may be respectively connected electrically to both end portions of the light-emitting element ED through the contact electrodes CNE1 and CNE2 described below and may transmit an electrical signal applied from the third conductive layer to the light-emitting element ED. Since the electrodes RME1 and RME2 are disposed separately for each subpixel PXn, the light-emitting elements ED of different subpixels PXn may emit light separately.

In the drawing, the first contact hole CT1 and the second contact hole CT2 are illustrated as being formed at positions overlapping the second bank BNL2, but the disclosure is not limited thereto. For example, each of the contact holes CT1 and CT2 may be positioned in the emission area EMA surrounded by the second bank BNL2.

The electrodes RME1 and RME2 disposed for each subpixel PXn may be disposed on the first banks BNL1 spaced apart from each other. The electrodes RME1 and RME2 may be disposed on first sides of the first banks BNL1 in the first direction DR1 and disposed on the inclined side surfaces of the first banks BNL1. In an embodiment, a width of the electrodes RME1 and RME2 measured in the first direction DR1 may be smaller than a width of the first bank BNL1 measured in the first direction DR1. Each of the electrodes RME1 and RME2 may be disposed to overlap at least one side surface of the first bank BNL1 to reflect light emitted from the light-emitting element ED.

A distance between the electrodes RME1 and RME2 in the first direction DR1 may be smaller than a distance between the first banks BNL1. At least a partial area of each of the electrodes RME1 and RME2 may be disposed directly on the third interlayer insulating layer IL3 so that the electrodes RME1 and RME2 may be disposed to be coplanar with each other.

According to an embodiment, the electrodes RME1 and RME2 may transmit an electrical signal to allow the light-emitting element ED to emit light. To align the light-emitting elements ED during a manufacturing process of the display device 10, the electrodes RME1 and RME2 may be used to generate an electric field in the subpixel PXn. The light-emitting elements ED may be sprayed on the electrodes RME1 and RME2 by an inkjet printing process, and in case that an ink including the light-emitting elements ED is sprayed, an alignment signal may be applied to the electrodes RME1 and RME2 to generate an electric field. The light-emitting elements ED dispersed in the ink may be aligned on the electrodes RME1 and RME2 by receiving a dielectrophoretic force by the generated electric field.

Each of the electrodes RME1 and RME2 may include a conductive material having high reflectance. For example, as the conductive material having high reflectance, each of the electrodes RME1 and RME2 may include a metal such as silver (Ag), copper (Cu), or aluminum (Al) or may include an alloy including Al, nickel (Ni), lanthanum (La), or the like. Each of the electrodes RME1 and RME2 may reflect light, which is emitted from the light-emitting element ED and travels toward the side surface of the first bank BNL1, in an upward direction of each subpixel PXn.

However, the disclosure is not limited thereto, and each of the electrodes RME1 and RME2 may further include a transparent conductive material. For example, each of the electrodes RME1 and RME2 may include a material such as ITO, IZO, or indium tin zinc oxide (ITZO). In some embodiments, each of the electrodes RME may have a structure in which each of a transparent conductive material and a metal layer having high reflectance is stacked as one or more layers or may be formed as a single layer including the transparent conductive material and the metal layer having high reflectance. For example, each of the electrodes RME1 and RME2 may have a stacked structure such as ITO/Ag/ITO/, ITO/Ag/IZO, or ITO/Ag/ITZO/IZO.

A first insulating layer PAS1 may be disposed on the electrodes RME1 and RME2 and the first banks BNL1. The first insulating layer PAS1 may be disposed to overlap the first banks BNL1, the first electrode RME1, and the second electrode RME2 and may be disposed such that upper surfaces of the first electrode RME1 and the second electrode RME2 are partially exposed. Openings may be formed in the first insulating layer PAS1 to expose portions of the upper surfaces of the electrodes RME1 and RME2 disposed on the first bank BNL1, and the contact electrodes CNE1 and CNE2 may electrically contact the electrodes RME1 and RME2 through the openings.

In an embodiment, a stepped portion may be formed in the first insulating layer PAS1 so that a portion of an upper surface thereof is recessed between the first electrode RME1 and the second electrode RME2. Since the first insulating layer PAS1 is disposed to overlap the first electrode RME1 and the second electrode RME2, the first insulating layer PAS1 may be formed to be stepped therebetween (or have portions with different heights). However, the disclosure is not limited thereto. The first insulating layer PAS1 may protect the first electrode RME1 and the second electrode RME2 and insulate the first electrode RME1 and the second electrode RME2 from each other. The first insulating layer PAS1 may prevent the light-emitting element ED disposed on the first insulating layer PAS1 from being damaged by a direct contact with other members.

The second bank BNL2 may be disposed on the first insulating layer PAS1. The second bank BNL2 may be disposed in a grid pattern that includes parts extending in the first direction DR1 and the second direction DR2 in a plan view. The second bank BNL2 may be disposed over boundaries of the subpixels PXn to distinguish the subpixels PXn from each other. The second bank BNL2 may be disposed to surround the emission area EMA and the cutout area CBA disposed for each subpixel PXn to distinguish the emission area EMA from the cutout area CBA. In the part of the second bank BNL2 extending in the second direction DR2, a portion thereof disposed between the emission areas EMA may have a width greater than that of a portion thereof disposed between the cutout areas CBA. A distance between the cutout areas CBA may be smaller than a distance between the emission areas EMA.

The second bank BNL2 may be formed to have a height greater than that of the first bank BNL1. The second bank BNL2 may prevent inks from overflowing to adjacent subpixels PXn in an inkjet printing process of a manufacturing process of the display device 10, thereby separating the inks, in which different light-emitting elements ED are dispersed for different subpixels PXn, from each other so as to not be mixed with each other. Since a first bank BNL1 is disposed across the adjacent subpixel PXn in the first direction DR1, a portion of the part of the second bank BNL2 extending in the second direction DR2 may be disposed on the first bank BNL1. Similar to the first bank BNL1, the second bank BNL2 may include PI, but the disclosure is not limited thereto.

The light-emitting elements ED may be disposed on the first insulating layer PAS1. The light-emitting elements ED may be spaced apart from each other in the second direction DR2 in which the electrodes RME1 and RME2 extend, and may be aligned substantially parallel to each other. The light-emitting element ED may have a shape extending in a direction and may be disposed such that the direction in which the light-emitting element ED extends is substantially perpendicular to the direction in which the electrodes RME1 and RME2 extend. However, the disclosure is not limited thereto, and the light-emitting element ED may be disposed to be angled with respect to the extending direction of the electrodes RME1 and RME2.

The light-emitting element ED may include semiconductor layers which are doped with different types of dopants. The light-emitting element ED may include the semiconductor layers and may be oriented such that an end portion thereof faces in a specific direction according to a direction of an electric field generated on the electrodes RME1 and RME2. The light-emitting element ED may include a light-emitting layer 36 (see FIG. 7) to emit light having a specific wavelength. The light-emitting elements ED disposed in each subpixel PXn may emit light having different wavelengths according to materials forming the light-emitting layer 36. However, the disclosure is not limited thereto, and the light-emitting elements ED disposed in each subpixel PXn may emit light having the same color.

The light-emitting element ED may be disposed on each of the electrodes RME1 and RME2 between the first banks BNL1. For example, the light-emitting element ED may be disposed such that an end portion thereof is placed on the first electrode RME1 and another end portion thereof is placed on the second electrode RME2. An extended length of the light-emitting element ED may be greater than the distance between the first electrode RME1 and the second electrode RME2, and both end portions of the light-emitting element ED may be disposed on the first electrode RME1 and the second electrode RME2.

In the light-emitting element ED, layers may be disposed in a direction perpendicular to an upper surface of the first substrate SUB. The light-emitting element ED of the display device 10 may be disposed such that a direction in which the light-emitting element ED extends is parallel to the first substrate SUB, and the semiconductor layers included in the light-emitting element ED may be sequentially disposed in a direction parallel to the upper surface of the first substrate SUB. However, the disclosure is not limited thereto. In some embodiments, in case that the light-emitting element ED has a different structure, the layers may be disposed in a direction perpendicular to the first substrate SUB.

Both end portions of the light-emitting element ED may electrically contact the contact electrodes CNE1 and CNE2. Since the semiconductor layer is partially exposed on surfaces of end portions of the light-emitting element ED, where an insulating film 38 (see FIG. 7) is not formed, in a direction in which the light-emitting element ED extends, the exposed semiconductor layer may contact the contact electrodes CNE1 and CNE2. However, the disclosure is not limited thereto. In some embodiments, in the light-emitting element ED, at least a partial area of the insulating film 38 may be removed, and the insulating film 38 may be removed to partially expose side surfaces of both end portions of the semiconductor layers. The exposed side surfaces of the semiconductor layer may directly contact the contact electrodes CNE1 and CNE2.

A second insulating layer PAS2 may be partially disposed on the first insulating layer PAS1 and the light-emitting element ED. The second insulating layer PAS2 may also be disposed on the second bank BNL2. As an example, the second insulating layer PAS2 may be disposed to partially surround an outer surface of the light-emitting element ED and disposed not to cover (or overlap) an end portion and another end portion of the light-emitting element ED. Portions of the second insulating layer PAS2 may be disposed on the first insulating layer PAS1 on portions of the first banks BNL1 on which the first electrode RME1 and the second electrode RME2 are disposed. For example, the second insulating layer PAS2 may be disposed on the first insulating layer PAS1, the second bank BNL2, and the light-emitting element ED in the emission area EMA and may be disposed to expose both end portions of the light-emitting element ED as well as partially expose portions on which the electrodes RME1 and RME2 are disposed. Such a shape of the second insulating layer PAS2 may be formed by a process of a manufacturing process of the display device 10, in which the second insulating layer PAS2 is entirely disposed on the first insulating layer PAS1 and the second bank BNL2 and then is removed to expose both end portions of the light-emitting element ED. A portion of the second insulating layer PAS2 disposed on the light-emitting element ED may be disposed to extend in the second direction DR2 on the first insulating layer PAS1 in a plan view, thereby forming a linear or island-shaped pattern in each subpixel PXn. The second insulating layer PAS2 may protect the light-emitting element ED and affix the light-emitting element ED in a manufacturing process of the display device 10. The second insulating layer PAS2 may be disposed to fill a space between the light-emitting element ED and the first insulating layer PAS1 under the light-emitting element ED.

Although not shown in the drawings, a portion of the second insulating layer PAS2 may be disposed in the cutout area CBA. The electrodes RME1 and RME2 disposed in the subpixels PXn may be formed to extend in the second direction DR2 in a state of being connected to each other and then may be separated in the cutout area CBA after the light-emitting elements ED are aligned and the second insulating layer PAS2 are formed. In a separation process of the electrodes RME1 and RME2, each of the electrodes RME1 and RME2, the first insulating layer PAS1, and the second insulating layer PAS2 may be removed together, and in removed portions of the electrodes RME1 and RME2, the first insulating layer PAS1, and the second insulating layer PAS2, a third insulating layer PAS3 described below may be disposed directly on the third interlayer insulating layer IL3. However, the disclosure is not limited thereto, and the third insulating layer PAS3 may also be removed in portions at which the electrodes RME1 and RME2 are separated in the cutout area CBA so that a portion of the third interlayer insulating layer IL3 may be exposed. As another example, another insulating layer disposed on the third insulating layer PAS3 to cover or overlap each member may be disposed directly on the third interlayer insulating layer IL3.

The contact electrodes CNE1 and CNE2 and the third insulating layer PAS3 may be disposed on the second insulating layer PAS2. The first contact electrode CNE1 and the second contact electrode CNE2 of the contact electrodes (CNE1 and CNE2) may be disposed on a portion of the first electrode RME1 and a portion of the second electrode RME2, respectively. The first contact electrode CNE1 may be disposed on the first electrode RME1, and the second contact electrode CNE2 may be disposed on the second electrode RME2. The first contact electrode CNE1 and the second contact electrode CNE2 may each have a shape extending in the second direction DR2. The first contact electrode CNE1 and the second contact electrode CNE2 may be spaced apart from and face each other in the first direction DR1 and may form linear patterns in the emission area EMA of each subpixel PXn.

The contact electrodes CNE1 and CNE2 may contact the light-emitting elements ED and the electrodes RME1 and RME2. The semiconductor layer may be exposed on surfaces of both end portions of the light-emitting element ED in a direction in which the light-emitting element ED extends, and the first contact electrode CNE1 and the second contact electrode CNE2 may contact the surfaces of the end portions of the light-emitting element ED at which the semiconductor layer is exposed. One end portion of the light-emitting element ED may be electrically connected to the first electrode RME1 through the first contact electrode CNE1, and another end portion thereof may be electrically connected to the second electrode RME2 through the second contact electrode CNE2.

In the drawing, a first contact electrode CNE1 and a second contact electrode CNE2 are illustrated as being disposed in a subpixel PXn, but the disclosure is not limited thereto. The number of the first and second contact electrodes CNE1 and CNE2 may vary according to the number of the first and second electrodes RME1 and RME2 disposed in each subpixel PXn.

The contact electrodes CNE1 and CNE2 may include a conductive material. For example, the contact electrodes CNE1 and CNE2 may include ITO, IZO, ITZO, aluminum (Al), or the like. As an example, the contact electrodes CNE1 and CNE2 may include a transparent conductive material, and light emitted from the light-emitting element ED may penetrate through the contact electrodes CNE1 and CNE2 and travel toward the electrodes RME1 and RME2. However, the disclosure is not limited thereto.

Light may be generated in the light-emitting layer 36 (see FIG. 7), and most of the light may be emitted through both end portions of the light-emitting element ED electrically contacting the contact electrodes CNE1 and CNE2. The light emitted from the light-emitting element ED may penetrate through the transparent contact electrodes CNE1 and CNE2, may be reflected by the electrodes RME1 and RME2 disposed on the inclined side surfaces of the first bank BNL1, and may be emitted in an upward direction of the first substrate SUB. However, a portion of the light may be incident on the first insulating layer PAS1 disposed under the light-emitting element ED. The first insulating layer PAS1 and the contact electrodes CNE1 and CNE2 may have different refractive indices, and the portion of the light incident on the first insulating layer PAS1 may be reflected at interfaces with the contact electrodes CNE1 and CNE2 and thus may not emitted.

In the display device 10, the interfaces between the first insulating layer PAS1 and the contact electrodes CNE1 and CNE2 having different refractive indices may be minimized (or reduced) to minimize (or reduce) an amount of light that is emitted from the light-emitting element ED but may not be emitted from the first insulating layer PAS1. In an embodiment, the first contact electrode CNE1 and the second contact electrode CNE2 may be formed such that a width DC thereof measured in a direction is smaller than a width DM of the first electrode RME1 and the second electrode RME2 measured in the direction, and thus, the contact electrodes CNE1 and CNE2 may be formed to have a minimum width.

As an example, the first contact electrode CNE1 and the second contact electrode CNE2 may electrically contact an end portion and another end portion of the light-emitting element ED, respectively, and the first contact electrode CNE1 and the second contact electrode CNE2 may be disposed to cover or overlap only portions of the upper surfaces of the first electrode RME1 and the second electrode RME2, which are disposed on the third interlayer insulating layer IL3. For example, the contact electrodes CNE1 and CNE2 may not be disposed on the inclined side surfaces of the first banks BNL1, and light reflected by the electrodes RME1 and RME2 on the inclined side surfaces may penetrate through the first insulating layer PAS1 to be smoothly emitted.

The first contact electrode CNE1 and the second contact electrode CNE2 may electrically contact the electrodes RME1 and RME2 through contact portions CTD and CTS penetrating through the first insulating layer PAS1 to expose portions of the upper surfaces of the electrodes RME1 and RME2, respectively. In case that the contact portions CTD and CTS are in an optical path through which light emitted from both end portions of the light-emitting element ED travels, the interfaces between the first insulating layer PAS1 and the contact electrodes CNE1 and CNE2 may be formed, and the light may be reflected at the interfaces, thereby resulting in a decrease in luminous efficiency. In the display device 10 according to an embodiment, the contact portions CTD and CTS through which the contact electrodes CNE1 and CNE2 electrically contact the electrodes RME1 and RME2 may be formed to avoid the optical path of the light emitted from the light-emitting element ED. In the display device 10, in addition to the width and arrangement of the contact electrodes CNE1 and CNE2, the positions of the contact portions CTD and CTS may be designed such that light emitted from the light-emitting element ED is smoothly emitted, thereby improving the luminous efficiency of the light generated in the light-emitting element ED. This will be described in more detail below with reference to other drawings.

The third insulating layer PAS3 may be disposed between the first contact electrode CNE1 and the second contact electrode CNE2. The third insulating layer PAS3 may be disposed on the first contact electrode CNE1 and may also be disposed on the second insulating layer PAS2 other than an area in which the second contact electrode CNE2 is disposed. The third insulating layer PAS3 may be entirely disposed on the first insulating layer PAS1 other than a portion of the electrodes RME1 and RME2, on which the second contact electrode CNE2 is disposed. The third insulating layer PAS3 may insulate the first contact electrode CNE1 and the second contact electrode CNE2 from each other so as not to directly contact each other. For example, in an embodiment, the first contact electrode CNE1 and the second contact electrode CNE2 may be disposed on different layers. The first contact electrode CNE1 may be disposed directly on the second insulating layer PAS2, and the second contact electrode CNE2 may be disposed directly on the third insulating layer PAS3. However, in areas in which the second insulating layer PAS2 and the third insulating layer PAS3 are not disposed and both end portions of the light-emitting element ED are exposed, the first contact electrode CNE1 and the second contact electrode CNE2 may be disposed directly on the first insulating layer PAS1.

However, the third insulating layer PAS3 may be disposed between the first contact electrode CNE1 and the second contact electrode CNE2 to insulate the first contact electrode CNE1 and the second contact electrode CNE2 from each other, but as described above, the third insulating layer PAS3 may be omitted. In this case, the first contact electrode CNE1 and the second contact electrode CNE2 may be disposed to be coplanar with each other.

Although not shown in the drawing, an insulating layer may be further disposed on the third insulating layer PAS3, the contact electrodes CNE1 and CNE2, and the second bank BNL2 to overlap the third insulating layer PAS3, the contact electrodes CNE1 and CNE2, and the second bank BNL2. The insulating layer may be entirely disposed on the first substrate SUB to perform a function of protecting members disposed on the first substrate SUB from an external environment.

Each of the first insulating layer PAS1, the second insulating layer PAS2, and the third insulating layer PAS3 may include an inorganic insulating material or an organic insulating material. In an embodiment, the first insulating layer PAS1, the second insulating layer PAS2, and the third insulating layer PAS3 may include an inorganic insulating material such as silicon oxide ($SiO_x$), silicon nitride ($SiN_x$), silicon oxynitride ($SiO_xN_y$), aluminum oxide ($AlO_x$), or aluminum nitride ($AlN_x$). As another example, the first insulating layer PAS1, the second insulating layer PAS2, and the third insulating layer PAS3 may include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited thereto.

As described above, in the display device 10 according to an embodiment, the arrangement of the contact electrodes CNE1 and CNE2 and the positions of the contact portions CTD and CTS may be designed such that light emitted from the light-emitting element ED is smoothly emitted. Hereinafter, the contact electrodes CNE1 and CNE2 and the contact portions CTD and CTS will be described in more detail with further reference to other drawings.

Figure 5:
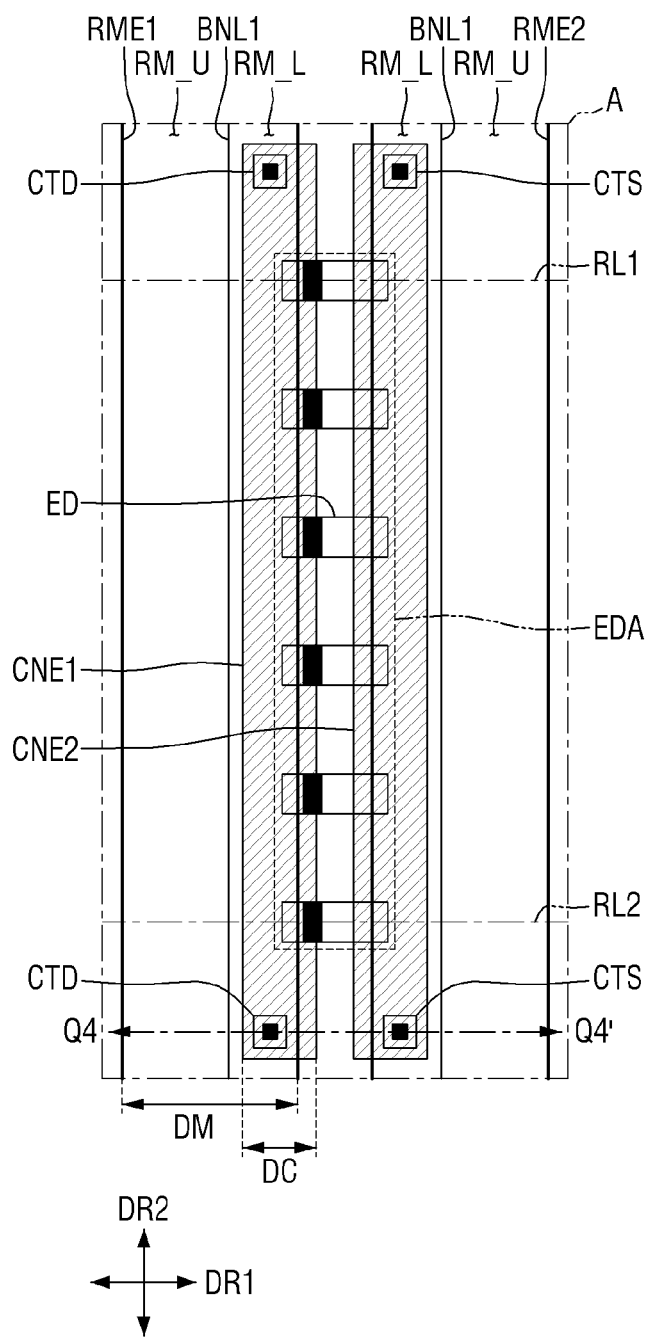
FIG. 5 is a schematic enlarged view of portion A of FIG. 3.
Figure 6:
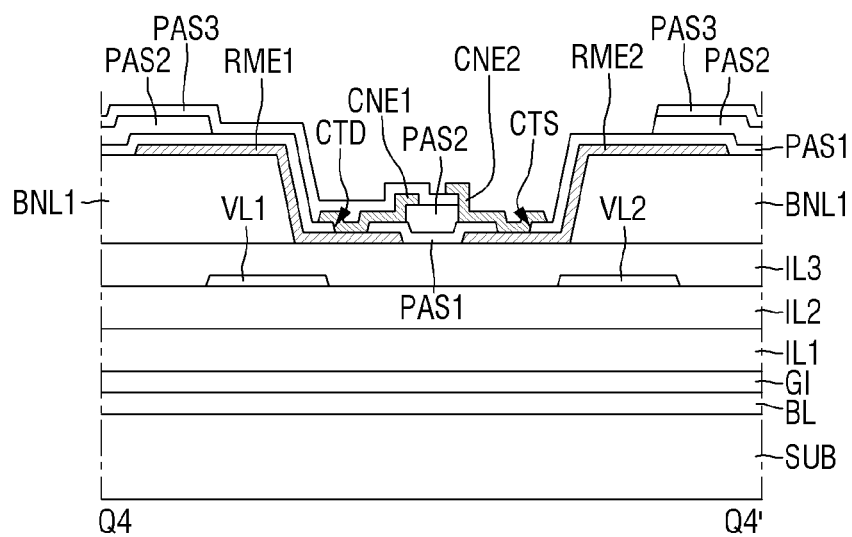
FIG. 6 is a schematic cross-sectional view taken along line Q4-Q4' of FIG. 5.

FIG. 5 is a schematic enlarged view of portion A of FIG. 3. FIG. 6 is a schematic cross-sectional view taken along line Q4-Q4' of FIG. 5. FIG. 5 is a schematic enlarged view of a portion in which the light-emitting elements ED and the contact electrodes CNE1 and CNE2 are disposed on the electrodes RME1 and RME2, and FIG. 6 illustrates a cross section traversing a first contact portion CTD and a second contact portion CTS.

Further referring to FIGS. 5 and 6 in conjunction with FIG. 4, the first contact electrode CNE1 and the second contact electrode CNE2 may have a shape extending in the second direction DR2 and may each contact an end portion of the light-emitting element ED and disposed on the electrodes RME1 and RME2. The first contact electrode CNE1 and the second contact electrode CNE2 may contact the light-emitting element ED and the electrodes RME1 and RME2 and be disposed only in a minimum area in a path through which light emitted from the light-emitting element ED travels. According to an embodiment, the first and second contact electrodes CNE1 and CNE2 may have a width measured in the first direction DR1 smaller than a width of the first electrode RME1 and the second electrode RME2 measured in the first direction DR1 and may be disposed on portions of the electrodes RME1 and RME2, which are disposed directly on the third interlayer insulating layer IL3.

Each of the electrodes RME1 and RME2 may be disposed on the first bank BNL1, and at least a portion thereof may be disposed directly on the third interlayer insulating layer IL3. Each of the electrodes RME1 and RME2 may include a first portion RM_L disposed directly on the third interlayer insulating layer IL3 and a second portion RM_U disposed on an upper surface and the inclined side surface of the first bank BNL1. The first portion RM_L may be disposed at a lower level than the second portion RM_U, and the light-emitting elements ED may be disposed on the first portions RM_L of the first electrode RME1 and the second electrode RME2. The distance between the first electrode RME and the second electrode RME2 may be a distance between the first portions RM_L, and the distance may be smaller than a length of the light-emitting element ED.

The first contact electrode CNE1 may be disposed on the first portion RM_L of the first electrode RME1, and the second contact electrode CNE2 may be disposed on the first portion RM_L of the second electrode RME2. Since the first contact electrode CNE1 and the second contact electrode CNE2 have a width so as not to be disposed on the second portion RM_U disposed on the first bank BNL1, the first contact electrode CNE1 and the second contact electrode CNE2 may not overlap the first bank BNL1 in a thickness direction thereof. However, the width or position of the first contact electrode CNE1 and the second contact electrode CNE2 may be adjusted such that the first contact electrode CNE1 and the second contact electrode CNE2 may smoothly contact both end portions of the light-emitting element ED. In an embodiment, a distance between the first contact electrode CNE1 and the second contact electrode CNE2 may be smaller than the distance between the first portions RM_L of the first electrode RME1 and the second electrode RME2. The first contact electrode CNE1 and the second contact electrode CNE2 may have a width sufficient to contact both end portions of the light-emitting element ED disposed on the first portions RM_L.

Most of light generated by the light-emitting element ED may be emitted through both end portions of the light-emitting element ED contacting the contact electrodes CNE1 and CNE2. At least a portion of the light may be incident on the first insulating layer PAS1 from the both end portions. In case that a material forming the contact electrodes CNE1 and CNE2 has a refractive index higher than that of a material forming the first insulating layer PAS1, a certain amount of the light incident on the first insulating layer PAS1 may be reflected at the interfaces with the contact electrodes CNE1 and CNE2 and thus may not be emitted. To minimize an amount of light that is lost without being emitted from the first insulating layer PAS1, it is possible to minimize an area in which the first insulating layer PAS1 and the contact electrodes CNE1 and CNE2 form interfaces. In particular, a width of the contact electrodes CNE1 and CNE2 may be designed such that the first insulating layer PAS1 and the contact electrodes CNE1 and CNE2 do not form an interface on the inclined side surface of the first bank BNL1, at which the light is reflected. Since the contact electrodes CNE1 and CNE2 are disposed only on the first portions RM_L of the electrodes RME1 and RME2 and are not disposed on the inclined side surface of the first bank BNL1, light which is incident on the first insulating layer PAS1 and is reflected at the interfaces with the contact electrodes CNE1 and CNE2, may also be reflected by the electrodes RME1 and RME2 disposed on the side surfaces of the first banks BNL1 to be emitted to the outside. In the display device 10 according to an embodiment, since the contact electrodes CNE1 and CNE2 are disposed only on the first portions RM_L of the electrodes RME1 and RME2, it is possible to reduce an amount of light that is lost while being incident on the first insulating layer PAS1 among light beams emitted from the light-emitting element ED and to improve the luminous efficiency of each subpixel PXn.

The first contact electrode CNE1 and the second contact electrode CNE2 may electrically contact the first electrode RME1 and the second electrode RME2 through the first contact portion CTD and the second contact portion CTS, respectively. The first contact portion CTD may penetrate through the first insulating layer PAS1 to expose a portion of the upper surface of the first electrode RME1, and the second contact portion CTS may penetrate through the first insulating layer PAS1 to expose a portion of the upper surface of the second electrode RME2. First contact portions CTD and second contact portions CTS may be disposed for each subpixel PXn. For example, FIG. 5 illustrates that two first contact portions CTD and two second contact portions CTS, for example, a pair of contact portions CTD and a pair of contact portions CTS, are disposed, but the disclosure is not limited thereto. For example, more first contact portions CTD and more second contact portions CTS may be disposed.

Since the first contact portion CTD and the second contact portion CTS each penetrate through the first insulating layer PAS1, the contact electrodes CNE1 and CNE2 disposed in the first contact portion CTD and the second contact portion CTS may form interfaces with the first insulating layer PAS1. As described above, in case that the interfaces between the contact electrodes CNE1 and CNE2 and the first insulating layer PAS1 are formed, light traveling in the first insulating layer PAS1 may be reflected at the interfaces and thus may be not emitted. To prevent light from being lost without being emitted because of the contact electrodes CNE1 and CNE2 disposed in the contact portions CTD and CTS, the display device 10 may include the contact portions CTD and CTS to avoid an optical path of the light-emitting element ED.

The light-emitting elements ED may emit light through both end portions thereof, and the light may be emitted in a direction in which the light-emitting elements ED extend. According to an embodiment, the contact portions CTD and CTS may be disposed to be spaced apart from a light-emitting element area EDA, in which the light-emitting elements ED are disposed, in a direction perpendicular to the direction in which the light-emitting elements ED extend. The light-emitting elements ED may be disposed on the electrodes RME1 and RME2, and in each subpixel PXn, the light-emitting element area EDA, in which the light-emitting elements ED configured to emit light are disposed, may be defined within the emission area EMA. Based on the light-emitting element area EDA, an area, through which light emitted from the light-emitting element ED travels, may be present in the direction in which the light-emitting element ED extends, for example, in the first direction DR1, and the contact portions CTD and CTS may not be disposed in the area through which the light travels.

As an example, the plurality of contact portions CTD and CTS may be disposed on end portions in the second direction DR2 of the contact electrodes CNE1 and CNE2. The first contact portions CTD are disposed on end portions in the second direction DR2 of the first contact electrode CNE1, and the second contact portions CTS are disposed on end portions in the second direction DR2 of the second contact electrode CNE2. Also, the contact portions CTD and CTS may be disposed to be spaced apart from the light-emitting elements ED and the light-emitting element area EDA in the second direction DR2. A pair of first contact portions CTD may be disposed on the first portion RM_L of the first electrode RME1 and may be disposed to be spaced apart from each other at one side and another side of the light-emitting element area EDA in the second direction DR2. Similarly, a pair of second contact portions CTS may be disposed on the first portion RM_L of the second electrode RME2 and may be disposed to be spaced apart from each other at a side and another side of the light-emitting element area EDA in the second direction DR2. In the light-emitting element area EDA, the light-emitting elements ED may be arranged in the second direction DR2, and arbitrary reference lines RL1 and RL2 may be defined in extending directions of the uppermost light-emitting element ED and the lowermost light-emitting element ED thereof.

The reference lines RL1 and RL2 may include a first reference line RL1 that extends across both end portions of the uppermost light-emitting element ED and a second reference line RL2 that extends across both end portions of the lowermost light-emitting element ED. Areas between the first reference line RL1 and the second reference line RL2 may be both side areas of the light-emitting element area EDA in the first direction DR1 and may be areas in which light emitted from the light-emitting elements ED travels. According to an embodiment, the contact portions CTD and CTS may be disposed outside an area between the first reference line RL1 and the second reference line RL2 and may be spaced apart from the first reference line RL1 and the second reference line RL2 in the second direction DR2. Since the contact portions CTD and CTS are not disposed between the first reference line RL1 and the second reference line RL2, it is possible to minimize a portion of light emitted from the light-emitting element ED being reflected at the interfaces between the contact electrodes CNE1 and CNE2 and the first insulating layer PAS1. For example, the light-emitting elements ED may not be disposed in an area between the first contact portion CTD and the second contact portion CTS in the first direction DR1.

Even in case that the contact electrodes CNE1 and CNE2 are disposed on the first portions RM_L of the electrodes RME1 and RME2, the contact portions CTD and CTS may be disposed outside the area between the reference lines RL1 and RL2 and may not be disposed between both end portions of the light-emitting element ED and the first bank BNL1. Since light emitted from the end portion of the light-emitting element ED is not reflected at the interfaces between the first insulating layer PAS1 and the contact electrodes CNE1 and CNE2 until being reflected by the electrodes RME1 and RME2 disposed on the inclined side surfaces of the first banks BNL1, even in case that most of light is incident on the first insulating layer PAS1, most of the light can be smoothly emitted. In the display device 10 according to an embodiment, even in case that the first insulating layer PAS1 and the contact electrodes CNE1 and CNE2 have different refractive indices, it is possible to prevent light emitted from the light-emitting element ED from being reflected at the interfaces between the contact electrodes CNE1 and CNE2 and the first insulating layer PAS1 and thus not being emitted. In the display device 10, the arrangement of the contact electrodes CNE1 and CNE2 and the contact portions CTD and CTS may be designed to prevent a decrease in luminous efficiency of light emitted from the light-emitting element ED.

Figure 7:
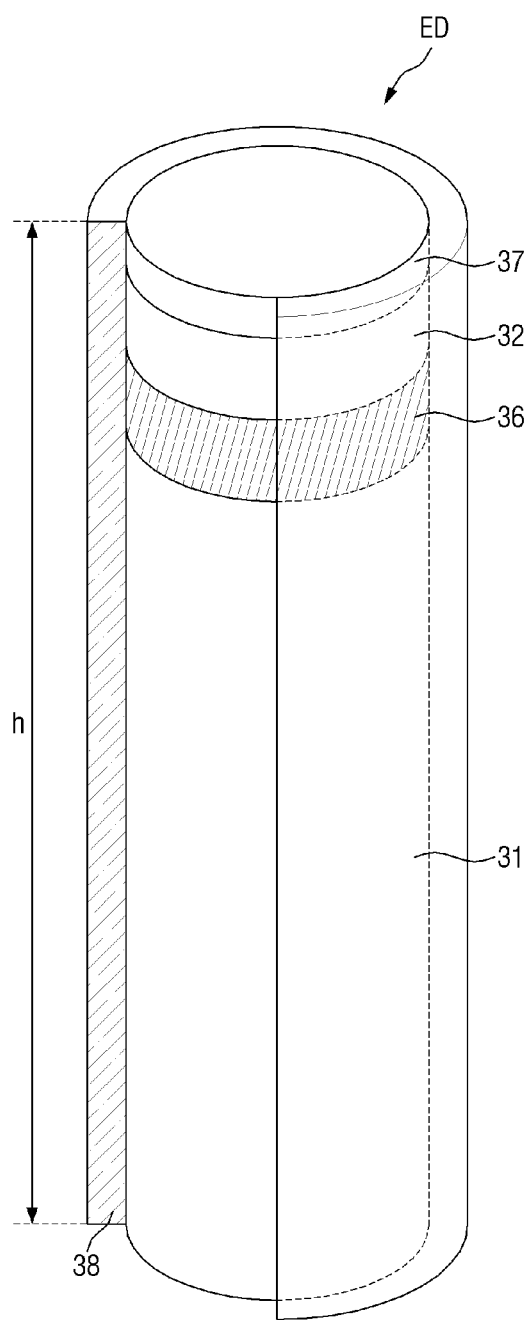
FIG. 7 is a schematic view of a light-emitting element according to an embodiment.

FIG. 7 is a schematic view of a light-emitting element according to an embodiment.

A light-emitting element ED may be a light-emitting diode, and specifically, the light-emitting element ED may be an inorganic light-emitting diode which has a size of a micrometer or nanometer unit and is made of an inorganic material. In case that an electric field is formed between two facing electrodes in a specific direction, the inorganic light-emitting diode may be aligned between the two electrodes between which a polarity is formed. The light-emitting element ED may be aligned between electrodes by an electric field formed on the two electrodes.

The light-emitting element ED according to an embodiment may have a shape extending in a direction. The light-emitting element ED may have a shape such as a cylinder, a rod, a wire, or a tube. However, the shape of the light-emitting element ED is not limited thereto, and the light-emitting element ED may have various shapes such as a polygonal column shape such as a regular hexahedron, a rectangular parallelepiped, or a hexagonal column, and a shape which extends in a direction and has a partially inclined outer surface. Semiconductors to be described below included in the light-emitting element ED may have a structure in which they are sequentially disposed or stacked in the direction.

The light-emitting element ED may include a semiconductor layer doped with a conductive (for example, a p-type or n-type) impurities. The semiconductor layer may emit light at a specific wavelength by receiving an electrical signal applied from an external power source.

Referring to FIG. 7, the light-emitting element ED may include a first semiconductor layer 31, a second semiconductor layer 32, a light-emitting layer 36, an electrode layer 37, and an insulating film 38.

The first semiconductor layer 31 may be an n-type semiconductor. In case that the light-emitting element ED emits light having a blue wavelength, the first semiconductor layer 31 may include a semiconductor material having a formula of $Al_xGa_yIn_{1-x-y}N$ ($0 \leq x \leq 1$, $0 \leq y \leq 1$, and $0 \leq x+y \leq 1$). For example, the first semiconductor layer 31 may include at least one selected from among AlGaInN, GaN, AlGaN, InGaN, AlN, and InN which are doped with n-type impurities. The first semiconductor layer 31 may be doped with an n-type dopant, and the n-type dopant may be silicon (Si), germanium (Ge), tin (Sn), or the like. For example, the first semiconductor layer 31 may include n-GaN doped with n-type Si. The first semiconductor layer 31 may have a length ranging from about 1.5 μm to about 5 μm, but the disclosure is not limited thereto. A first end portion of the light-emitting element ED may be a portion at which the first semiconductor layer 31 is disposed based on the light-emitting layer 36.

The second semiconductor layer 32 may be disposed on the light-emitting layer 36 to be described below. The second semiconductor layer 32 may be a p-type semiconductor, and in case that the light-emitting element ED emits light having a blue or green wavelength, the second semiconductor layer 32 may include a semiconductor material having a formula of $Al_xGa_yIn_{1-x-y}N$ ($0 \leq x \leq 1$, $0 \leq y \leq 1$, and $0 \leq x+y \leq 1$). For example, the second semiconductor layer 32 may include at least one selected from among AlGaInN, GaN, AlGaN, InGaN, AlN, and InN which are doped with p-type impurities. The second semiconductor layer 32 may be doped with a p-type dopant, and the p-type dopant may be magnesium (Mg), zinc (Zn), calcium (Ca), selenium (Se), barium (Ba), or the like. For example, the second semiconductor layer 32 may include p-GaN doped with p-type Mg. The second semiconductor layer 32 may have a length ranging from about 0.05 μm to about 0.10 μm, but the disclosure is not limited thereto. A second end portion of the light-emitting element ED may be a portion at which the second semiconductor layer 32 is disposed based on the light-emitting layer 36.

In the drawing, the first semiconductor layer 31 and the second semiconductor layer 32 are illustrated as being formed as a single layer, but the disclosure is not limited thereto. The first semiconductor layer 31 and the second semiconductor layer 32 may further include more layers, for example, a clad layer or a tensile strain barrier reducing (TSBR) layer depending on a material of the light-emitting layer 36.

The light-emitting layer 36 may be disposed between the first semiconductor layer 31 and the second semiconductor layer 32. The light-emitting layer 36 may include a material having a single or multi-quantum well structure. In case that the light-emitting layer 36 includes a material having a multi-quantum well structure, the light-emitting layer 36 may have a structure in which quantum layers and well layers are alternately stacked. The light-emitting layer 36 may emit light by electron-hole pair recombination according to an electrical signal applied through the first semiconductor layer 31 and the second semiconductor layer 32. In case that the light-emitting layer 36 emits light having a blue wavelength, the light-emitting layer 36 may include a material such as AlGaN or AlGaInN. In case that the light-emitting layer 36 has a structure in which quantum layers and well layers are alternately stacked in a multi-quantum well structure, the quantum layer may include a material such as AlGaN or AlGaInN, and the well layer may include a material such as GaN or AlInN. For example, the light-emitting layer 36 may include AlGaInN as the quantum layer and AlInN as the well layer. Thus, as described above, the light-emitting layer 36 may emit blue light having a central wavelength ranging from about 450 nm to about 495 nm.

However, the disclosure is not limited thereto, and the light-emitting layer 36 may have a structure in which a semiconductor material having high band gap energy and a semiconductor material having low band gap energy are alternately stacked or may include other Group III to V semiconductor materials according to a wavelength of emitted light. Light emitted by the light-emitting layer 36 is not limited to light having a blue wavelength, and in some embodiments, the light-emitting layer 36 may emit light having a red or green wavelength. The light-emitting layer 36 may have a length ranging from about 0.05 μm to about 0.10 μm, but the disclosure is not limited thereto.

Light emitted from the light-emitting layer 36 may be emitted not only to an outer surface of the light-emitting element ED in a length direction thereof but also to both side surfaces of the light-emitting element ED. The direction of the light emitted from the light-emitting layer 36 is not limited to a direction.

The electrode layer 37 may be an ohmic contact electrode. However, the disclosure is not limited thereto, and the electrode layer 37 may be a Schottky contact electrode. The light-emitting element ED may include at least one electrode layer 37. In FIG. 7, the light-emitting element ED is illustrated as including an electrode layer 37, but the disclosure is not limited thereto. In some embodiments, the light-emitting element ED may include more electrode layers 37, or the electrode layer 37 may be omitted. Even in case that the number of the electrode layers 37 is changed or the light-emitting element ED further includes other structures, the same may be applied to the description of the light-emitting element ED described below.

In a display device 10 according to an embodiment, in case that the light-emitting element ED is electrically connected to an electrode or a contact electrode, the electrode layer 37 may reduce resistance between the light-emitting element ED and the electrode or the contact electrode. The electrode layer 37 may include a material having conductivity. For example, the electrode layer 370 may include at least one selected from among aluminum (Al), titanium (Ti), indium (In), gold (Au), silver (Ag), ITO, IZO, or ITZO. The electrode layer 37 may include a semiconductor material that is doped with n-type or p-type impurities. However, the disclosure is not limited thereto.

The insulating film 38 may be disposed to surround outer surfaces of the semiconductor layers and electrode layers described above. For example, the insulating film 38 may be disposed to surround at least an outer surface of the light-emitting layer 36 and may extend in a direction in which the light-emitting element ED extends. The insulating film 38 may perform a function of protecting such members. The insulating film 38 may be formed to surround side surfaces of the members and may be formed to expose both end portions of the light-emitting element ED in the length direction thereof.

In the drawing, the insulating film 38 is illustrated as being formed to extend in the length direction of the light-emitting element ED and to cover or overlap the side surfaces of the first semiconductor layer 31, the second semiconductor layer 32, the light-emitting layer 36, and the electrode layer 37, but the disclosure is not limited thereto. The insulating film 38 may cover only the outer surfaces of some of the semiconductor layers including the light-emitting layer 36 or may cover only a portion of the outer surface of the electrode layer 37 to partially expose the outer surface of the electrode layer 37. The insulating film 38 may have a rounded upper surface in a cross section in an area adjacent to at least one end portion of the light-emitting element ED.

The insulating film 38 may have a thickness ranging from about 10 nm to about 1.0 μm, but the disclosure is not limited thereto. The insulating film 38 may have a thickness of about 40 nm.

The insulating film 38 may include at least one selected from among materials having insulating properties, for example, silicon oxide ($SiO_x$), silicon nitride ($SiN_x$), silicon oxynitride ($SiO_xN_y$), aluminum nitride ($AlN_x$), and aluminum oxide ($AlO_x$). In the drawing, the insulating film 38 is illustrated as being formed as a single-layer, but the disclosure is not limited thereto. In some embodiments, the insulating film 38 may be formed in a multi-layered structure in which layers are stacked. Accordingly, it is possible to prevent an electrical short circuit that may occur in case that the light-emitting layer 36 directly contact an electrode through which an electrical signal is transmitted to the light-emitting element ED. Since the insulating film 38 protects the outer surface of the light-emitting element ED including the light-emitting layer 36, it is possible to prevent a decrease in luminous efficiency.

An outer surface of the insulating film 38 may be surface-treated. The light-emitting element ED may be aligned by being sprayed on electrodes in a state of being dispersed in a predetermined ink. Here, in order for the light-emitting element ED to remain dispersed without being aggregated with other adjacent light-emitting elements ED in the ink, the surface of the insulating film 38 may be treated to be hydrophobic or hydrophilic. For example, the outer surface of the insulating film 38 may be surface-treated with a material such as a stearic acid or a 2,3-naphthalene dicarboxylic acid.

A length h of the light-emitting element ED may range from about 1 μm to about 10 μm or from about 2 μm to about 6 μm and may range from about 3 μm to about 5 μm. The light-emitting element ED may have a diameter ranging from about 30 nm to about 700 nm and may have an aspect ratio ranging from about 1.2 to about 100. However, the disclosure is not limited thereto, and the light-emitting elements ED included in the display device 10 may have different diameters according to a difference in composition of the light-emitting layer 36. The light-emitting element ED may have a diameter of about 500 nm.

Hereinafter, other embodiments of the display device 10 will be described with reference to other drawings.

Figure 8:
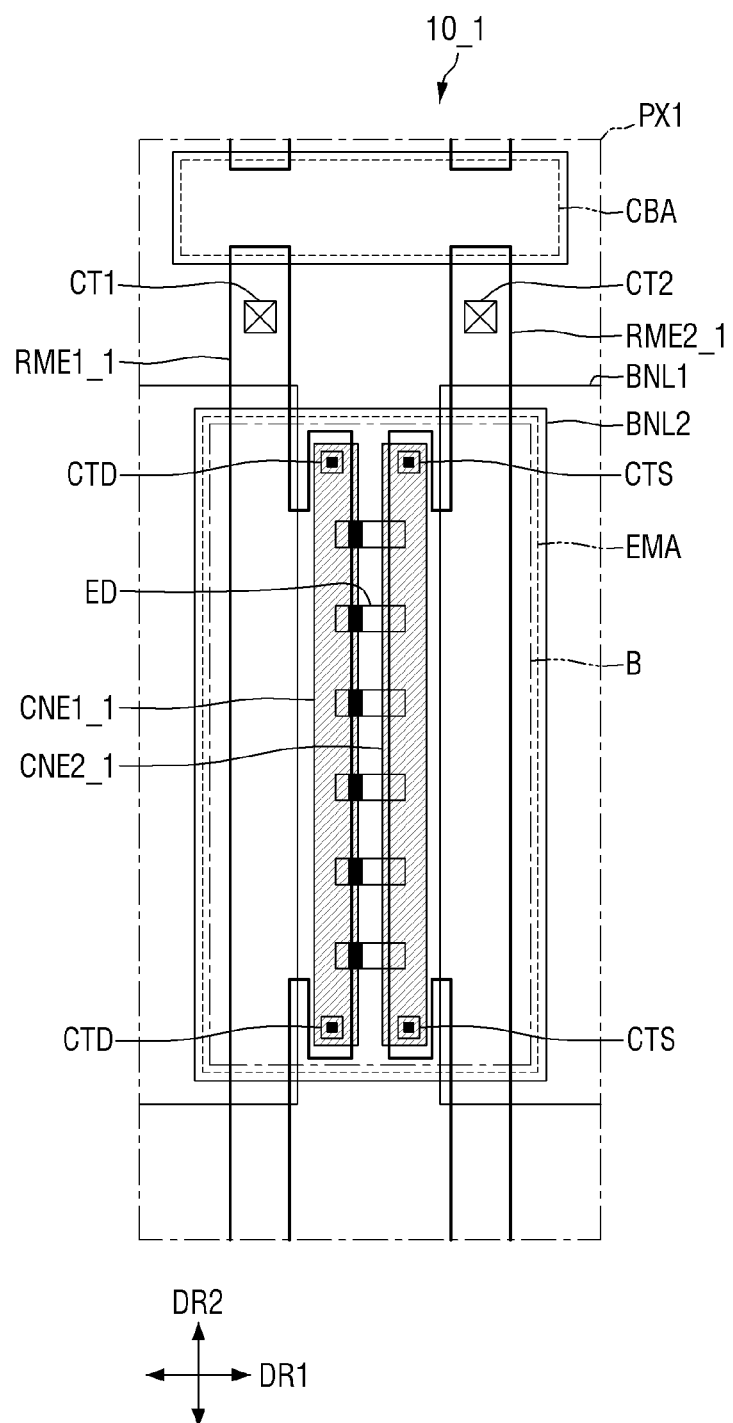
FIG. 8 is a schematic plan view illustrating a subpixel of a display device according to another embodiment.
Figure 9:
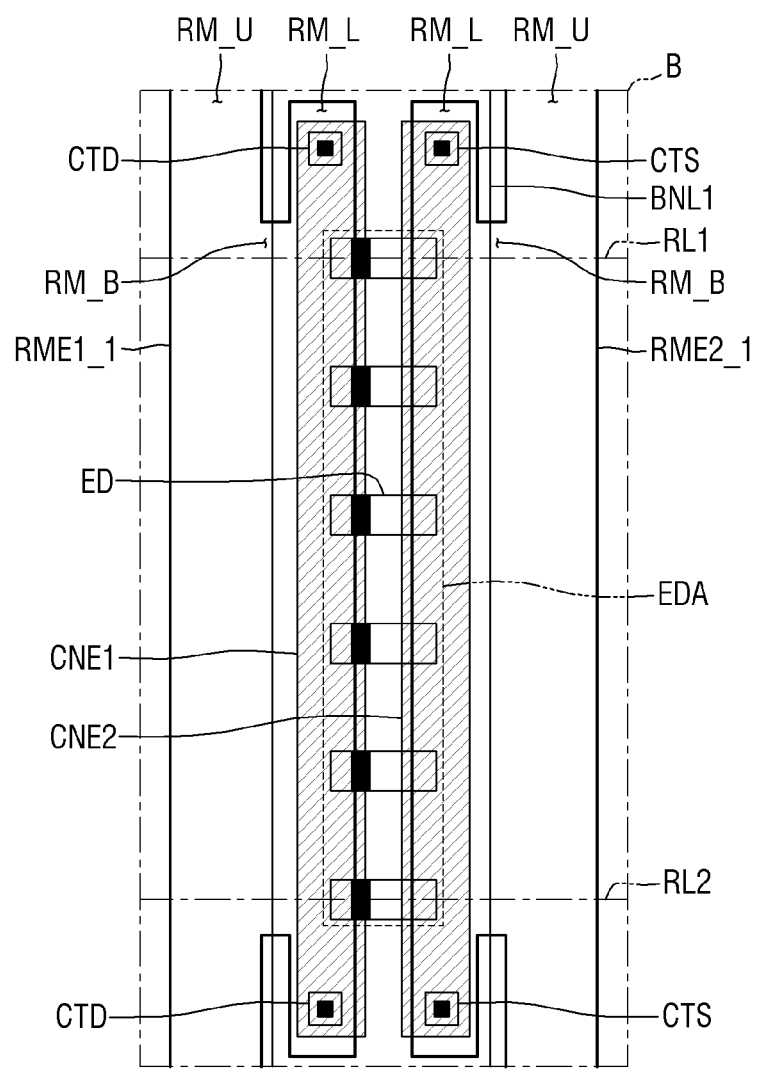
FIG. 9 is a schematic enlarged view of portion B of FIG. 8.

FIG. 8 is a schematic plan view illustrating a subpixel of a display device according to another embodiment. FIG. 9 is a schematic enlarged view of portion B of FIG. 8. FIG. 9 is a schematic enlarged view of a portion in which electrodes RME1_1 and RME2_1 and contact electrodes CNE1 and CNE2 are disposed, including a light-emitting element area EDA in a first subpixel PX1 of FIG. 8.

Referring to FIGS. 8 and 9, in a display device 10_1, a first electrode RME1_1 and a second electrode RME2_1 may have different shapes in response to the arrangement of the contact electrodes CNE1 and CNE2. According to an embodiment, the first electrode RME1_1 and the second electrode RME2_1 may further include a third portion RM_B electrically connecting a first portion RM_L and a second portion RM_U. In each of the electrodes RME1_1 and RME2_1, the first portion RM_L may be disposed only in an emission area EMA, and a length of an electrode connection part RM_R (see, e.g., FIG. 17) measured in a second direction DR2 may be smaller than that of the first portion RM_L. The electrodes RME1_1 and RME2_1 may have the first portion RM_L having a shape which protrudes from the second portion RM_U disposed on a first bank BNL1 and being spaced apart from the second portion RM_U in a first direction DR1, and light-emitting elements ED may be disposed on the first portions RM_L. The shapes of the electrodes RME1_1 and RME2_1 of the embodiment may be different from those of the embodiment of FIG. 3. Hereinafter, redundant descriptions will be omitted, and differences will be described.

The light-emitting elements ED may be aligned on the electrodes RME1_1 and RME2_1 by receiving a dielectrophoretic force by an electric field generated on the electrodes RME1_1 and RME2_1. In case that an alignment signal is applied to the electrodes RME1_1 and RME2_1, an electric field may be generated on the electrodes RME1_1 and RME2_1. As a distance between the electrodes RME1_1 and RME2_1 is decreased, a stronger electric field may be generated. The light-emitting elements ED may receive a great force by a strong electric field in a state of being dispersed in an ink, and most of the light-emitting elements ED may be disposed in an area in which the electric field is strong.

As shown in FIG. 9, the first electrode RME1_1 and the second electrode RME2_1 may include the first portion RM_L and the second portion RM_U which have a shape extending in the second direction DR2 and may further include the third portion RM_B which electrically connects the first portion RM_L and the second portion RM_U. The first portion RM_L may be disposed directly on a third interlayer insulating layer IL3 and may be disposed only in the emission area EMA. The second portions RM_U may be disposed on the first banks BNL1 to extend in the second direction DR2 beyond the emission area EMA, and contact holes CT1 and CT2 may be formed in portions of the second portions RM-U overlapping a second bank BNL2.

Since the first portion RM_L has the shape protruding from the second portion RM_U in the first direction DR1, a distance between the first portions RM_L among distances between the first electrode RME1_1 and the second electrode RME2_1 according to an embodiment, may be smaller than a distance between the second portions RM_U. In case that an alignment signal is applied to the first electrode RME1_1 and the second electrode RME2_1, a stronger electric field may be generated on the first portions RM_L, and most of the light-emitting elements ED may be disposed on the first portions RM_L. As described above, contact portions CTD and CTS, through which the contact electrodes CNE1 and CNE2 electrically contact the electrodes RME1_1 and RME2_1, may be spaced apart from the light-emitting element area EDA in the second direction DR2, and in case that the shapes of the electrodes RME1_1 and RME2_1 are designed such that the light-emitting elements ED are intensively disposed at a specific position, it is possible to readily distinguish the light-emitting element area EDA.

The first portion RM_L and the second portion RM_U may be electrically connected through the third portion RM_B, and a length of the third portion RM_B measured in the second direction DR2 may be smaller than that of the first portion RM_L. The first portions RM_L may include portions protruding from the third portions RM_B in the second direction DR2, and the contact portions CTD and CTS may be formed in the protruding portions. An alignment signal applied from the second portion RM_U of the electrodes RME1_1 and RME2_1 may be transmitted to the first portion RM_L through the third portion RM_B. In this case, an electric field with relatively strong intensity may be generated on a portion of the first portion RM_L electrically connected to the third portion RM_B, and the number of the light-emitting elements ED disposed on the portion of the first portion RM_L protruding from the third portion RM_B may be relatively small. In case that the light-emitting elements ED are not disposed on the protruding portion, a space for forming the contact portions CTD and CTS may be secured. The light-emitting elements ED may be disposed such that reference lines RL1 and RL2 traversing both end portions of the uppermost and lowermost light-emitting elements ED traverse the third portions RM_B, and the contact portions CTD and CTS disposed outside an area between the reference lines RL1 and RL2 may not overlap the third portions RM_B in the first direction DR1.

The contact electrodes CNE1 and CNE2 may be disposed on the first portions RM_L of the electrodes RME1_1 and RME2_1 as in the embodiment of FIG. 3. Since most of the light-emitting elements ED are disposed on the first portions RM_L and the contact portions CTD and CTS are also disposed on the first portions RM_L, each of the contact electrodes CNE1 and CNE2 may be disposed on the first portion RM_L to extend in the second direction DR2. In the embodiment, the electrodes RME1_1 and RME2_1 may be designed to have different shapes so that the light-emitting elements ED may be intensively disposed at a specific position, and there is an advantage at least in that it is easy to arrange the contact portions CTD and CTS at positions spaced apart from the light-emitting element area EDA in the second direction DR2.

In case that the contact portions CTD and CTS are spaced apart from an optical path of light emitted from the light-emitting element ED or are spaced apart from the light-emitting element area EDA in the second direction DR2, the contact portions CTD and CTS may not necessarily be formed on the first portions RM_L of the electrodes RME1 and RME2. In the display device 10, in case that portions of the contact electrodes CNE1 and CNE2 electrically contacting the light-emitting element ED are formed to have a minimum width and in case that the contact portions CTD and CTS are formed to avoid an optical path of light emitted from the light-emitting element ED, the positions of the contact portions CTD and CTS may be variously modified.

Figure 10:
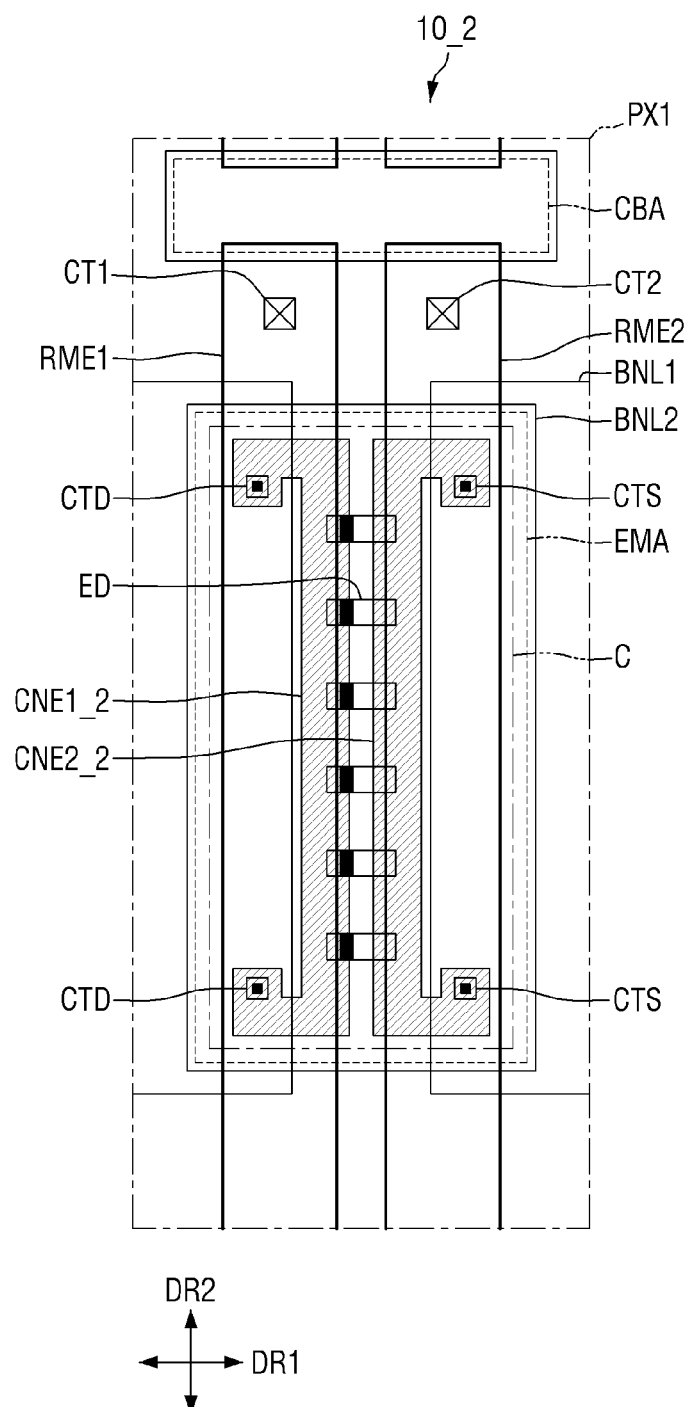
FIG. 10 is a schematic plan view illustrating a subpixel of a display device according to still another embodiment.
Figure 11:
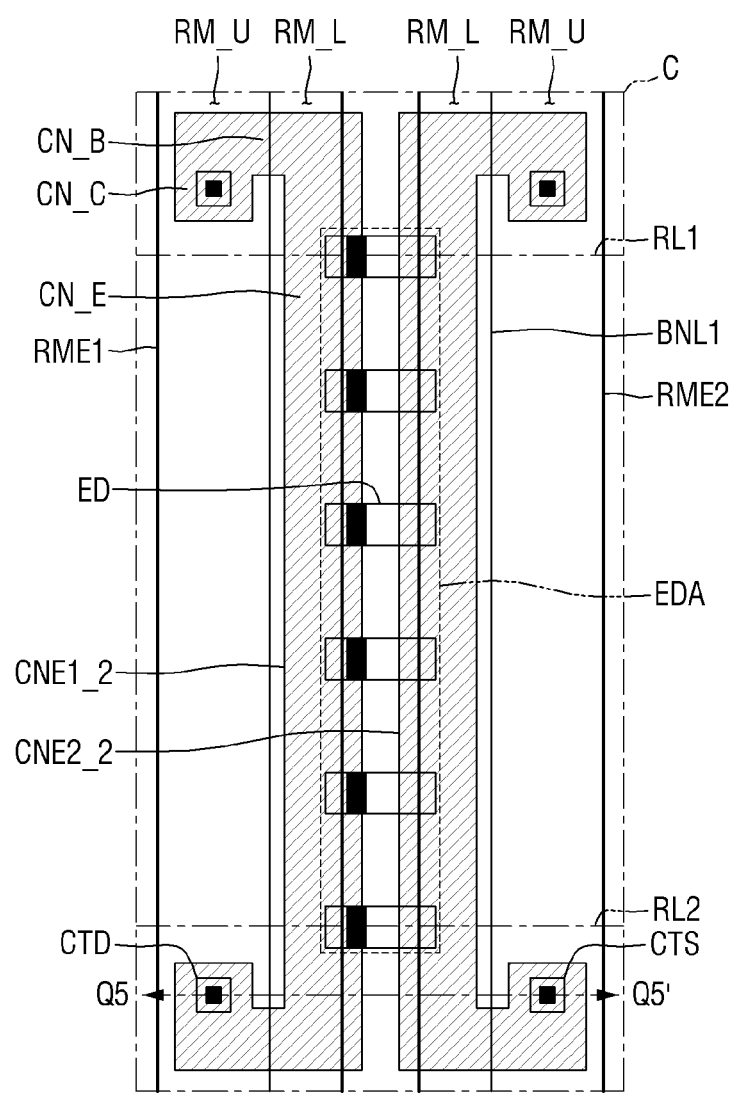
FIG. 11 is a schematic enlarged view of portion C of FIG. 10.
Figure 12:
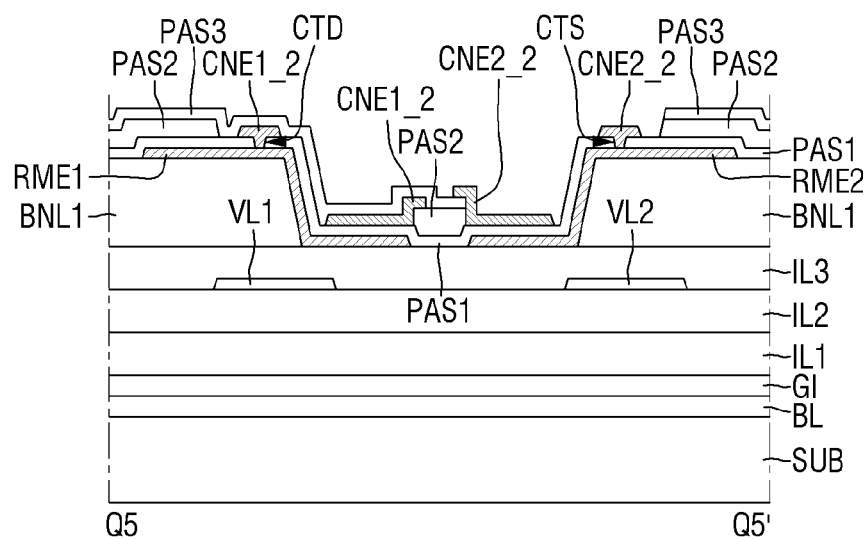
FIG. 12 is a schematic cross-sectional view taken along line Q5-Q5' of FIG. 11.

FIG. 10 is a schematic plan view illustrating a subpixel of a display device according to still another embodiment. FIG. 11 is a schematic enlarged view of portion C of FIG. 10. FIG. 12 is a schematic cross-sectional view taken along line Q5-Q5' of FIG. 11. FIG. 11 is a schematic enlarged view of a portion in which electrodes RME1 and RME2 and contact electrodes CNE1_2 and CNE2_2 are disposed, including a light-emitting element area EDA in a first subpixel PX1 of FIG. 10. FIG. 12 illustrates a cross section traversing contact portions CTD and CTS spaced apart from light-emitting elements ED.

Referring to FIGS. 10 to 12, according to an embodiment, a display device 10_2 may have a shape in which contact portions CTD and CTS are disposed on second portions RM_U of the electrodes RME1 and RME2 and the contact electrodes CNE1_2 and CNE2_2 are disposed over first portions RM_L and the second portions RM_U. The contact electrodes CNE1_2 and CNE2_2 may include a contact electrode extension part CN_E disposed on the first portion RM_L and electrically contacting the light-emitting elements ED, contact electrode contact parts CN_C disposed on the second portion RM_U and electrically contacting the electrode RME1 or RME2 through the contact portion CTD or CTS, and contact electrode connection parts CN_B electrically connecting the contact electrode extension part CN_E and the contact electrode contact part CN_C. The shapes of the contact electrodes CNE1_2 and CNE2_2 of the embodiment may be different from those of the embodiment of FIG. 3. Hereinafter, redundant descriptions will be omitted, and the shapes of the contact electrodes CNE1_2 and CNE2_2 will be described in detail.

The contact portions CTD and CTS may be disposed on the second portions RM_U of the electrodes RME1 and RME2 and may be disposed at positions spaced apart from a light-emitting element area EDA in a second direction DR2. As described above, the contact portions CTD and CTS may be disposed outside an area between reference lines RL1 and RL2 traversing both end portions of the uppermost and lowermost light-emitting elements ED among the light-emitting elements ED and may be spaced apart from the reference lines RL1 and RL2 in the second direction DR2. In case that the light-emitting elements ED are randomly arranged on the first portions RM_L of the electrodes RME1 and RME2, a sufficient space for forming the contact portions CTD and CTS may not be secured. In this case, the contact portions CTD and CTS may be disposed on the second portions RM_U of the electrodes RME1 and RME2, and the shapes of the contact electrodes CNE1_2 and CNE2_2 to be described below may be differently designed to electrically connect the light-emitting elements ED and the electrodes RME1 and RME2.

The contact electrode extension parts CN_E of the contact electrodes CNE1_2 and CNE2_2 may be disposed on the first portions RM_L and extend in the second direction DR2.

The contact electrode extension part CN_E and the contact electrodes CNE1 and CNE2 of FIG. 3 may have substantially the same shape.

The contact electrode contact parts CN_C may be disposed on the second portions RM_U of the electrodes RME1 and RME2. The contact electrode contact parts CN_C may be disposed to be spaced apart from the contact electrode extension parts CN_E in a first direction DR1 and may be disposed to cover or overlap the contact portions CTD and CTS. The contact electrode contact parts CN_C of the contact electrodes CNE1_2 and CNE2_2 may electrically contact the electrodes RME1 and RME2 through the contact portions CTD and CTS. The contact electrode contact part CN_C may also be disposed so as to avoid an optical path of light emitted from the light-emitting element ED. For example, the contact electrode contact parts CN_C may be disposed to overlap the contact portions CTD and CTS and may be disposed to be spaced apart from the reference lines RL1 and RL2, which traverse both end portions of the uppermost and lowermost light-emitting elements ED, in the second direction DR2.

The contact electrode connection part CN_B may be disposed to electrically connect the contact electrode extension part CN_E and the contact electrode contact part CN_C. The contact electrode connection parts CN_B may be disposed at both sides of the contact electrode extension part CN_E in the second direction DR2 and may extend in the first direction DR1 to be electrically connected to the contact electrode contact part CN_C. The contact electrode connection parts CN_B may also avoid the optical path of light emitted from the light-emitting element ED and may be disposed to be spaced apart from the reference lines RL1 and RL2, which traverse both end portions of the uppermost and lowermost light-emitting elements ED, in the second direction DR2.

The contact electrodes CNE1_2 and CNE2_2 may be disposed on the first portions RM_L, on which the light-emitting elements ED are disposed, to extend in the second direction DR2, and may have shapes that make a detour to avoid an optical path of light emitted from the light-emitting element ED and are disposed on the second portions RM_U of the electrodes RME1 and RME2. In the contact electrodes CNE1_2 and CNE2_2, the contact electrode extension parts CN_E may be disposed between the reference lines RL1 and RL2 to have a minimum width, and the contact electrode connection parts CN_B and the contact electrode contact parts CN_C may be disposed to be spaced apart from the reference lines RL1 and RL2 in the second direction DR2 so as to be disposed on the contact portions CTD and CTS. In the embodiment, since the contact portions CTD and CTS are disposed on the second portions RM_U, there is an advantage in that it is easy to secure a space for forming the contact portions CTD and CTS. Depending on the shape of the contact portions CTD and CTS, the shapes of the contact electrodes CNE1_2 and CNE2_2 may be differently designed, and the contact electrodes CNE1_2 and CNE2_2 may electrically connect the light-emitting elements ED and the electrodes RME1 and RME2 within a range capable of improving the luminous efficiency of the light emitted from the light-emitting element ED.

With respect to the above-described embodiments, only a first electrode RME1 and only a second electrode RME2 are illustrated as being included in each subpixel PXn, but the disclosure is not limited thereto. The display device 10 may include more electrodes RME1 and RME2 and more light-emitting elements ED for each subpixel PXn.

Figure 13:
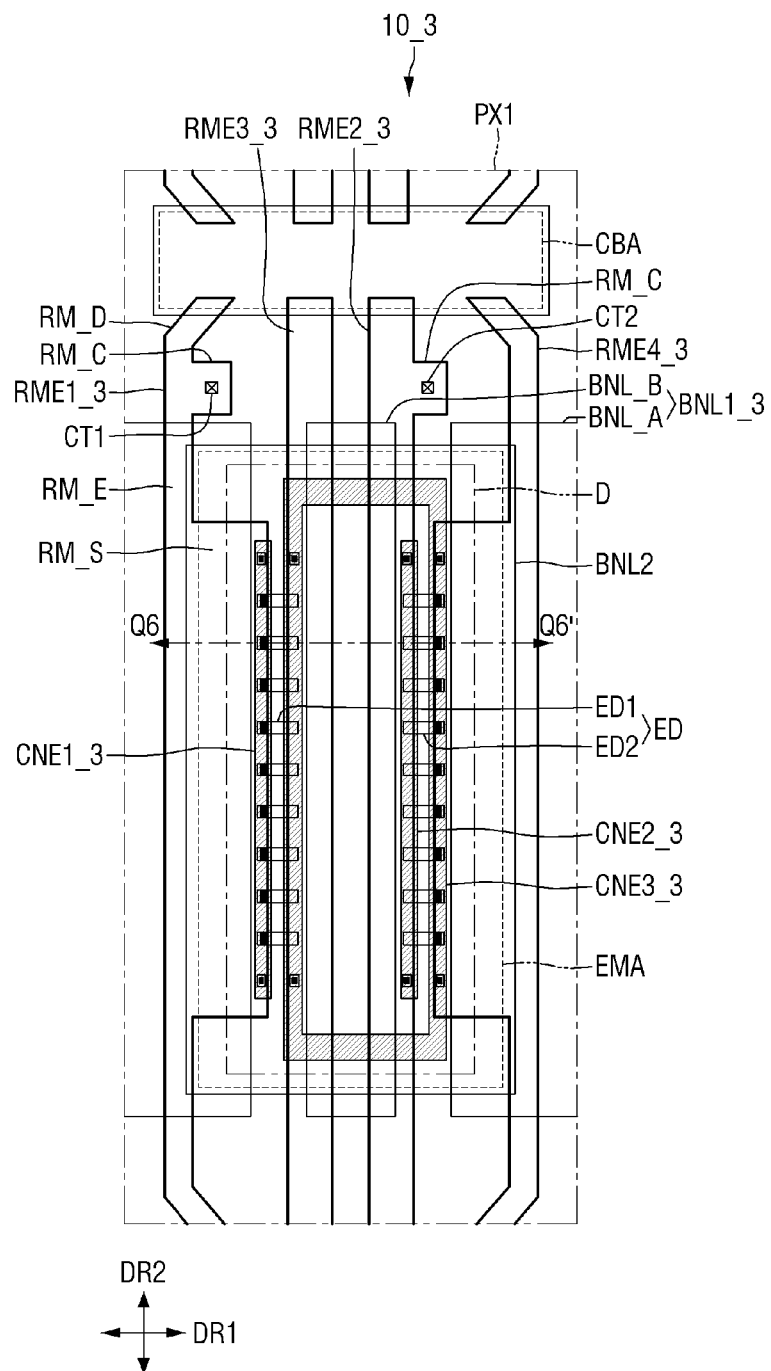
FIG. 13 is a schematic plan view illustrating one subpixel of a display device according to yet another embodiment.
Figure 14:
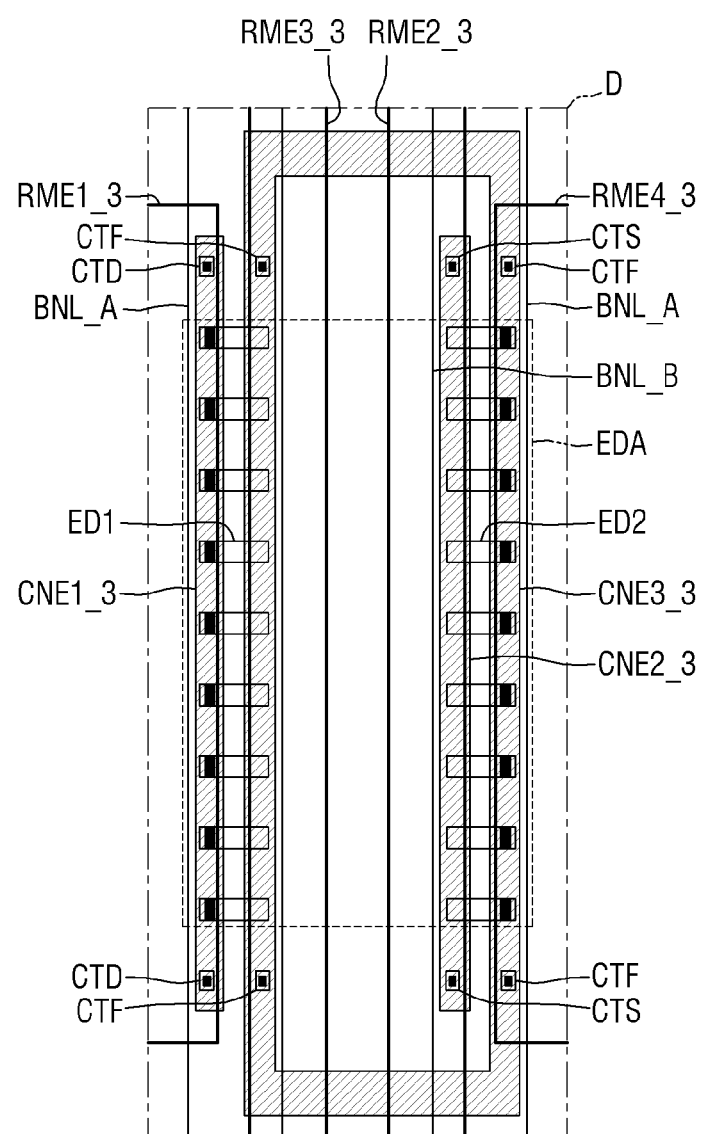
FIG. 14 is a schematic enlarged view of portion D of FIG. 13.
Figure 15:
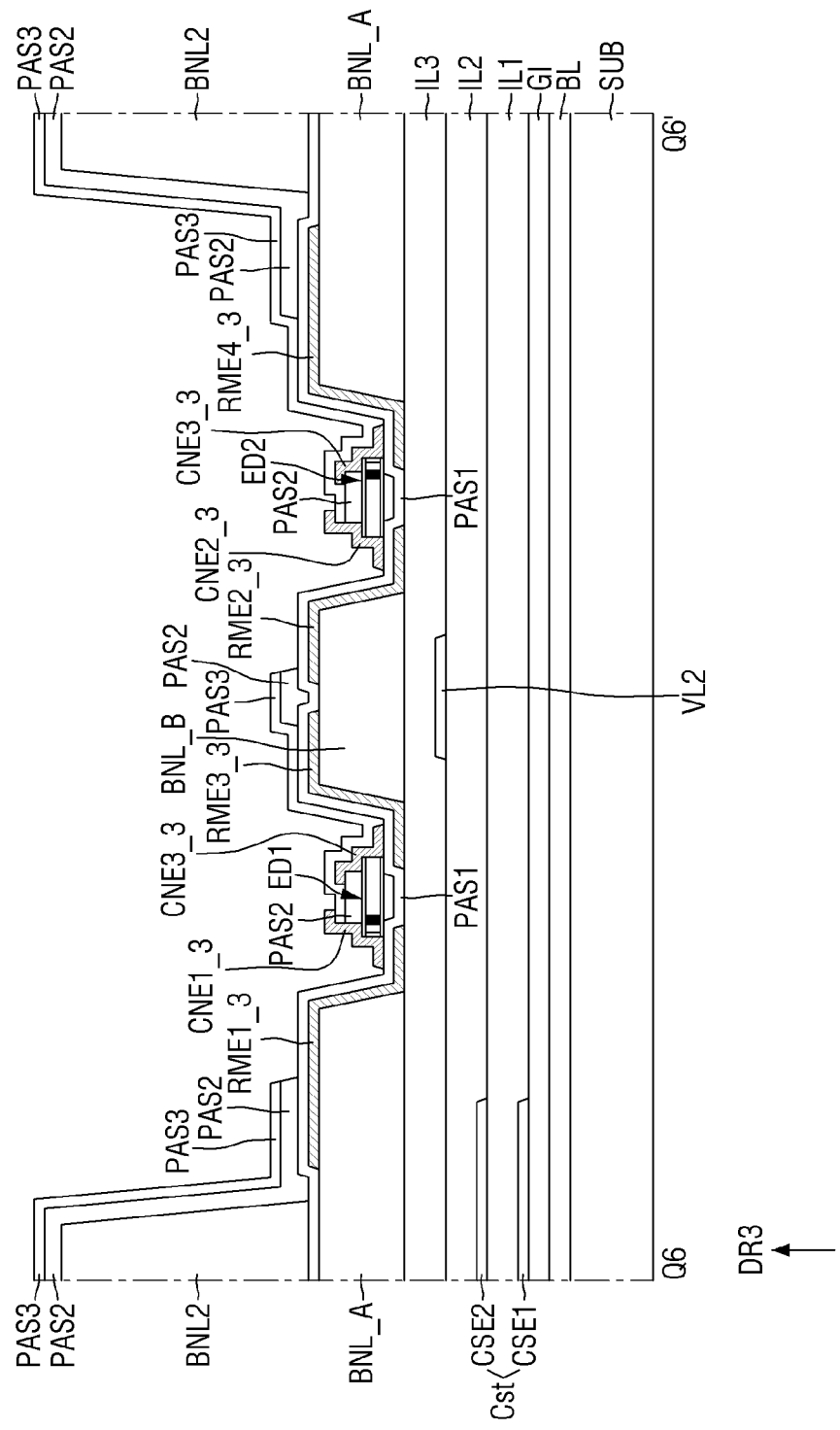
FIG. 15 is a schematic cross-sectional view taken along line Q6-Q6' of FIG. 13.

FIG. 13 is a schematic plan view illustrating a subpixel of a display device according to yet another embodiment. FIG. 14 is a schematic enlarged view of portion D of FIG. 13. FIG. 15 is a schematic cross-sectional view taken along line Q6-Q6' of FIG. 13. FIG. 14 is a schematic enlarged view of a portion in which electrodes RME1_3, RME2_3, RME3_3, and RME4_3 and contact electrodes CNE1_3, CNE2_3, and CNE3_3 are disposed, including a light-emitting element area EDA in a first subpixel PX1 of FIG. 13. FIG. 15 illustrates a cross section traversing both end portions of a first light-emitting element ED1 and a second light-emitting element ED2.

Referring to FIGS. 13 to 15, a display device 10_3 according to an embodiment may include more electrodes RME1_3, RME2_3, RME3_3, and RME4_3, more light-emitting elements ED1 and ED2, and more contact electrodes CNE1_3, CNE2_3, and CNE3_3 for each subpixel PXn. The display device 10_3 may further include a third electrode RME3_3 and a fourth electrode RME4_3 in addition to a first electrode RME1_3 and a second electrode RME2_3 disposed in each subpixel PXn and may include the first light-emitting elements ED1 disposed between the first electrode RME1_3 and the third electrode RME3_3 and the second light-emitting elements ED2 disposed between the second electrode RME2_3 and the fourth electrode RME4_3. Each subpixel PXn may include more light-emitting elements ED1 and ED2 so that luminance per unit area may be improved. Unlike the first electrode RME1_3 and the second electrode RME2_3, the third electrode RME3_3 and the fourth electrode RME4_3 may not be connected directly to a third conductive layer, and the first light-emitting element ED1 and the second light-emitting element ED2 may be electrically connected to each other in series through a third contact electrode CNE3_3. Hereinafter, differences from the embodiment of FIGS. 2 to 5 will be mainly described.

A first bank BNL1_3 may include first sub-banks BNL_A disposed over adjacent subpixels PXn and a second sub-bank BNL_B disposed between the first sub-banks BNL_A. The second sub-bank BNL_B extending in a second direction DR2 may be disposed at a central portion of an emission area EMA, and the first sub-banks BNL_A may be disposed at both sides of the second sub-bank BNL_B in a first direction DR1. The first bank BNL1_3 of the embodiment may be different from the first bank BNL1 of FIG. 3 at least in that the first bank BNL1_3 includes the first sub-bank BNL_A disposed in substantially the same pattern as the first bank BNL1 and the second sub-bank BNL_B disposed between the first sub-banks BNL_A spaced apart from each other in the first direction DR1.

The first electrode RME1_3 and the fourth electrode RME4_3 may be disposed on different first sub-banks BNL_A and extend in the second direction DR2. Based on a center of the emission area EMA, the first electrode RME1_3 may be disposed on the first sub-bank BNL_A at a left side, and the fourth electrode RME4_3 may be disposed on the first sub-bank BNL_A at a right side. The first electrode RME1_3 and the fourth electrode RME4_3 may have a partially bent shape. The first electrode RME1_3 and the fourth electrode RME4_3 may include an electrode expansion part RM_S that extends in the second direction DR2 and has a width greater than that of other parts thereof, electrode bent parts RM_D that extend in directions inclined from the first direction DR1 and the second direction DR2, and electrode extension parts RM_E that electrically connect the electrode bent parts RM_D and the electrode expansion part RM_S. The first electrode RME1_3 may have an overall shape extending in the second direction DR2 and may have a shape that has a partially greater width or is bent in the direction inclined with respect to the second direction DR2. The fourth electrode RME4_3 may have a symmetrical structure with respect to the first electrode RME1_3, excluding an electrode contact part RM_C, based on the center of the emission area EMA, and the first electrode RME1_3 and the fourth electrode RME4_3 may be disposed to be spaced apart from each other in the first direction DR1. The second electrode RME2_3 and the third electrode RME3_3 may be disposed between the first electrode RME1_3 and the fourth electrode RME4_3.

The electrode expansion part RM_S of the first electrode RME1_3 may have the width greater than that of other parts thereof. The electrode expansion parts RM_S may be disposed on the first sub-banks BNL_A in the emission area EMA of the subpixel PXn to extend in the second direction DR2 and may be spaced apart from the second electrode RME2_3 or the third electrode RME3_3. The first electrode RME1_3 may include the electrode expansion part RM_S to be disposed closer to the third electrode RME3_3 than to other parts, and the fourth electrode RME4_3 may include the electrode expansion part RM_S to be disposed closer to the second electrode RME2_3 than to other parts. The light-emitting elements ED may be disposed on the electrode expansion parts RM_S of the first electrode RME1_3 and the fourth electrode RME4_3 and on the third electrode RME3_3 or the second electrode RME2_3.

The electrode extension parts RM_E may be electrically connected to both sides of each of the electrode expansion parts RM_S in the second direction DR2. The electrode extension parts RM_E may be electrically connected to the electrode expansion part RM_S and may be disposed over the emission area EMA of each subpixel PXn and a second bank BNL2. The electrode extension part RM_E may have a width smaller than that of the electrode expansion part RM_S. A side of each of the electrode extension parts RM_E extending in the second direction DR2 may be electrically connected to and collinear with a side of the electrode expansion part RM_S extending in the second direction DR2. For example, among both sides of the electrode expansion part RM_S and the electrode extension part RM_E, sides thereof positioned outward of on the center of the emission area EMA may extend to be electrically connect to each other.

The electrode contact part RM_C having a relatively wide width may be formed in the electrode extension part RM_E disposed at an upper side of the emission area EMA. The electrode contact part RM_C may overlap the second bank BNL2, and thus a first contact hole CT1 may be formed therein. However, the electrode contact part RM_C may be formed only in the first electrode RME1_3 and may not be formed in the fourth electrode RME4_3. The fourth electrode RME4_3 may not be electrically connected directly to the third conductive layer, and an electrical signal may be transmitted through the third contact electrode CNE3_3 to be described below.

The electrode bent parts RM_D may be electrically connected to the electrode extension parts RM_E. The electrode bent part RM_D may be electrically connected to the electrode extension part RM_E at the upper side of the emission area EMA and disposed over the second bank BNL2 and a cutout area CBA, or may be disposed at a lower side of the emission area EMA and disposed at a boundary with an adjacent subpixel PXn in the second direction DR2. The electrode bent parts RM_D may be bent in a direction inclined from the second direction DR2, for example, a direction toward a center of the subpixel PXn.

The second electrode RME2_3 and the third electrode RME3_3 may have a shape similar to that of the embodiment of FIG. 3 and may be disposed between the first electrode RME1_3 and the fourth electrode RME4_3. The second electrode RME2_3 and the third electrode RME3_3 may be disposed at both sides of the second sub-bank BNL_B in the first direction DR1 and may be spaced apart from each other. The second electrode RME2_3 may be spaced apart from the fourth electrode RME4_3 in the first direction DR1 and disposed at a right side of the second sub-bank BNL_B, and the third electrode RME3_3 may be spaced apart from the first electrode RME1_3 in the first direction DR1 and disposed at a left side of the second sub-bank BNL_B. An electrode contact part RM_C may be formed in a portion of the second electrode RME2_3 overlapping the second bank BNL2. The electrode contact part RM_C may be electrically connected to a second voltage line VL2 through a second contact hole CT2. In contrast, the third electrode RME3_3 may not be electrically connected directly to the third conductive layer, and similar to the fourth electrode RME4_3, an electrical signal may be transmitted through the third contact electrode CNE3_3.

Although not shown in the drawing, each of the electrodes RME1_3, RME2_3, RME3_3, and RME4_3 may include a first portion RM_L (see FIG. 5) and a second portion RM_U (see FIG. 5) as in the embodiment of FIG. 3. In the first electrode RME1_3 and the fourth electrode RME4_3, a portion of the electrode expansion part RM_S thereof may be the first portion RM_L, and other parts thereof may be the second portion RM_U. Each of the second portions RM_U of the first electrode RME1_3 and the fourth electrode RME4_3 may be disposed on the first sub-bank BNL_A. The second electrode RME2_3 and the third electrode RME3_3 may include the second portions RM_U disposed on the second sub-banks BNL_B and the first portions RM_L disposed to be spaced apart from and may face the first electrode RME1_3 and the fourth electrode RME4_3.

The first light-emitting elements ED1 may be disposed on the first electrode RME1_3 and the third electrode RME3_3, and the second light-emitting elements ED2 may be disposed on the second electrode RME2_3 and the fourth electrode RME4_3. The light-emitting elements ED1 and ED2 may have orientation directions that are directions in which first end portions thereof, at which a first semiconductor layer 31 is disposed, face, and since the subpixel PXn of the display device 10_3 includes more electrodes, the direction in which the first end portion of the first light-emitting element ED1 faces may be opposite to the direction in which the first end portion of the second light-emitting element ED2 faces. For example, the first end portion of the first light-emitting element ED1 may be disposed on the third electrode RME3_3, and a second end portion opposite to the first end portion may be disposed on the first electrode RME1_3. Therefore, the first light-emitting elements ED1 may be disposed such that the first end portion thereof faces a side of the first direction DR1. In contrast, the first end portion of the second light-emitting element ED2 may be disposed on the second electrode RME2_3, and a second end portion opposite to the first end portion may be disposed on the fourth electrode RME4_3. Therefore, the second light-emitting element ED2 may be disposed such that the first end portion thereof faces the other side of the first direction DR1. The first light-emitting element ED1 and the second light-emitting element ED2, of which the orientation directions are opposite to each other, may be electrically connected to each other in series through the third contact electrode CNE3_3 to be described below.

A first contact electrode CNE1_3 may be disposed on the first electrode RME1_3 and electrically contact the second end portion that is an end portion of the first light-emitting element ED1. A second contact electrode CNE2_3 may be disposed on the second electrode RME2_3 and electrically contact the first end portion that is an end portion of the second light-emitting element ED2. The first contact electrode CNE1_3 and the second contact electrode CNE2_3 may electrically contact the first electrode RME1_3 and the second electrode RME2_3, respectively. Power voltages for driving the light-emitting elements ED1 and ED2 may be transmitted to the first contact electrode CNE1_3 and the second contact electrode CNE2_3 through a first transistor T1 and the second voltage line VL2.

The third contact electrode CNE3_3 may be disposed on the third electrode RME3_3 and the fourth electrode RME4_3. The third contact electrode CNE3_3 may include contact electrode extension parts that extend in the second direction DR2 and are disposed on the third electrode RME3_3 and the fourth electrode RME4_3 and contact electrode connection parts that electrically connect the contact electrode extension parts. The contact electrode extension parts of the third contact electrode CNE3_3 may be disposed on the third electrode RME3_3 and the fourth electrode RME4_3 to extend in the second direction DR2, and the contact electrode connection parts of the third contact electrode CNE3_3 may extend in the first direction DR1 to electrically connect the electrode extension parts. The third contact electrode CNE3_3 may be disposed in a shape surrounding the second contact electrode CNE2_3 in a plan view.

The contact electrode extension parts of the third contact electrode CNE3_3 may electrically contact the third electrode RME3_3 or the fourth electrode RME4_3 and end portions of the light-emitting elements ED1 and ED2. For example, the contact electrode extension part of the third contact electrode CNE3_3 disposed on the third electrode RME3_3 may electrically contact the third electrode RME3_3 and the first end portion of the first light-emitting element ED1, and the contact electrode extension part of the third contact electrode CNE3_3 disposed on the fourth electrode RME4_3 may electrically contact the fourth electrode RME4_3 and the second end portion of the second light-emitting element ED2.

The first contact electrode CNE1_3 and the second contact electrode CNE2_3 may be disposed on the first portions RM_L of the first electrode RME1_3 and the second electrode RME2_3, respectively, and a first contact portion CTD and a second contact portion CTS may be disposed on the first portions RM_L, respectively. The first contact electrode CNE1_3 and the second contact electrode CNE2_3 may be disposed on the first portions RM_L to extend in the second direction DR2, and the first contact portion CTD and the second contact portion CTS may be disposed to be spaced apart from the light-emitting element area EDA in the second direction DR2.

The contact electrode extension parts of the third contact electrode CNE3_3 may be disposed on the first portions RM_L of the third electrode RME3_3 and the fourth electrode RME4_3 to extend in the second direction DR2 and may electrically contact end portions of the light-emitting elements ED1 and ED2. The third contact electrode CNE3_3 may electrically contact the first portions RM_L through third contact portions CTF disposed on the first portions RM_L of the third electrode RME3_3 and the fourth electrode RME4_3. The third contact portions CTF may be spaced apart from the light-emitting element area EDA in the second direction DR2 and disposed on the first portions RM_L. However, the third contact electrode CNE3_3 may further include the contact electrode connection parts electrically connecting the contact electrode extension parts, and the contact electrode connection part may be disposed on the second portion RM_U of the third electrode RME3_3. Accordingly, the third contact portion CTF may be disposed on the second portion RM_U of the third electrode RME3_3. Even in case that the number of electrodes RME1_3, RME2_3, RME3_3, and RME4_3 disposed for each subpixel PXn of the display device 10_3 is increased, the arrangement of the contact electrodes CNE1_3, CNE2_3, and CNE3_3 and the arrangement of the contact portions CTD, CTS, and CTF may be designed as shown in the drawing, thereby improving the luminous efficiency of light emitted from the light-emitting element ED.

In an embodiment, in the display device 10_3, the third contact electrode CNE3_3 may be disposed on a different layer from the first contact electrode CNE1_3 and the second contact electrode CNE2_3 in a cross-sectional view. For example, the third contact electrode CNE3_3 may be disposed on a second insulating layer PAS2, and the first contact electrode CNE1_3 and the second contact electrode CNE2_3 may be disposed on a third insulating layer PAS3. However, the disclosure is not limited thereto, and the arrangement order of the contact electrodes CNE1_3, CNE2_3, and CNE3_3 may vary based on the third insulating layer PAS3.

Power voltages may be applied to the first light-emitting element ED1 and the second light-emitting element ED2 through the first contact electrode CNE1_3 and the second contact electrode CNE2_3, respectively. The power voltages may be applied through the light-emitting elements ED1 and ED2 and may be applied between the first light-emitting element ED1 and the second light-emitting element ED2 through the third contact electrode CNE3_3. The third contact electrode CNE3_3 may form a connection path between the first light-emitting element ED1 and the second light-emitting element ED2, and the first light-emitting element ED1 and the second light-emitting element ED2 may be electrically connected in series through the third contact electrode CNE3_3. Since the third contact electrode CNE3_3 electrically contacts the third electrode RME3_3 and the fourth electrode RME4_3, even in case that the third electrode RME3_3 and the fourth electrode RME4_3 are not connected directly to a circuit layer thereunder, the third electrode RME3_3 and the fourth electrode RME4_3 do not remain in a floating state and may be electrically connected to the circuit layer in case that the power voltage is applied thereto.

In the display device 10, some electrodes may be separated in each subpixel PXn to electrically connect more light-emitting elements ED in series. Accordingly, each subpixel PXn may further include separated electrodes and separated contact electrodes to have a novel pixel electrode structure.

Figure 16:
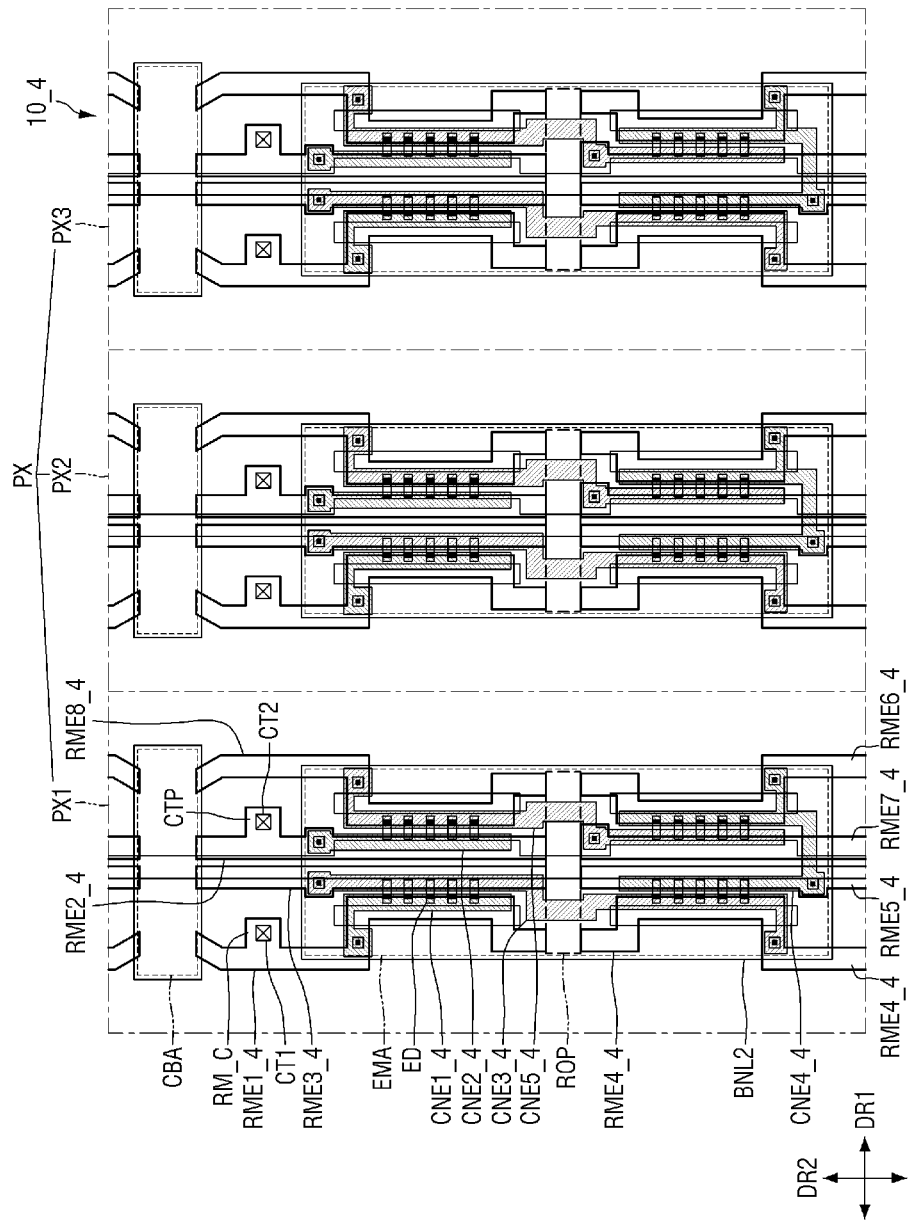
FIG. 16 is a schematic plan view illustrating a pixel of a display device according to yet another embodiment.
Figure 17:
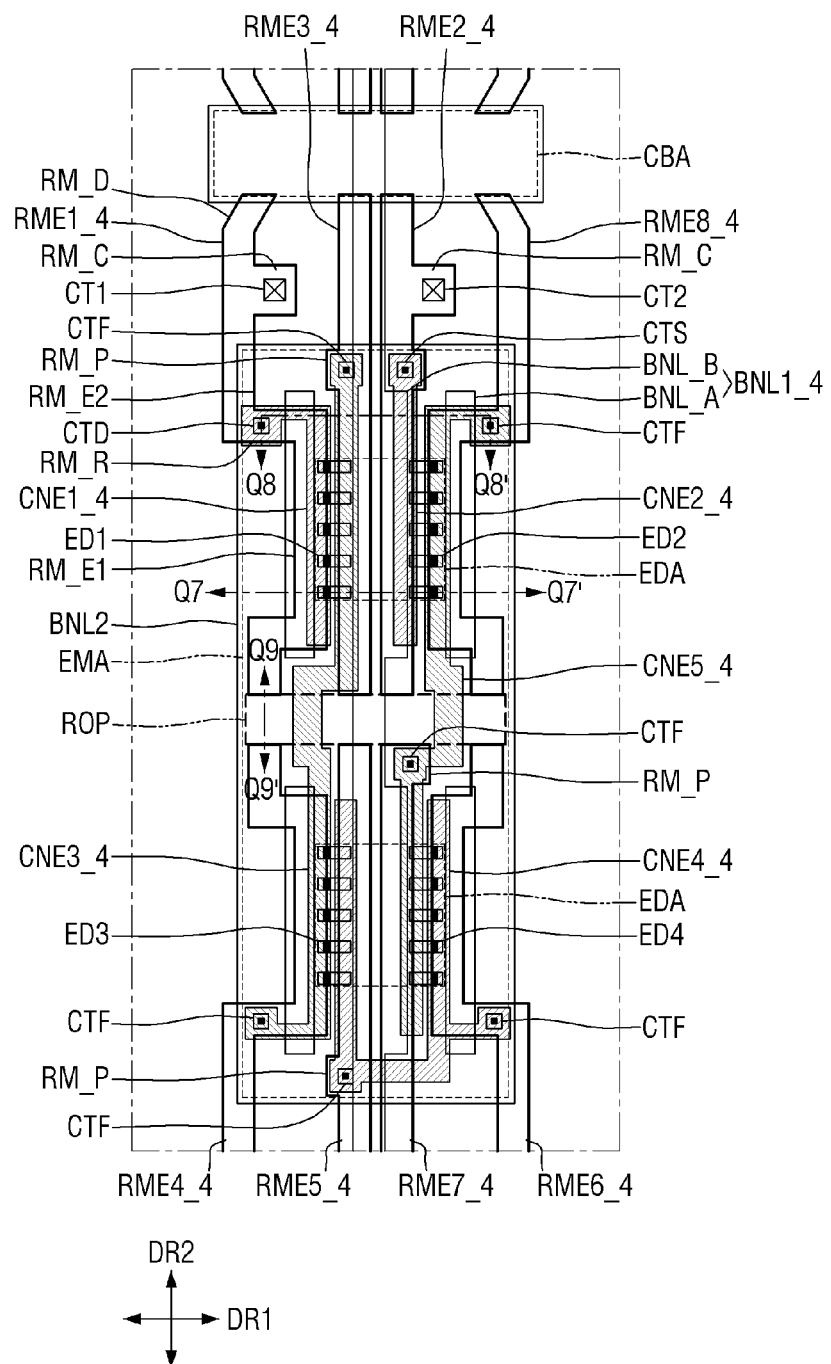
FIG. 17 is a schematic plan view illustrating a first subpixel of FIG. 16.
Figure 18:
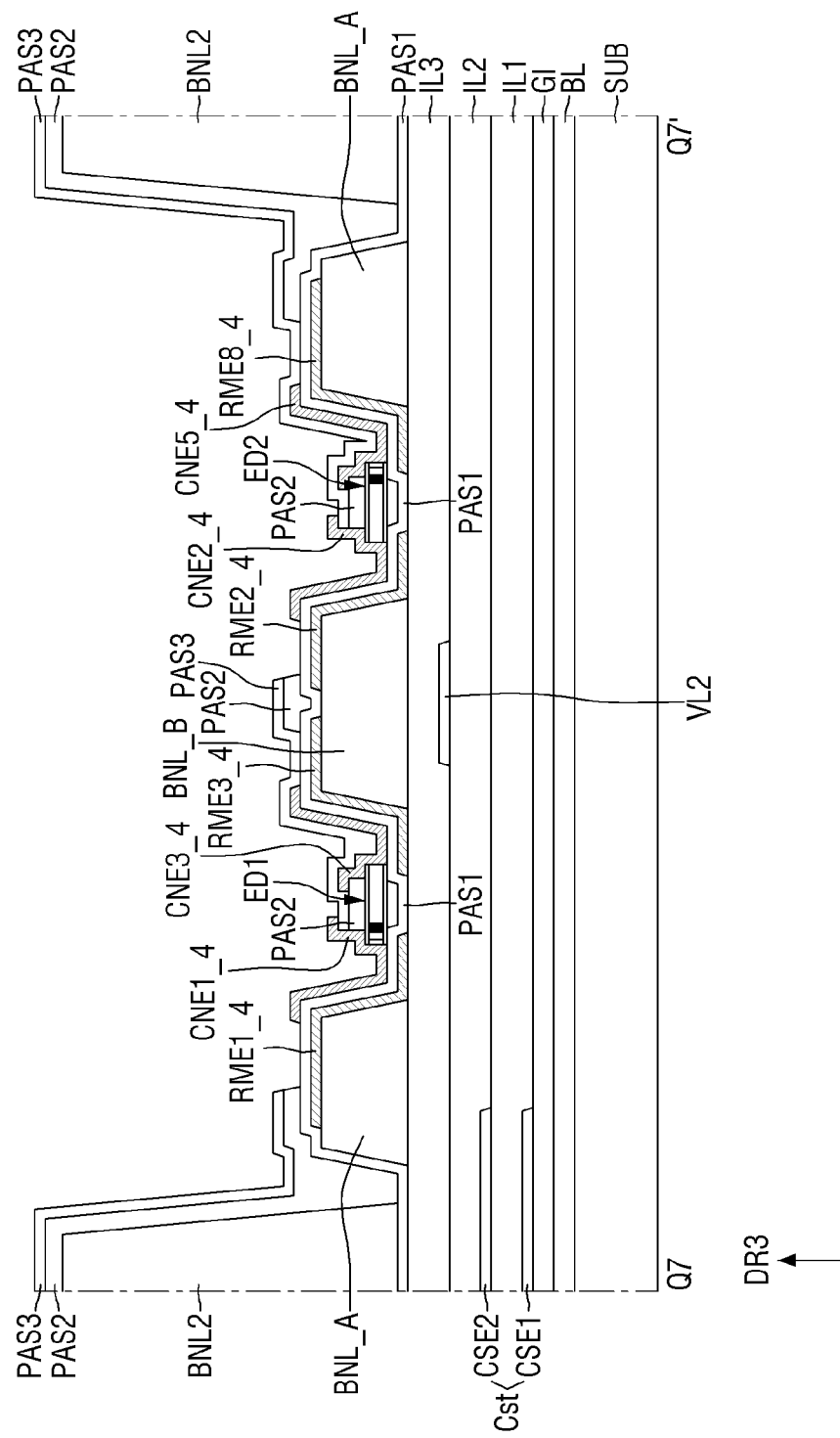
FIG. 18 is a schematic cross-sectional view taken along line Q7-Q7' of FIG. 17.
Figure 19:
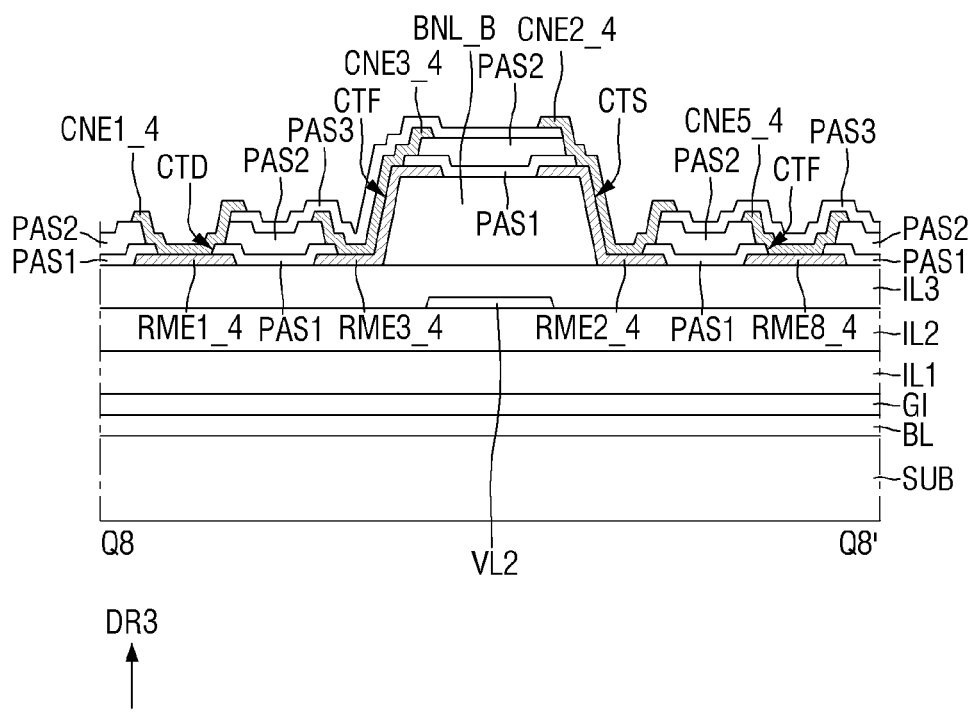
FIG. 19 is a schematic cross-sectional view taken along line Q8-Q8' of FIG. 17.
Figure 20:
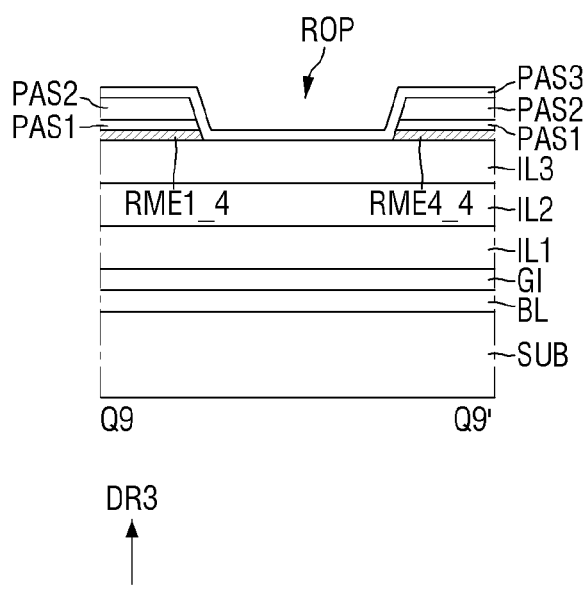
FIG. 20 is a schematic cross-sectional view taken along line Q9-Q9' of FIG. 17.

FIG. 16 is a schematic plan view illustrating a pixel of a display device according to yet another embodiment. FIG. 17 is a schematic plan view illustrating a first subpixel of FIG. 16. FIG. 18 is a schematic cross-sectional view taken along line Q7-Q7' of FIG. 17. FIG. 19 is a schematic cross-sectional view taken along line Q8-Q8' of FIG. 17. FIG. 20 is a schematic cross-sectional view taken along line Q9-Q9' of FIG. 17. FIG. 18 illustrates a cross section traversing both end portions of a first light-emitting element ED1 and a second light-emitting element ED2 of FIG. 17. FIG. 19 illustrates a cross section traversing a first contact portion CTD, a second contact portion CTS, and a third contact portion CTF, and FIG. 20 illustrates a cross section traversing a first electrode RME1_4 and a fourth electrode RME4_4 spaced apart from each other in a second direction DR2.

Referring to FIGS. 16 to 20, a display device 10_4 may include electrodes RME1_4, RME2_4, RME3_4, RME4_4, RME5_4, RME6_4, RME7_4, and RME8_4 which are disposed for each subpixel PXn and are spaced apart from each other in a first direction DR1 and the second direction DR2. Light-emitting elements ED1, ED2, ED3, and ED4 (collectively referred to as light-emitting elements ED) may be disposed on the electrodes spaced apart from each other in the first direction DR1, and contact electrodes CNE1_4, CNE2_4, CNE3_4, CNE4_4, and CNE5_4 may be disposed on the electrodes. The embodiment is the display device 10_4 having a novel electrode structure, and the electrodes and contact electrodes as well as the structure and arrangement of a first bank BNL1_4 are different from those of the embodiments of FIGS. 3 and 13. However, the embodiment is the same as the above-described embodiments at least in that the contact portions CTD, CTS, and CTF, through which the contact electrodes and the electrodes electrically contact each other, avoid an optical path and are spaced apart from a light-emitting element areas EDA in the second direction DR2. Hereinafter, the novel structures of the electrodes and contact electrodes will be described in detail.

The first bank BNL1_4 may include first sub-banks BNL_A and a second sub-bank BNL_B. The first sub-banks BNL_A may have a shape extending in the second direction DR2 and may be disposed in an emission area EMA. Unlike other embodiments, the first sub-bank BNL_A may be disposed so as not to cross a boundary with another adjacent subpixel PXn in the first direction DR1 and may not overlap a second bank BNL2 in a thickness direction thereof. Four first sub-banks BNL_A may be disposed in each subpixel PXn. The first sub-banks BNL_A may be disposed to be spaced apart from each other in the first direction DR1 and the second direction DR2 and may be disposed in four areas that are divided based on lines crossing a center of the emission area EMA in the first direction DR1 and the second direction DR2.

The second sub-bank BNL_B may extend in the second direction DR2 and may be disposed beyond the emission area EMA. The second sub-bank BNL_B may also be disposed in a cutout area CBA and may be disposed beyond a boundary with an adjacent subpixel PXn in the second direction DR2. However, the disclosure is not limited thereto, and the second sub-bank BNL_B may be disposed only in the corresponding subpixel PXn so as to not be disposed in the cutout area CBA. The second sub-bank BNL_B may be disposed at a central portion of the emission area EMA and may be disposed between the first sub-banks BNL_A spaced apart from each other in the first direction DR1. A portion of the second sub-bank BNL_B spaced apart from the first sub-bank BNL_A in the first direction DR1 may have a wider width. Electrodes may be disposed on the portion of the second sub-bank BNL_B having a wide width. The first sub-banks BNL_A and the second sub-bank BNL_B may be spaced apart from and face each other, and the light-emitting elements ED may be disposed therebetween.

The electrodes may include a first electrode RME1_4 and a second electrode RME2_4 as a pair of first type electrodes and third to eighth electrodes RME3_4, RME4_4, RME5_4, RME6_4, RME7_4, and RME8_4 as six second type electrodes. The first type electrode may be an electrode that is electrically connected directly to a third conductive layer thereunder through contact holes CT1 and CT2, and the second type electrode may be an electrode that is not electrically connected directly to the third conductive layer. The first type electrode may be electrically connected to a first conductive pattern CDP or a second voltage line VL2 through an electrode contact part RM_C formed in a portion of the first type electrode overlapping the second bank BNL2, but the second type electrode may be an electrode in which the electrode contact part RM_C is not formed. The second type electrode may electrically contact a second type contact electrode described below and thus may receive an electrical signal applied to the first type electrode to not remain in a floating state.

Similarly, the contact electrodes may include a first contact electrode CNE1_4 and a second contact electrode CNE2_4 as a pair of first type contact electrodes and a third contact electrode CNE3_4, a fourth contact electrode CNE4_4, and a fifth contact electrode CNE5_4 as three second type contact electrodes. The first type contact electrode may be disposed on the first type electrode and electrically contact the first type electrode through the first contact portion CTD or the second contact portion CTS, and the second type contact electrode may be disposed on the second type electrode and electrically contact the second type electrode through the third contact portion CTF. The light-emitting elements ED may include the first light-emitting element ED1 and the second light-emitting element ED2 in which an end portion thereof is disposed on the first type electrode and another end portion thereof is disposed on the second type electrode, and may include a third light-emitting element ED3 and a fourth light-emitting element ED4 in which both end portions thereof are disposed on the second type electrodes.

Similar to the embodiment of FIG. 13, the first electrode RME1_4, the fourth electrode RME4_4, the sixth electrode RME6_4, and the eighth electrode RME8_4 may have a shape including electrode extension parts RM_E1 and RM_E2 and an electrode bent part RM_D. However, unlike the embodiment of FIG. 13, the first electrode RME1_4, the fourth electrode RME4_4, the sixth electrode RME6_4, and the eighth electrode RME8_4 may have a shape that does not include an electrode expansion part RM_S, includes the electrode extension parts RM_E1 and RM_E2 having a uniform width, and includes an electrode connection part RM_R electrically connecting the electrode extension parts RM_E1 and RM_E2. For example, the first electrode RME1_4 may include a first electrode extension part RM_E1, a second electrode extension part RM_E2, and the electrode connection part RM_R electrically connecting the first electrode extension part RM_E1 and the second electrode extension part RM_E2. The first electrode extension part RM_E1 may be spaced apart from and face another electrode in the first direction DR1, and the light-emitting element ED may be disposed thereon. The second electrode extension part RM_E2 may extend in the second direction DR2 in a direction not aligned with the first electrode extension part RM_E1 and may be disposed over the emission area EMA and the second bank BNL2. The fourth electrode RME4_4 may have a symmetrical structure with respect to the first electrode RME1_4 based on an imaginary line intersecting a center of the emission area EMA in the first direction DR1, and the eighth electrode RME8_4 and the sixth electrode RME6_4 may respectively have symmetrical structures with respect to the first electrode RME1_4 and the fourth electrode RME4_4 based on an imaginary line crossing a center of the emission area EMA in the second direction DR2. However, the electrode contact part RM_C may not be formed in the fourth electrode RME4_4, the sixth electrode RME6_4, and the eighth electrode RME8_4. For example, the fourth electrode RME4_4, the sixth electrode RME6_4, and the eighth electrode RME8_4 may have the above-described symmetrical structures, excluding the electrode contact part RM_C.

The second electrode RME2_4, the third electrode RME3_4, the fifth electrode RME5_4, and the seventh electrode RME7_4 may have a shape extending in a direction. The first electrode RME1_4, the fourth electrode RME4_4, the sixth electrode RME6_4, and the eighth electrode RME8_4 may be disposed on the first sub-banks BNL_A, and the second electrode RME2_4, the third electrode RME3_4, the fifth electrode RME5_4, and the seventh electrode RME7_4 may be disposed on the second sub-bank BNL_B. As described above, each of the electrodes may include a first portion RM_L disposed directly on a third interlayer insulating layer IL3 and a second portion RM_U disposed on the first bank BNL1_4. Hereinafter, descriptions of the structure of each electrode will be omitted, and a relative arrangement will be described.

The first electrode RME1_4 may be disposed at an upper left side based on the center of the emission area EMA. The first electrode RME1_4 may be disposed on the first sub-bank BNL_A disposed at the upper left side among the first sub-banks BNL_A. The second electrode RME2_4 may be disposed at an upper side of the emission area EMA. The second electrode RME2_4 may be disposed on one side of the second sub-bank BNL_B in the first direction DR1 and may be disposed to overlap a portion of the second sub-bank BNL_B having a wide width.

The third electrode RME3_4 may be disposed between the first electrode RME1_4 and the second electrode RME2_4 and may be disposed on another side of the second sub-bank BNL_B in the first direction DR1. For example, the third electrode RME3_4 may be disposed to overlap the portion of the second sub-bank BNL_B having a wide width. The third electrode RME3_4 may be spaced apart from each of the first electrode extension part RM_E1 of the first electrode RME1_4 and the second electrode RME2_4, and the first light-emitting element ED1 may be disposed between the third electrode RME3_4 and the first electrode RME1_4 spaced apart from each other. The fourth electrode RME4_4 may have a symmetrical structure with respect to the first electrode RME1_4, excluding the electrode contact part RM_C in the second direction DR2. The fourth electrode RME4_4 may be disposed on the first sub-bank BNL_A disposed at a lower left side of the emission area EMA among the first sub-banks BNL_A.

The fifth electrode RME5_4 may be spaced apart from the third electrode RME3_4 in the second direction DR2 and may be spaced apart from the fourth electrode RME4_4 in the first direction DR1. The fifth electrode RME5_4 may be disposed on a lower portion of the portion of the second sub-bank BNL_B having a wide width. The fifth electrode RME5_4 may be disposed on another side of the second sub-bank BNL_B in the first direction DR1. The third light-emitting element ED3 may be disposed in an area between the fourth electrode RME4_4 and the fifth electrode RME5_4. The sixth electrode RME6_4 has a symmetrical structure with respect to the fourth electrode RME4_4 in the first direction DR1 and may be disposed on the first sub-bank BNL_A disposed at a lower right side based on the center of the emission area EMA.

The seventh electrode RME7_4 may be disposed between the fifth electrode RME5_4 and the sixth electrode RME6_4 and may be disposed on a side of the second sub-bank BNL_B in the first direction DR1, in which the fifth electrode RME5_4 is disposed. For example, the seventh electrode RME7_4 may be disposed to overlap the portion of the second sub-bank BNL_B having a wide width. The seventh electrode RME7_4 may be spaced apart from each of the first electrode extension part RM_E1 of the sixth electrode RME6_4 and the fifth electrode RME5_4, and the fourth light-emitting element ED4 may be disposed between the seventh electrode RME7_4 and the sixth electrode RME6_4 spaced apart from each other. The eighth electrode RME8_4 may have a symmetrical structure with respect to the sixth electrode RME6_4 in the second direction DR2. The eighth electrode RME8_4 may be disposed on the first sub-bank BNL_A disposed at an upper right side of the emission area EMA among the first sub-banks BNL_A. The eighth electrode RME8_4 may be disposed to be spaced apart from the second electrode RME2_4, and the second light-emitting element ED2 may be disposed thereon.

The electrodes disposed on the same second sub-bank BNL_B may be disposed on the second sub-bank BNL_B to be spaced apart from each other in the first direction DR1, and the light-emitting element ED may not be disposed in an area therebetween. In contrast, the light-emitting elements ED may be disposed in an area between the electrodes disposed on the first sub-bank BNL_A and the second sub-bank BNL_B. Since the electrodes disposed on the first sub-banks BNL_A include the first electrode extension part RM_E1, a distance between the electrodes disposed on the first sub-banks BNL_A and the electrode disposed on the second sub-bank BNL_B may vary according to positions thereof. Therefore, most of the light-emitting elements ED may be disposed in an area between the first sub-bank BNL_A and the second sub-bank BNL_B.

According to an embodiment, based on the center of the emission area EMA, the first electrode RME1_4, the third electrode RME3_4, the second electrode RME2_4, and the eighth electrode RME8_4 disposed at the upper side may be spaced apart from the fourth electrode RME4_4, the fifth electrode RME5_4, the seventh electrode RME7_4, and the sixth electrode RME6_4 disposed at the lower side in the second direction DR2, respectively. An area therebetween in the second direction DR2 may be an area in which electrode lines are separated during a manufacturing process of the display device 10_4. After the light-emitting elements ED are disposed on the electrode lines and a second insulating layer PAS2 is formed, the electrodes lines may be separated to form electrodes spaced apart from each other in the second direction DR2. Therefore, as shown in FIG. 20, a first insulating layer PAS1 and the second insulating layer PAS2 may be removed in an area in which the first electrode RME1_4 and the fourth electrode RME4_4 are separated, and a third insulating layer PAS3 may be disposed directly on the third interlayer insulating layer IL3. This will be described below with reference to other drawings.

The first contact electrode CNE1_4 and the second contact electrode CNE2_4, which are the first type contact electrodes, may be disposed on the first electrode RME1_4 and the second electrode RME2_4, respectively. The first contact electrode CNE1_4 may be disposed on the first electrode extension part RM_E1 of the first electrode RME1_4 and electrically contact a first end portion of the first light-emitting element ED1 and the first electrode RME1_4. The second contact electrode CNE2_4 may be disposed on the second electrode RME2_4 and electrically contact a second end portion of the second light-emitting element ED2 and the second electrode RME2_4.

The second type contact electrodes may further include the fourth contact electrode CNE4_4 and the fifth contact electrode CNE5_4 in addition to the third contact electrode CNE3_4. The second type contact electrode may include contact electrode extension parts, a contact electrode connection part, and contact electrode contact parts and may be disposed on the second type electrodes.

For example, in the third contact electrode CNE3_4, the contact electrode extension parts may be disposed on the third electrode RME3_4 and the fourth electrode RME4_4 and may be electrically connected through the contact electrode connection part. The contact electrode connection part of the third contact electrode CNE3_4 may be disposed in an area between the first electrode RME1_4 and the fourth electrode RME4_4 in the second direction DR2. The third contact electrode CNE3_4 may electrically contact a second end portion of the first light-emitting element ED1 and a first end portion of the third light-emitting element ED3 and may electrically contact the third electrode RME3_4 and the fourth electrode RME4_4.

In the fourth contact electrode CNE4_4, the contact electrode extension parts may be disposed on the fifth electrode RME5_4 and the sixth electrode RME6_4 and may be electrically connected through the contact electrode connection part. The contact electrode connection part of the fourth contact electrode CNE4_4 may be disposed in an area between the contact electrode extension parts and the second bank BNL2. The fourth contact electrode CNE4_4 may electrically contact a second end portion of the third light-emitting element ED3 and a first end portion of the fourth light-emitting element ED4 and may electrically contact the fifth electrode RME5_4 and the sixth electrode RME6_4. In the fifth contact electrode CNE5_4, the contact electrode extension parts may be disposed on the seventh electrode RME7_4 and the eighth electrode RME8_4 and may be electrically connected through the contact electrode connection part. The contact electrode connection part of the fifth contact electrode CNE5_4 may be disposed in an area between the eighth electrode RME8_4 and the sixth electrode RME6_4 in the second direction DR2. The fifth contact electrode CNE5_4 may electrically contact a second end portion of the fourth light-emitting element ED4 and a first end portion of the second light-emitting element ED2 and may electrically contact the seventh electrode RME7_4 and the eighth electrode RME8_4.

Unlike the third contact electrode CNE3_4 and the fifth contact electrode CNE5_4, the contact electrode connection part of the fourth contact electrode CNE4_4 may be disposed between the seventh electrode RME7_4 and the second bank BNL2. In an embodiment, the contact electrode connection part of the fourth contact electrode CNE4_4 may be disposed to be spaced apart from one side of the seventh electrode RME7_4 in the second direction DR2, and the contact electrode connection part of the fifth contact electrode CNE5_4 may be disposed to be spaced apart from another side of the seventh electrode RME7_4 in the second direction DR2.

In an embodiment, in a cross section of the display device 10_4, the first contact electrode CNE1_4, the second contact electrode CNE2_4, and the fourth contact electrode CNE4_4 may be disposed on a different layer from the third contact electrode CNE3_4 and the fifth contact electrode CNE5_4. For example, the third contact electrode CNE3_4 and the fifth contact electrode CNE5_4 may be disposed on the second insulating layer PAS2, and the first contact electrode CNE1_4, the second contact electrode CNE2_4, and the fourth contact electrode CNE4_4 may be disposed on the third insulating layer PAS3. However, the disclosure is not limited thereto, and the arrangement order of the contact electrodes CNE1_4, CNE2_4, CNE3_4, CNE4_4, and CNE5_4 may vary based on the third insulating layer PAS3.

In the embodiment, the contact electrodes CNE1_4, CNE2_4, CNE3_4, CNE4_4, and CNE5_4 may have a relatively great width and may be disposed on inclined side surfaces of the first bank BNL1_4. Since each subpixel PXn includes more electrodes, a width of the first portion RM_L of the electrodes may be decreased, and the contact electrodes CNE1_4, CNE2_4, CNE3_4, CNE4_4, and CNE5_4 may be partially disposed on the inclined side surfaces of the first bank BNL1_4. However, the contact portions CTD, CTS, and CTF may be disposed to be spaced apart at least from the light-emitting element area EDA in the second direction DR2.

For example, the first contact portion CTD may be disposed on the electrode connection part RM_R of the first electrode RME1_4. The first contact portion CTD may be disposed to be spaced apart from the light-emitting element area EDA in an area thereof not overlapping with the first bank BNL1_4. A contact electrode extension part of the first contact electrode CNE1_4 may be disposed on the first electrode extension part RM_E1 of the first electrode RME1_4. The contact electrode connection part may bypass the light-emitting element area EDA and may be electrically connected to a contact electrode contact part of the first contact electrode CNE1_4 disposed on the electrode connection part RM_R. The first contact electrode CNE1_4 may electrically contact the first electrode RME1_4 through the contact electrode contact part thereof disposed on the electrode connection part RM_R.

Similarly, the third contact portions CTF may be disposed on the electrode connection parts RM_R of the fourth electrode RME4_4, the sixth electrode RME6_4, and the eighth electrode RME8_4, and the contact electrode connection parts of the third contact electrode CNE3_4, the fourth contact electrode CNE4_4, and the fifth contact electrode CNE5_4 may bypass the light-emitting element area EDA and may be electrically connected to the contact electrode contact parts thereof disposed on the electrode connection parts RM_R. The third contact electrode CNE3_4, the fourth contact electrode CNE4_4, and the fifth contact electrode CNE5_4 may electrically contact the fourth electrode RME4_4, the sixth electrode RME6_4, and the eighth electrode RME8_4 through the contact electrode contact parts thereof disposed on the electrode connection parts RM_R.

The second electrode RME2_4 may include an electrode protrusion RM_P that has a predetermined width and is formed at a side of a portion thereof extending in the second direction DR2. Since the electrode protrusion RM_P is formed at a portion not overlapping the first bank BNL1_4, the electrode protrusion RM_P may be disposed to be spaced apart from the light-emitting element area EDA. Similar to the first contact electrode CNE1_4, in the second contact electrode CNE2_4, a contact electrode extension part may be disposed on the second electrode RME2_4, and a contact electrode contact part may be spaced apart from the light-emitting element area EDA and disposed on the electrode protrusion RM_P. The second contact electrode CNE2_4 may electrically contact the second electrode RME2_4 through the contact electrode contact part thereof disposed on the electrode protrusion RM_P.

Similarly, the third electrode RME3_4, the fifth electrode RME5_4, and the seventh electrode RME7_4 may also include electrode protrusions RM_P, and the third contact portions CTF may be disposed on the electrode protrusions RM_P. The contact electrode contact parts of the third contact electrode CNE3_4, the fourth contact electrode CNE4_4, and the fifth contact electrode CNE5_4 may be spaced apart from the light-emitting element area EDA and may be disposed on the electrode protrusions RM_P. The third contact electrode CNE3_4, the fourth contact electrode CNE4_4, and the fifth contact electrode CNE5_4 may electrically contact the third electrode RME3_4, the fifth electrode RME5_4, and the seventh electrode RME7_4 through the contact electrode contact parts thereof disposed on the electrode protrusions RM_P, respectively.

The electrode protrusions RM_P and the electrode connection parts RM_R of the electrodes may be disposed at an upper side or a lower side of the light-emitting element area EDA in which the light-emitting elements ED are disposed, and thus may be disposed at an outer periphery of the emission area EMA. In contrast, the electrode protrusion RM_P of the seventh electrode RME7_4 may be disposed between the second light-emitting element ED2 and the fourth light-emitting element ED4 and disposed between the light-emitting element areas EDA. Nevertheless, since the third contact portion CTF disposed on the seventh electrode RME7_4 does not overlap an optical path of light emitted from the light-emitting element ED, it is possible to prevent the light emitted from the light-emitting element ED from being lost without being emitted.

The first end portion of the first light-emitting element ED1 and the second end portion of the second light-emitting element ED2 may be electrically connected to the first type electrodes through the first type contact electrodes, and an electrical signal applied from the third conductive layer may be transmitted thereto. The electrical signal may flow through the second type contact electrodes, the third light-emitting element ED3, and the fourth light-emitting element ED4, and the first to fourth light-emitting elements ED1, ED2, ED3, and ED4 may be electrically connected in series. Since the embodiment includes the electrodes spaced apart and separated from each other in the first direction DR1 and the second direction DR2, and the contact electrodes disposed on the electrodes, more light-emitting elements ED may be disposed and electrically connected to each other in series. Similar to the other embodiments, since the contact portions CTD, CTS, and CTF through which the contact electrode and the electrodes electrically contact each other are disposed to avoid an optical path of light emitted from the light-emitting element ED, in each subpixel PXn, an amount of light emitted per unit area may be increased, and luminous efficiency thereof may be further improved.

The display device 10_4 may be manufactured by a process of arranging the light-emitting elements ED using electrode lines extending in the second direction DR2 and separating the electrode lines to form electrodes.

FIGS. 21 to 25 are schematic views illustrating some operations of a manufacturing process of the display device of FIG. 16.

Figure 21:
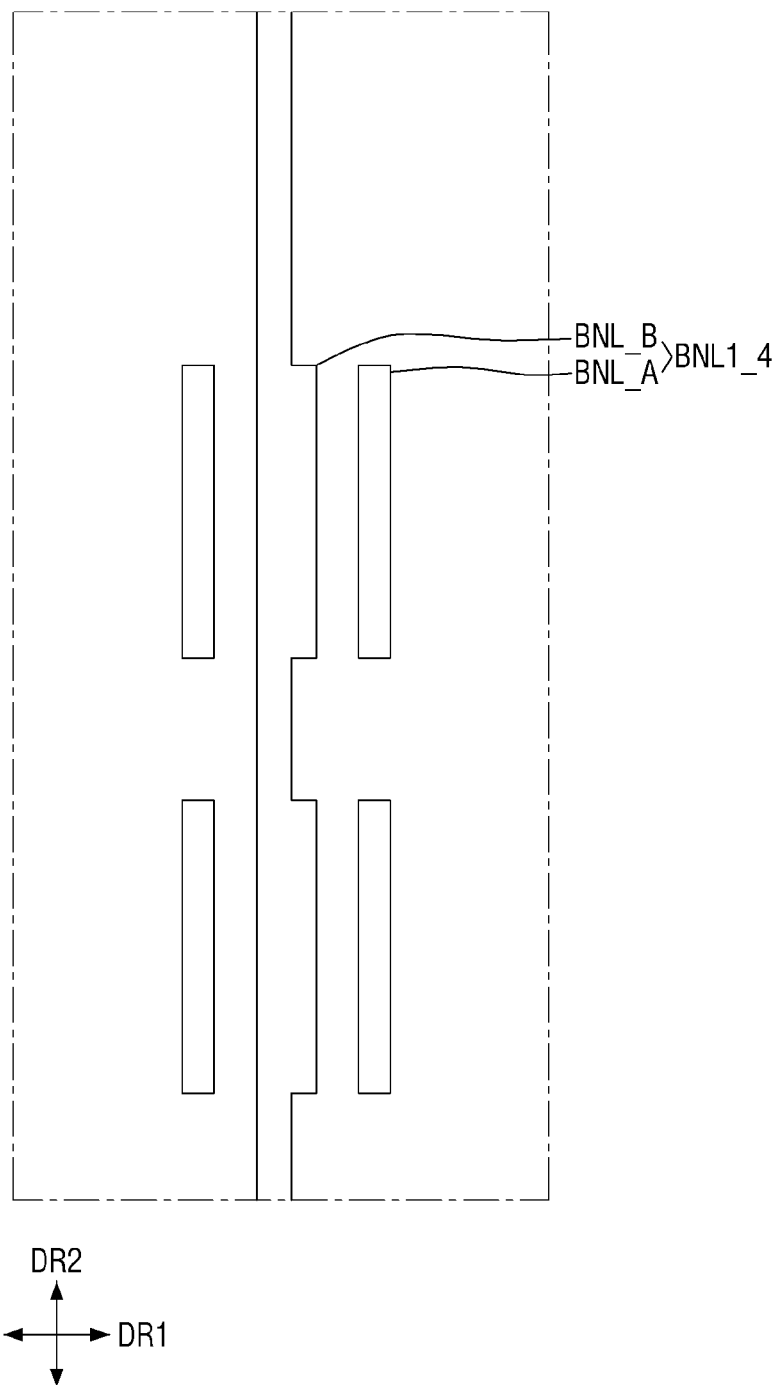
FIGS. 21 to 25 are schematic views illustrating some operations of a manufacturing process of the display device of FIG. 16.
Figure 22:
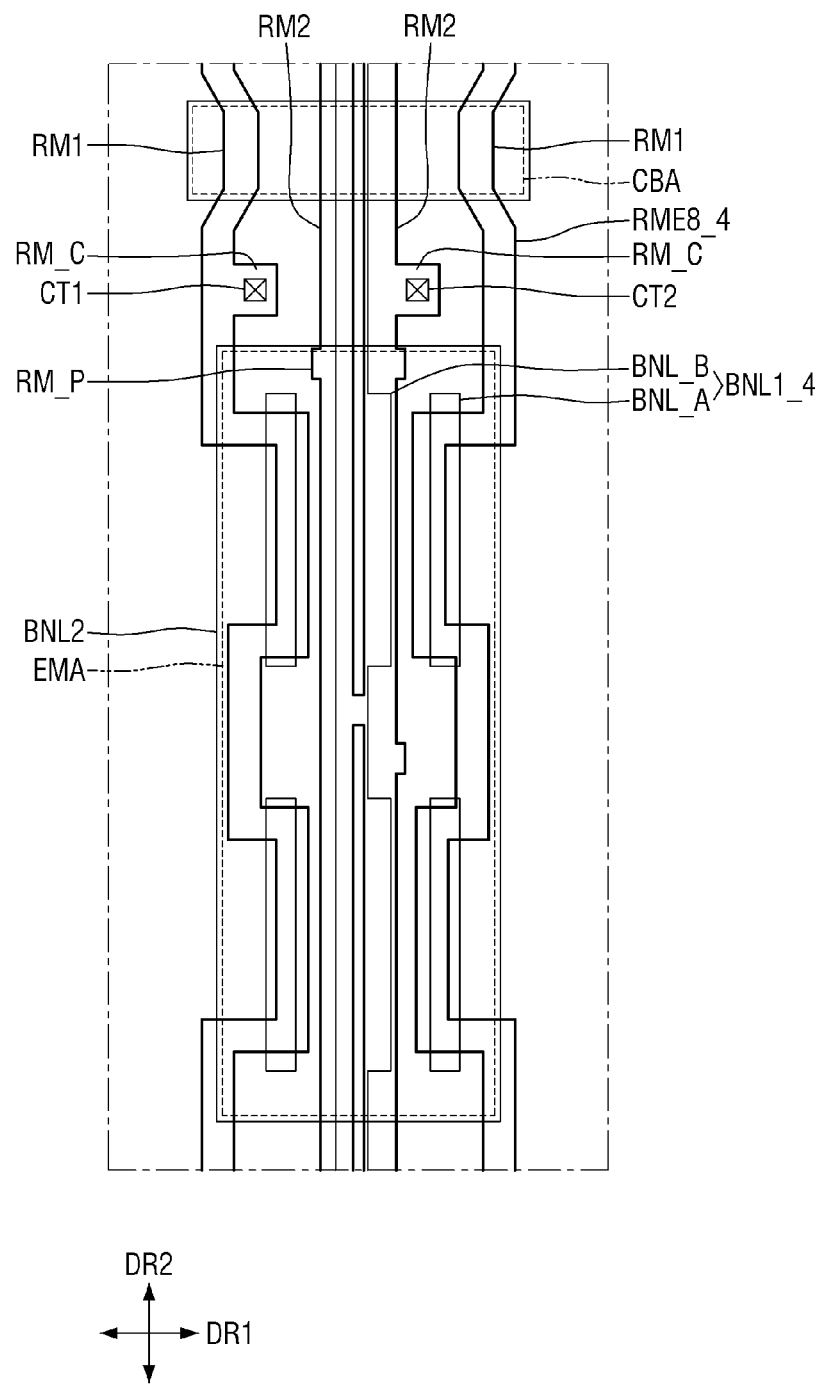

First, referring to FIGS. 21 and 22, the first banks BNL1_4, electrode lines RM1 and RM2, and the second bank BNL2 may be formed. The electrode lines RM1 and RM2 may extend beyond a boundary of the subpixel PXn in the second direction DR2. According to an embodiment, first electrode lines RM1 may be disposed in each subpixel PXn, and second electrode lines RM2 may be disposed therebetween. For example, two first electrode lines RM1 spaced apart from each other in the first direction DR1 may be disposed in each sub-pixel PXn, and two second electrode lines RM2 may be disposed therebetween. Portions of the first electrode lines RM1 may be disposed on the first sub-banks BNL_A, and the second electrode lines RM2 may be disposed at both sides of the second sub-bank BNL_B in the first direction DR1.

The second electrode lines RM2 may be electrically connected directly to each other in the emission area EMA. In case that the second electrode lines RM2 are separated from each other, a voltage difference may partially occur even though the same alignment signal is applied thereto. Because of the voltage difference, some of the light-emitting elements ED may be disposed between the second electrode lines RM2. To prevent this, the second electrode lines RM2 may be electrically connected to each other in the emission area EMA, and an electric field may be generated between the first electrode line RM1 and the second electrode line RM2.

The first electrode line RM1 may have a shape including an electrode extension part, an electrode bent part, and an electrode connection part, and the second electrode line RM2 may have a shape extending in the second direction DR2. A distance between the first electrode line RM1 and the second electrode line RM2 adjacent to each other, which is measured at portions thereof disposed on the first sub-bank BNL_A and the second-sub bank BNL_B, may be smaller than a distance between the first electrode line RM1 and the second electrode line RM2 measured at portions thereof at which the sub-banks BNL_B are spaced apart from each other in the second direction DR2. In case that an electric field is generated, a strong electric field may be generated at a portion at which the distance between the electrode lines RM1 and RM2 is small, and most of the light-emitting elements ED may be disposed on the corresponding portion.

Figure 23:
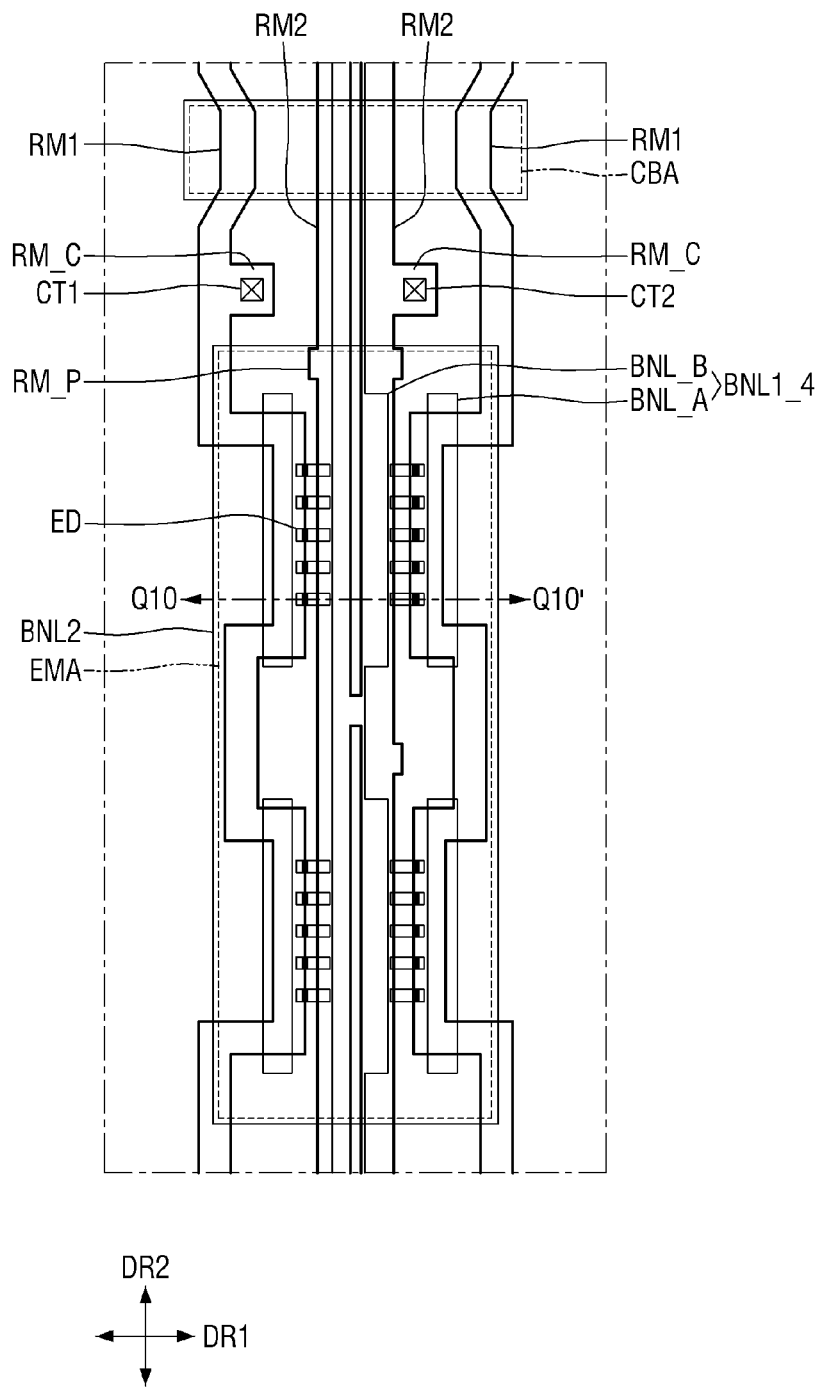
Figure 24:
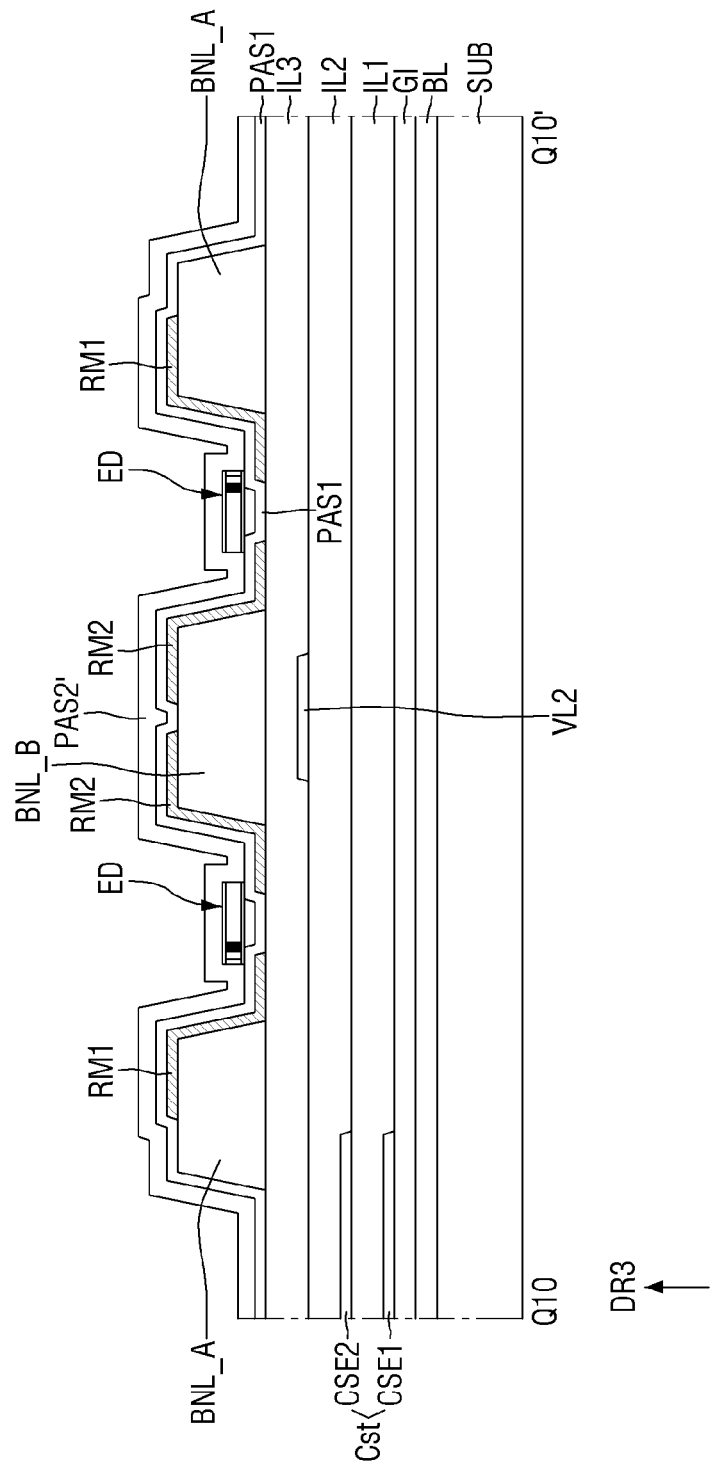

Referring to FIGS. 23 and 24, an alignment signal may be applied to the electrode lines RM1 and RM2 to arrange the light-emitting elements ED, and a second insulating material layer PAS2' may be formed thereon to affix the light-emitting elements ED. In an embodiment, the light-emitting element ED may be prepared in a state of being dispersed in an ink and may be sprayed on the emission area EMA by an inkjet printing process. The second bank BNL2 may prevent the ink from overflowing to the emission area EMA of another adjacent subpixel PXn. In cast that the ink is sprayed on the emission area EMA, an alignment signal may be applied to the first electrode line RM1 and the second electrode line RM2 to generate an electric field thereon. While the light-emitting elements ED dispersed in the ink receive a dielectrophoretic force by the generated electric field, and the position and orientation direction thereof are changed, both end portions thereof may be disposed on the different electrode lines RM1 and RM2.

Since the first electrode line RM1 and the second electrode line RM2 are disposed closer to each other at portions thereof disposed on the first sub-bank BNL_A and the second sub-bank BNL_B, a stronger electric field may be generated, and thus, most of the light-emitting elements ED may be disposed between the first sub-bank BNL_A and the second sub-bank BNL_B. Since a distance between the first electrode line RM1 and the second electrode line RM2 may be greater at portions thereof at which the first sub-banks BNL_A are spaced apart from each other in the second direction DR2, an electric field with relatively weak intensity may be generated, and the light-emitting elements ED may not be disposed.

An electric field may be generated on each of the first and second electrode lines RM1 and RM2 according to alignment signals applied thereto. The electric field may have a direction from an electrode to which an alignment signal is applied to an electrode to which another alignment signal is applied, and the orientation direction of the light-emitting elements ED may be determined according to the direction in which the electric field is directed. During the manufacturing process of the display device 10_4, since different alignment signals are applied to the first electrode line RM1 and the second electrode line RM2, the electric field may be directed toward the second sub-bank BNL_B disposed at a central portion of the emission area EMA, and the light-emitting elements ED may also be disposed such that the first end portions thereof are placed on electrodes on the second sub-bank BNL_B. Accordingly, the first light-emitting element ED1 and the second light-emitting element ED2 may be disposed such that the first end portions thereof are placed on the third electrode RME3_4 and the second electrode RME2_4, and the orientation directions thereof may be opposite to each other. The third light-emitting element ED3 and the fourth light-emitting element ED4 may also disposed such that the first end portions thereof are placed on the fifth electrode RME5_4 and the seventh electrode RME7_4, and the orientation directions thereof may be opposite to each other.

In case that the light-emitting elements ED are disposed, a second insulating material layer PAS2' for affixing the light-emitting elements ED may be formed. Referring to FIG. 24 taken along line Q10-Q10' of FIG. 23, the second insulating material layer PAS2' may be disposed on the first insulating layer PAS1 and the light-emitting elements ED in the emission area EMA. The light-emitting elements ED may be overlapped by the second insulating material layer PAS2', and a position at which the light-emitting elements ED are aligned on the electrode lines RM1 and RM2 may be affixed. A position at which the light-emitting elements ED are initially aligned may not be changed in a subsequent process of forming the contact electrodes.

Figure 25:
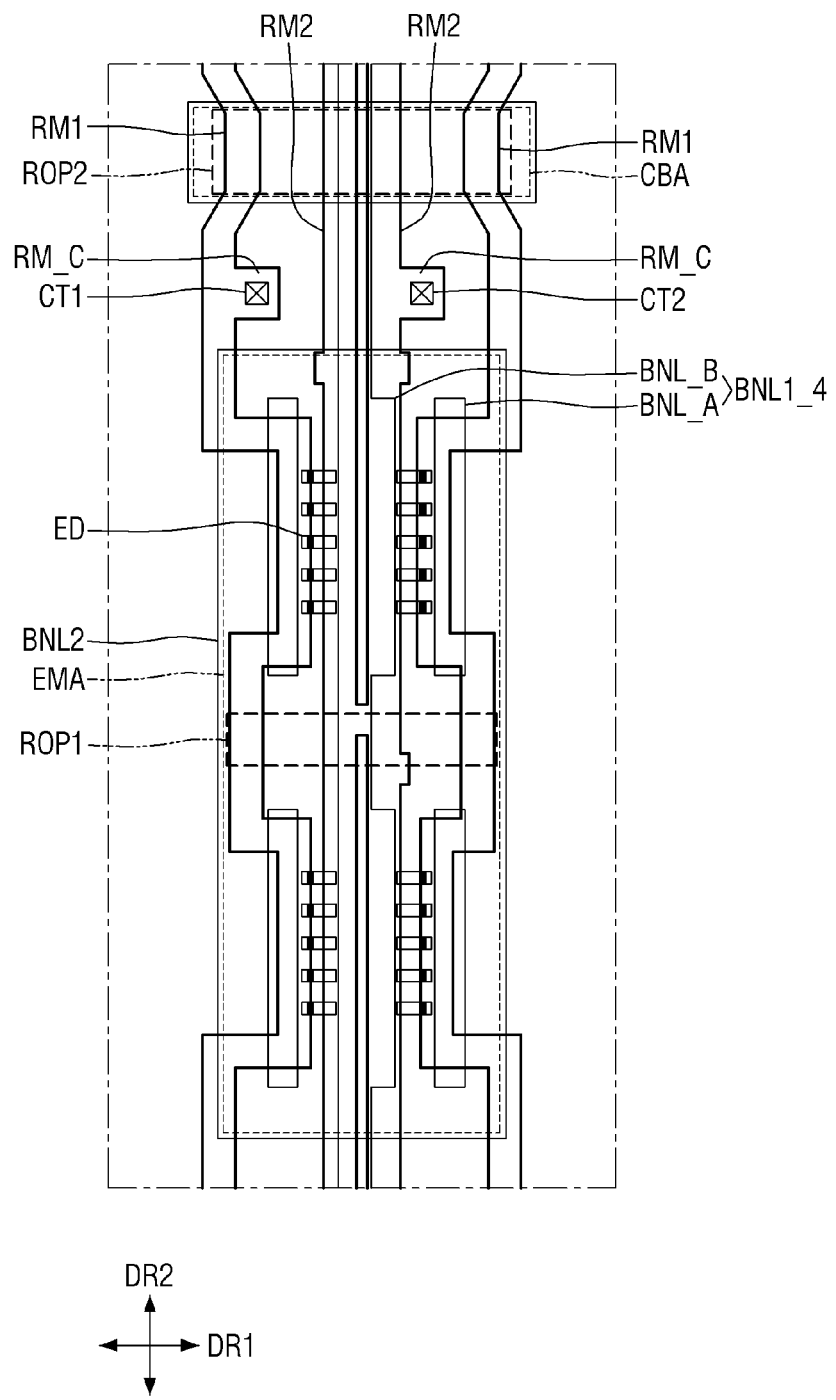

Referring to FIG. 25, in case that the light-emitting elements ED are disposed, the electrode lines RM1 and RM2 may be separated at electrode separation parts ROP of the emission area EMA and the cutout area CBA. A first electrode separation part ROP1 may be positioned in a portion of the emission area EMA in which the first sub-banks BNL_A are spaced apart from each other in the second direction DR2. Only a weak electric field may be generated in the portion in which the first sub-banks BNL_A are spaced apart from each other in the second direction DR2 so that most of the light-emitting elements ED may not be disposed in that portion.

A second electrode separation part ROP2 may be positioned in the cutout area CBA. In case that the electrode lines RM1 and RM1 are separated by the second electrode separation part ROP2, electrodes disposed in each subpixel PXn may be separated from each other and thus may be separately driven. The electrodes separated and formed by the electrode separation parts ROP1 and ROP2 may include the first type electrodes and the second type electrodes, and the light-emitting elements ED may be classified into the first to fourth light-emitting elements ED1, ED2, ED3, and ED4.

Subsequently, although not shown in the drawing, the contact portions CTD, CTS, and CTF and the contact electrodes CNE1_4, CNE2_4, CNE3_4, and CNE4_4, and CNE5_4 may be formed to manufacture the display device 10_4.

The embodiment may include the electrodes RME1_4, RME4_4, RME6_4, and RME8_4 having a partially bent shape, and the electrodes RME2_4, RME3_4, RME5_4, and RME7_4 disposed therebetween and having an extended shape, and thus, more light-emitting elements ED may be disposed for each subpixel PXn. Since more electrodes are disposed for each subpixel PXn, a width of the emission area EMA measured in the first direction DR1 may be increased. However, since the electrodes are disposed in the emission area EMA to be spaced apart from each other in the second direction DR2, a current path may be formed through the second type contact electrode. Some of the light-emitting elements ED arranged in the second direction DR2 may be electrically connected in series through the second type contact electrode so that the luminance of each subpixel PXn may be further improved. Furthermore, since the number of the light-emitting elements ED electrically connected in series is increased, even in case that some light-emitting elements ED are short-circuited, other light-emitting elements ED electrically connected in series may emit light, thereby preventing the light emission defects of the subpixel PXn.

Figure 26:
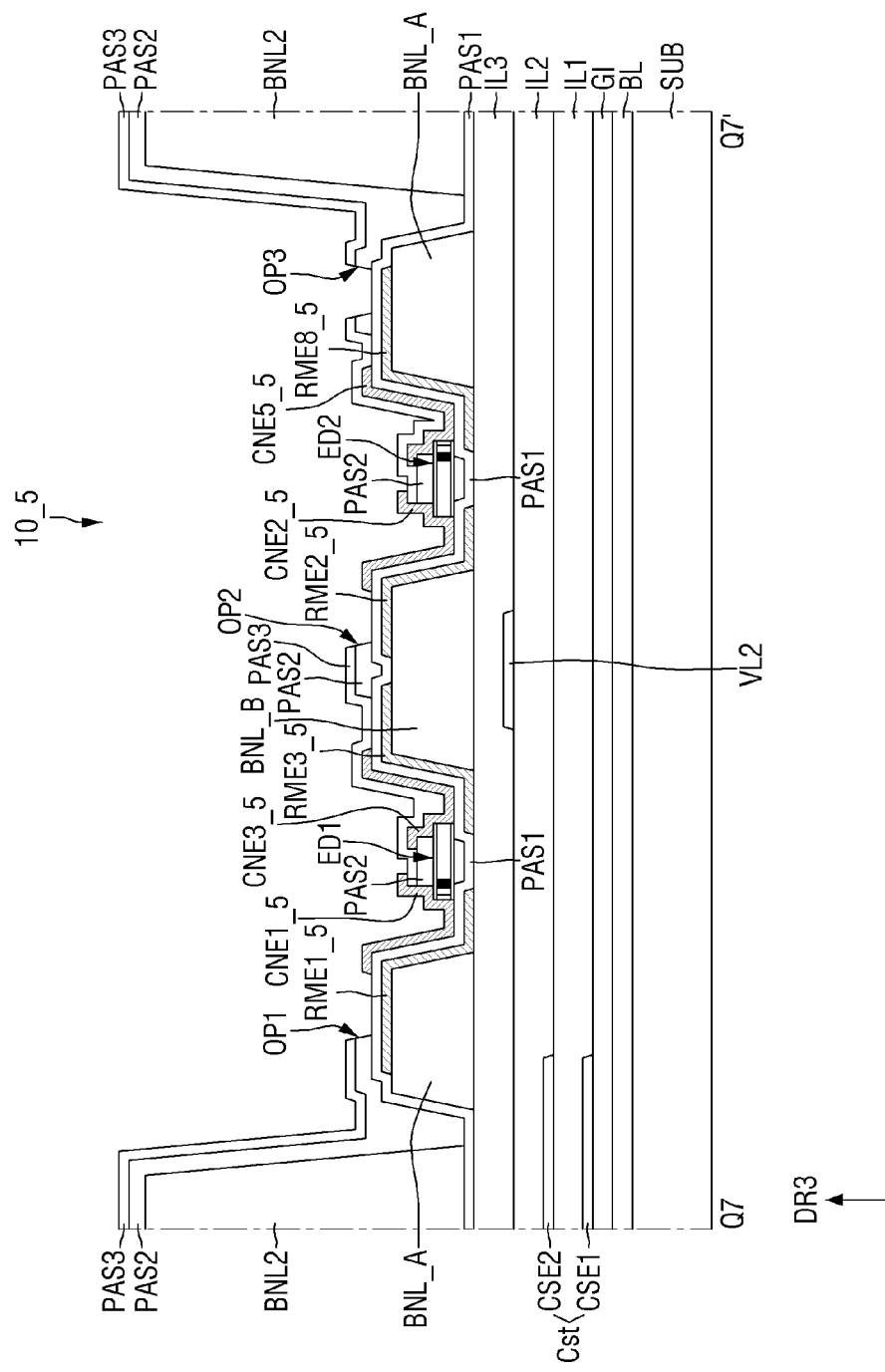
FIG. 26 is a schematic cross-sectional view illustrating a portion of a display device according to yet another embodiment.

FIG. 26 is a schematic cross-sectional view illustrating a portion of a display device according to yet another embodiment.

Referring to FIG. 26, a display device 10_5 according to an embodiment may include openings OP1, OP2, and OP3 penetrating through a second insulating layer PAS2 and a third insulating layer PAS3. The openings OP1, OP2, and OP3 may be formed in a process of forming the third insulating layer PAS3 before a first contact electrode CNE1_5 and a second contact electrode CNE2_5 are disposed. The embodiment is different from the embodiment of FIG. 18 at least in that the display device 10_5 further includes some openings OP1, OP2, and OP3. The arrangements of electrodes and contact electrodes of the display device 10_5 may be the same as those in the embodiment of FIG. 18. In the drawing, only first, second, third, and eighth electrodes RME1_5, RME2_5, RME3_5, and RME8_5, and only first, second, third, and fifth contact electrodes CNE1_5, CNE2_5, CNE3_5, and CNE5_5 are illustrated. Hereinafter, redundant descriptions will be omitted, and differences will be mainly described.

In a manufacturing process of the display device 10_5, after light-emitting elements ED are disposed, processes of forming the second insulating layer PAS2, some of the contact electrodes, the third insulating layer PAS3, and the remaining contact electrodes may be sequentially performed. Insulating material layers including materials forming the second insulating layer PAS2 and the third insulating layer PAS3 may be entirely formed on a first insulating layer PAS1 and then may be partially patterned to form the second insulating layer PAS2 and the third insulating layer PAS3. In such a patterning process, the insulating material layer overlapping the light-emitting elements ED may be partially removed to expose end portions of the light-emitting elements ED, and the contact electrodes formed thereafter may electrically contact the light-emitting elements ED.

For example, after the light-emitting elements ED are disposed on electrodes RME, a first insulating material layer including the material constituting the second insulating layer PAS2 may be disposed to overlap the first insulating layer PAS1 and the light-emitting elements ED. The first insulating material layer may be patterned to expose end portions of the light-emitting elements ED, for example, end portions of first light-emitting elements ED1 disposed on the third electrode RME3_5 and end portions of second light-emitting elements ED2 disposed on the eighth electrode RME8_5. Subsequently, the third contact electrode CNE3_5 and the fifth contact electrode CNE5_5 may be formed so that the exposed end portions of the first light-emitting element ED1 and the second light-emitting element ED2 may electrically contact the third contact electrode CNE3_5 and the fifth contact electrode CNE5_5, respectively.

After the third contact electrode CNE3_5 and the fifth contact electrode CNE5_5 are formed, a second insulating material layer including the material constituting the third insulating layer PAS3 may overlap the third contact electrode CNE3_5, the fifth contact electrode CNE5_5, and the first insulating material layer. The second insulating material layer may be patterned to expose opposite end portions of the light-emitting elements ED, for example, end portions of the first light-emitting elements ED1 disposed on the first electrode RME1_5 and end portions of the second light-emitting elements ED2 disposed on the second electrode RME2_5. Subsequently, the first contact electrode CNE1_5 and the second contact electrode CNE2_5 may be formed so that the exposed end portions of the first light-emitting element ED1 and the second light-emitting element ED2 may electrically contact the first contact electrode CNE1_5 and the second contact electrode CNE2_5, respectively.

In a patterning process of the second insulating material layer, the first insulating material layer under the second insulating material layer may be simultaneously patterned to form the second insulating layer PAS2 and the third insulating layer PAS3. In the patterning process, the openings OP1, OP2, and OP3 penetrating through the third insulating layer PAS3 and the second insulating layer PAS2 may be formed.

A first opening OP1 and a second opening OP2 may be formed to expose an end portion of the first light-emitting element ED1 and an end portion of the second light-emitting element ED2, respectively. For example, the first opening OP1 may be formed to expose an end portion of the first light-emitting element ED1 disposed on the first electrode RME1_5. The first opening OP1 may be disposed on the first electrode RME1_5 and formed over a first sub-bank BNL_A and a portion of the first light-emitting element ED1. The second opening OP2 may be formed to expose an end portion of the second light-emitting element ED2 disposed on the second electrode RME2_5. The second opening OP2 may be disposed on the second electrode RME2_5 and formed over the second sub-bank BNL_B and a portion of the second light-emitting element ED2. Although not shown in the drawing, the first opening OP1 and the second opening OP2 may be formed in the same manner as in the embodiment of FIG. 18.

In addition to the first opening OP1 and the second opening OP2 exposing end portions of the light-emitting elements ED, the display device 10_5 according to the embodiment may include a third opening OP3 that does not expose end portions of the light-emitting elements ED and exposes a portion of an upper surface of the first insulating layer PAS1. The third opening OP3 may be formed at a side opposite to the first opening OP1 based on a second sub-bank BNL_B. However, the third opening OP3 may be formed to overlap only an electrode disposed on the first sub-bank BNL_A, for example, the eighth electrode RME8_5, and may be formed not to expose the light-emitting element ED. The third opening OP3 may be formed in a portion of the eighth electrode RME8_5 disposed on the first sub-bank BNL_A to penetrate through the third insulating layer PAS3 and the second insulating layer PAS2.

The upper surface of the first insulating layer PAS1 may be partially exposed in the first opening OP1, the second opening OP2, and the third opening OP3. The first contact electrode CNE1_5 and the second contact electrode CNE2_5 may be partially disposed on the first insulating layer PAS1 exposed in the first opening OP1 and the second opening OP2. For example, the first contact electrode CNE1_5 may be partially disposed in the first opening OP1, and the second contact electrode CNE2_5 may be partially disposed in the second opening OP2. In contrast, the third opening OP3 may have a width relatively smaller than that of the first opening OP1 and the second opening OP2. In the third opening OP3, the contact electrodes may not be disposed, and the upper surface of the first insulating layer PAS1 may be exposed. The third opening OP3 may be formed to be spaced apart from the fifth contact electrode CNE5_5 closest thereto.

As described above, light generated in the light-emitting element ED may be emitted to both end portions thereof and may not be smoothly emitted because of a difference in refractive index between the first insulating layer PAS1 and the contact electrodes. Light emitted from both end portions of the light-emitting element ED and travels in the first insulating layer PAS1 may be emitted from the exposed portion of the upper surface of the first insulating layer PAS1 in an upward direction of a first substrate SUB. Since the first opening OP1 exposes an end portion of the first light-emitting element ED1 disposed on the first electrode RME1_5 and simultaneously exposes a portion of the upper surface of the first insulating layer PAS1, light emitted from the end portion of the light-emitting element ED1 may be easily emitted through the upper surface of the first insulating layer PAS1 exposed in the first opening OP1. Similarly, the third opening OP3 may expose an end portion of the second light-emitting element ED2 disposed on the eighth electrode RME8_5 and may expose a portion of the upper surface of the first insulating layer PAS1. In addition to interfaces between the first insulating layer PAS1 and the contact electrodes, light reflection due to a difference in refractive index may also occur at an interface between the first insulating layer PAS1 and the second insulating layer PAS2 or the third insulating layer PAS3. Since the third opening OP3 is formed to expose the upper surface of the first insulating layer PAS1, light emitted from the end portion of the second light-emitting element ED2 may be emitted through the upper surface of the insulating layer PAS1 exposed in the third opening OP3.

The display device 10_5 according to the embodiment may include an opening (for example, the third opening OP3) that provides an emission path of light emitted from the light-emitting element ED in addition to openings (for example, the first opening OP1 and the second opening OP2) that expose end portions of the light-emitting elements ED. Since the display device 10_5 includes the openings OP1, OP2, and OP3, light reflection due to a difference in refractive index between the first insulating layer PAS1 and another layer may be reduced, thereby further improving the luminous efficiency of the light-emitting element ED.

FIG. 26 illustrates a cross section traversing the first electrode RME1_5, the third electrode RME3_5, the second electrode RME2_5, and the eighth electrode RME8_5 as in FIG. 18. The openings OP1, OP2, and OP3 may also be disposed on portions of a fourth electrode RME4, a fifth electrode RME5, a seventh electrode RME7, and a sixth electrode RME6. Referring to FIGS. 17 and 26, the first opening OP1 may be formed over the sixth electrode RME6 and an end portion of a fourth light-emitting element ED4 in addition to the first electrode RME1_5, and the second opening OP2 may be formed over the fifth electrode RME5_4 and an end portion of a third light-emitting element ED3 in addition to the second electrode RME2_5. The third opening OP3 may be partially formed on the fourth electrode RME4_4 in addition to the eighth electrode RME8_5. However, the disclosure is not limited thereto.

Figure 27:
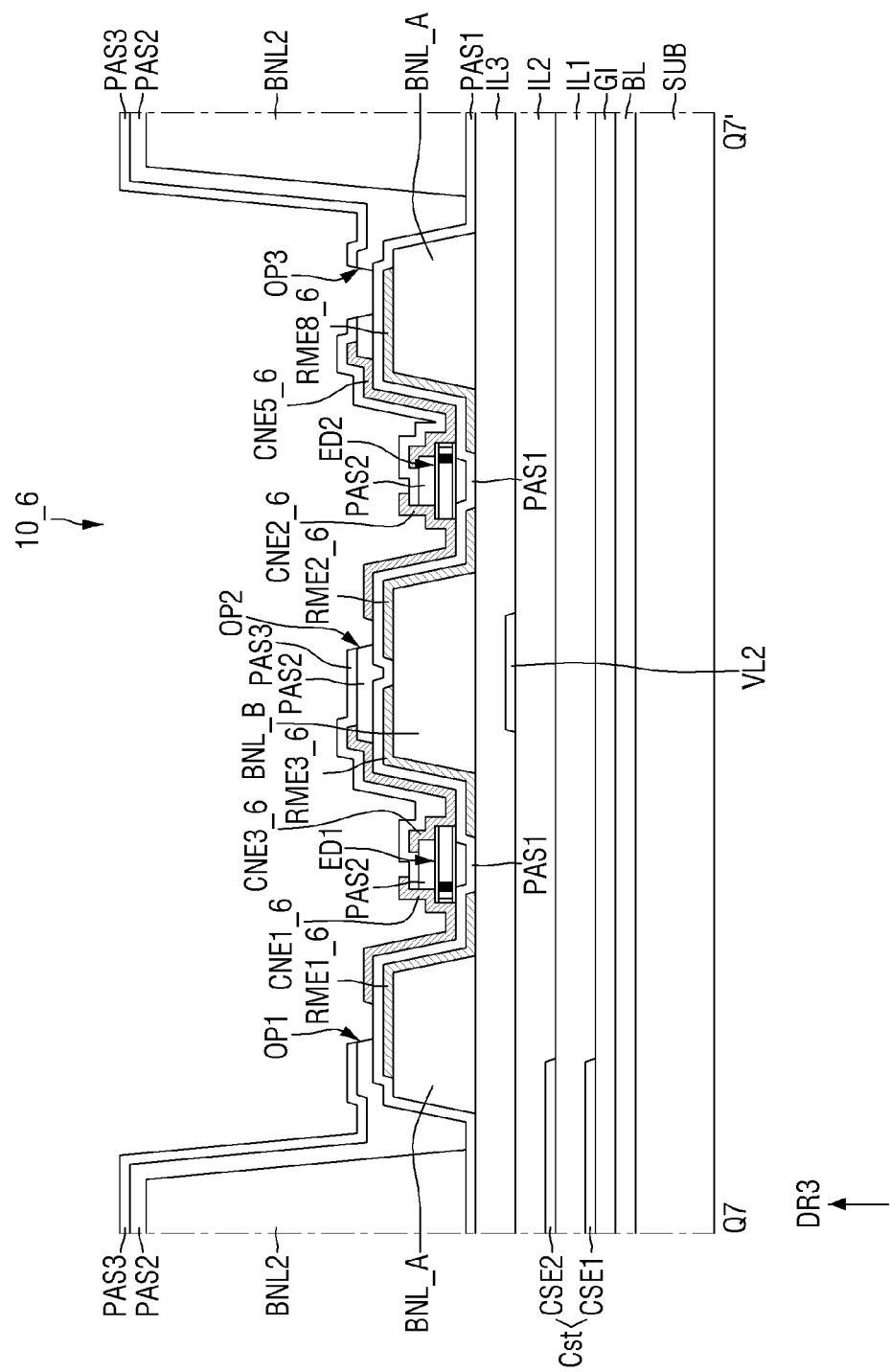
FIG. 27 is a schematic cross-sectional view illustrating a portion of a display device according to yet another embodiment.

FIG. 27 is a schematic cross-sectional view illustrating a portion of a display device according to yet another embodiment.

Referring to FIG. 27, in a display device 10_6 according to an embodiment, contact electrodes CNE may be formed to have a larger width, and both sides of some contact electrodes may be disposed to be placed on a second insulating layer PAS2. For example, in a third contact electrode CNE3_6 and a fifth contact electrode CNE5_5, which are contact electrodes disposed between the second insulating layer PAS2 and a third insulating layer PAS3, first sides thereof may be disposed on the second insulating layer PAS2 placed on light-emitting elements ED, and second sides thereof may be disposed on the second insulating layer PAS2 placed on a first sub-bank BNL_A and a second sub-bank BNL_B. The embodiment is different from the embodiment of FIG. 26 at least in that the contact electrodes have a larger width. The arrangement of electrodes and contact electrodes of the display device 10_6 may be identical to that of the embodiment of FIG. 26. In the drawing, only first, second, third, and eighth electrodes RME1_6, RME2_6, RME3_6, and RME8_6, and only first, second, third, and fifth contact electrodes CNE1_6, CNE2_6, CNE3_6, and CNE5_6 are illustrated. Hereinafter, redundant descriptions will be omitted.

In a display device according to an embodiment, since a contact electrode electrically connecting a light-emitting element and an electrode may have a minimum width, it is possible to reduce an amount of light emitted from the light-emitting element that is lost without being emitted from an insulating layer under the light-emitting element. Since a contact portion, through which a contact electrode and an electrode electrically contact each other, is disposed to avoid an optical path of the light, it is possible to minimize an interface between the contact electrode and the insulating layer, and it is possible to improve the luminous efficiency of the light emitted from the light-emitting element of each subpixel.

In concluding the detailed description, those skilled in the art will appreciate that many variations and modifications may be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a substrate;
a first electrode and a second electrode which are disposed on the substrate, extend in a first direction, and are spaced apart from each other in a second direction;
a third electrode spaced apart from the first electrode and the second electrode in the second direction between the first electrode and the second electrode;
a fourth electrode spaced apart from the first electrode in the first direction;
light-emitting elements which include:
first light-emitting elements having first and second end portions disposed on the first electrode and the third electrode, respectively; and
second light-emitting elements having first end portions disposed on the second electrode;
a first contact electrode disposed on the first electrode and electrically contacting the first light-emitting elements;
a second contact electrode disposed on the second electrode and electrically contacting the second light-emitting elements; and
a third contact electrode disposed on the third electrode and electrically contacting the first light-emitting elements, wherein
the first contact electrode electrically contacts the first electrode through a first contact portion disposed on the first electrode,
the second contact electrode electrically contacts the second electrode through a second contact portion disposed on the second electrode,
the third contact electrode electrically contacts the third electrode through a third contact portion disposed on the third electrode,
the second contact portion is disposed on an end portion of the second contact electrode in the first direction, and
the third contact portion is disposed on an end portion of the third contact electrode in the first direction.

2. The display device of claim 1, wherein
the second electrode includes an electrode protrusion protruding from a side of the second electrode in the second direction,
the third electrode includes an electrode protrusion protruding from a side of the third electrode in the second direction, and
the second contact portion and the third contact portion are disposed on the electrode protrusion of the second electrode and the electrode protrusion of the third electrode, respectively.

3. The display device of claim 1, wherein
the first electrode includes:
a first electrode extension part extending in the first direction; and
an electrode connection part electrically connected to a side of the first electrode extension part in the first direction and extending in the second direction, and
the first light-emitting elements are disposed on the first electrode extension part of the first electrode and the third electrode.

4. The display device of claim 3, wherein
the first contact portion is disposed on the electrode connection part of the first electrode, and
the first contact electrode includes:
a contact electrode extension part electrically contacting the first light-emitting elements; and
a contact electrode contact part electrically connected to the contact electrode extension part and disposed on the first contact portion.

5. The display device of claim 1, further comprising a conductive layer including a voltage line and a conductive pattern disposed on the substrate, wherein
the first electrode is connected directly to the conductive pattern, and
the second electrode is connected directly to the voltage line.

6. The display device of claim 1, further comprising:
a fifth electrode spaced apart from the fourth electrode in the second direction and spaced apart from the third electrode in the first direction;

a sixth electrode spaced apart from the fifth electrode in the second direction;

a seventh electrode disposed between the fifth electrode and the sixth electrode and spaced apart from the second electrode in the first direction; and an eighth electrode spaced apart from the sixth electrode in the first direction and spaced apart from the second electrode in the second direction, wherein the light-emitting elements include:

third light-emitting elements disposed on the fourth electrode and the fifth electrode; and fourth light-emitting elements disposed on the sixth electrode and the seventh electrode, and second end portions of the second light-emitting elements are disposed on the eighth electrode.

7. The display device of claim 6, wherein the third contact electrode includes a part disposed on the fourth electrode and electrically contacting the third light-emitting elements, and the third contact electrode electrically contacts the fourth electrode through a contact portion spaced apart from the third light-emitting elements in a direction between the first direction and the second direction.

8. The display device of claim 6, further comprising:

a fourth contact electrode disposed on the fifth electrode and the sixth electrode and electrically contacting the fifth electrode and the sixth electrode through a plurality of contact portions; and a fifth contact electrode disposed on the seventh electrode and the eighth electrode and electrically contacting the seventh electrode and the eighth electrode through a plurality of contact portions, wherein some of the plurality of contact portions disposed on the fifth to the eighth electrodes are spaced apart from the light-emitting elements in the first direction.

9. The display device of claim 8, wherein at least some of the plurality of contact portions disposed on the fifth to eighth electrodes are disposed to be spaced apart from the light-emitting elements in a direction between the first direction and the second direction.

10. The display device of claim 1, wherein the first contact portion is spaced apart from the light-emitting elements in a direction between the first direction and the second direction.

11. The display device of claim 8, further comprising:

a first insulating layer that partially overlaps the first to eighth electrodes;

a second insulating layer partially disposed on the light-emitting elements and the first insulating layer; and a third insulating layer that overlaps the second insulating layer, the third contact electrode, and the fourth contact electrode, wherein the plurality of contact portions penetrate through the first insulating layer.

12. The display device of claim 11, further comprising a plurality of openings that penetrate through the second insulating layer and the third insulating layer to expose a portion of an upper surface of the first insulating layer, wherein the plurality of openings include:

a first opening formed over a portion of the first electrode and the first end portions of the first light-emitting elements;

a second opening formed over a portion of the second electrode and the first end portions of the second light-emitting elements; and a third opening partially formed on the eighth electrode.

13. The display device of claim 12, wherein the first contact electrode is partially disposed in the first opening, the second contact electrode is partially disposed in the second opening, and the third opening is formed to be spaced from the fifth contact electrode.

\* \* \* \* \*